(12) United States Patent
Kim et al.

(10) Patent No.: US 12,147,632 B2
(45) Date of Patent: *Nov. 19, 2024

(54) TOUCH SENSOR AND DISPLAY DEVICE

(71) Applicant: Samsung Display Co., Ltd., Yongin-Si (KR)

(72) Inventors: Do Ik Kim, Suwon-si (KR); Jang hui Kim, Suwon-si (KR); Sang Chul Lee, Yongin-si (KR); Ga Young Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/374,569

(22) Filed: Sep. 28, 2023

(65) Prior Publication Data

US 2024/0036684 A1    Feb. 1, 2024

Related U.S. Application Data

(63) Continuation of application No. 18/072,412, filed on Nov. 30, 2022, now Pat. No. 11,829,564, which is a (Continued)

(30) Foreign Application Priority Data

Oct. 5, 2018    (KR) .......................... 10-2018-0119141

(51) Int. Cl.
  *G06F 3/044*    (2006.01)
  *G06F 3/041*    (2006.01)
(52) U.S. Cl.
  CPC ............ *G06F 3/044* (2013.01); *G06F 3/0412* (2013.01); *G06F 3/0416* (2013.01)

(58) Field of Classification Search
  None
  See application file for complete search history.

(56) References Cited

U.S. PATENT DOCUMENTS

2010/0149126 A1    6/2010  Futter
2014/0213323 A1    7/2014  Holenarsipur et al.
(Continued)

FOREIGN PATENT DOCUMENTS

KR    10-2011-0096042 A    8/2011
KR       10-1362843 B1     2/2014
(Continued)

OTHER PUBLICATIONS

European Search Report corresponding to European Patent Application No. 19200615.3 dated Feb. 28, 2020 11 pages.

*Primary Examiner* — Christopher J Kohlman
(74) *Attorney, Agent, or Firm* — Innovation Counsel LLP

(57) ABSTRACT

A touch sensor includes a base layer; a first electrode member that includes a plurality of first electrodes arranged on the base layer and electrically connected to each other along a first direction, each of the first electrodes including a first opening; a second electrode member that includes a plurality of second electrodes arranged on the base layer and electrically connected to each other along a second direction that intersects the first direction; a conductive member that includes a plurality of conductive patterns electrically connected to each other along the first direction; and a proximity detector that is electrically connected to the conductive member and configured to detect proximity of an object by receiving a proximity sensing signal from the conductive member. Each of the conductive patterns is located in the first opening of each of the first electrodes and spaced apart from each of the first electrodes, respectively.

15 Claims, 71 Drawing Sheets

Related U.S. Application Data continuation of application No. 17/555,983, filed on Dec. 20, 2021, now Pat. No. 11,537,244, which is a continuation of application No. 17/222,856, filed on Apr. 5, 2021, now Pat. No. 11,231,819, which is a continuation of application No. 16/525,561, filed on Jul. 29, 2019, now Pat. No. 10,969,911.

(56) References Cited

U.S. PATENT DOCUMENTS

| | | | |
|---|---|---|---|
| 2014/0253499 A1* | 9/2014 | Lee | G06F 3/0448 345/174 |
| 2015/0160754 A1* | 6/2015 | Wenzel | G06F 3/041662 345/174 |
| 2018/0224984 A1* | 8/2018 | Kim | G06F 3/0412 |
| 2019/0041929 A1 | 2/2019 | Bologna et al. | |
| 2019/0353947 A1 | 11/2019 | Miyazaki | |

FOREIGN PATENT DOCUMENTS

| | | |
|---|---|---|
| KR | 10-2014-0063315 A | 5/2014 |
| KR | 10-2018-0090936 A | 8/2018 |

* cited by examiner

130': 1311, 1313, 133

TOUCH SENSOR AND DISPLAY DEVICE

This application is a continuation application of U.S. patent application Ser. No. 18/072,412 filed on Nov. 30, 2022, which is a continuation application of U.S. patent application Ser. No. 17/555,983 filed on Dec. 20, 2021 (now U.S. Pat. No. 11,537,244), which is a continuation application of U.S. patent application Ser. No. 17/222,856 filed on Apr. 5, 2021 (now U.S. Pat. No. 11,231,819), which is a continuation application of U.S. patent application Ser. No. 16/525,561 filed on Jul. 29, 2019 (now U.S. Pat. No. 10,969,911), which claims the benefit of Korean Patent Application No. 10-2018-0119141, filed on Oct. 5, 2018, in the Korean Intellectual Property Office, the disclosures of which are incorporated herein by reference in their entirety.

BACKGROUND

1. Field

The present disclosure relates to a touch sensor and a display device.

2. Description of the Related Art

An electronic device that provides images to a user such as a smartphone, a tablet personal computer (PC), a digital camera, a notebook computer, a navigation system, and a smart television includes a display device for displaying images. The display device may include various input devices in addition to a display panel that generates and displays images.

Recently, a touch sensor that recognizes a touch input of a user has been widely applied to display devices mainly in smartphones and tablet PCs. Due to its convenience and enhanced interactivity with a user, the touch sensor is quickly replacing conventional input devices such as a keypad.

Recent research is focused on integrating various types of sensors into a touch sensor.

SUMMARY

Aspects of the present disclosure provide a touch sensor that can serve also as a proximity sensor.

However, aspects of the present disclosure are not restricted to the embodiments set forth herein. The above and other aspects of the present disclosure will become more apparent to one of ordinary skill in the art to which the present disclosure pertains by referencing the detailed description of the present disclosure given below.

An embodiment of a touch sensor includes a base layer; a first electrode member that includes a plurality of first electrodes arranged on the base layer along a first direction and electrically connected to each other along the first direction, each first electrode including a first opening; a second electrode member that includes a plurality of second electrodes arranged on the base layer along a second direction that intersects the first direction and electrically connected to each other along the second direction; a conductive member that includes a plurality of conductive patterns electrically connected to each other along the first direction; and a proximity detector that is electrically connected to the conductive member and configured to detect proximity of an object by receiving a proximity sensing signal from the conductive member, wherein each of the plurality of conductive patterns is located in the first opening of each of the plurality of first electrodes and spaced apart from each of the plurality of first electrodes, respectively.

An embodiment of a touch sensor includes a base layer; a first electrode member that includes a plurality of first electrodes arranged on the base layer along a first direction and electrically connected to each other along the first direction, each of the plurality of first electrodes including a first opening; a second electrode member that includes a plurality of second electrodes arranged on the base layer along a second direction that intersects the first direction and electrically connected to each other along the second direction, each of the plurality of second electrodes including a second opening; a first conductive member that includes a plurality of first conductive patterns electrically connected to each other along the first direction; a second conductive member that is spaced apart from the first conductive member and includes a plurality of second conductive patterns electrically connected to each other along the first direction; and a proximity detector that is electrically connected to the second conductive member and configured to detect proximity of an object by receiving a proximity sensing signal from the second conductive member, wherein the second electrode member is provided in a plural number, and a plurality of second electrode members is spaced apart from each other along the first direction, each of the plurality of first conductive patterns is located in the first opening of each of the plurality of first electrodes and spaced apart from each of the plurality of first electrodes, respectively, and each of the second conductive patterns is located in the second opening of each of the plurality of second electrodes and spaced apart from each of the plurality of second electrodes, respectively.

An embodiment of a display device includes a base substrate; a light emitting element that is located on the base substrate; a thin-film encapsulation layer that is located on the light emitting element; an electrode that is located on the thin-film encapsulation layer and includes an opening; a conductive pattern that is located in the opening and spaced apart from the electrode; and a proximity detector that is electrically connected to the conductive pattern and configured to detect proximity of an object by receiving a proximity sensing signal from the conductive pattern.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
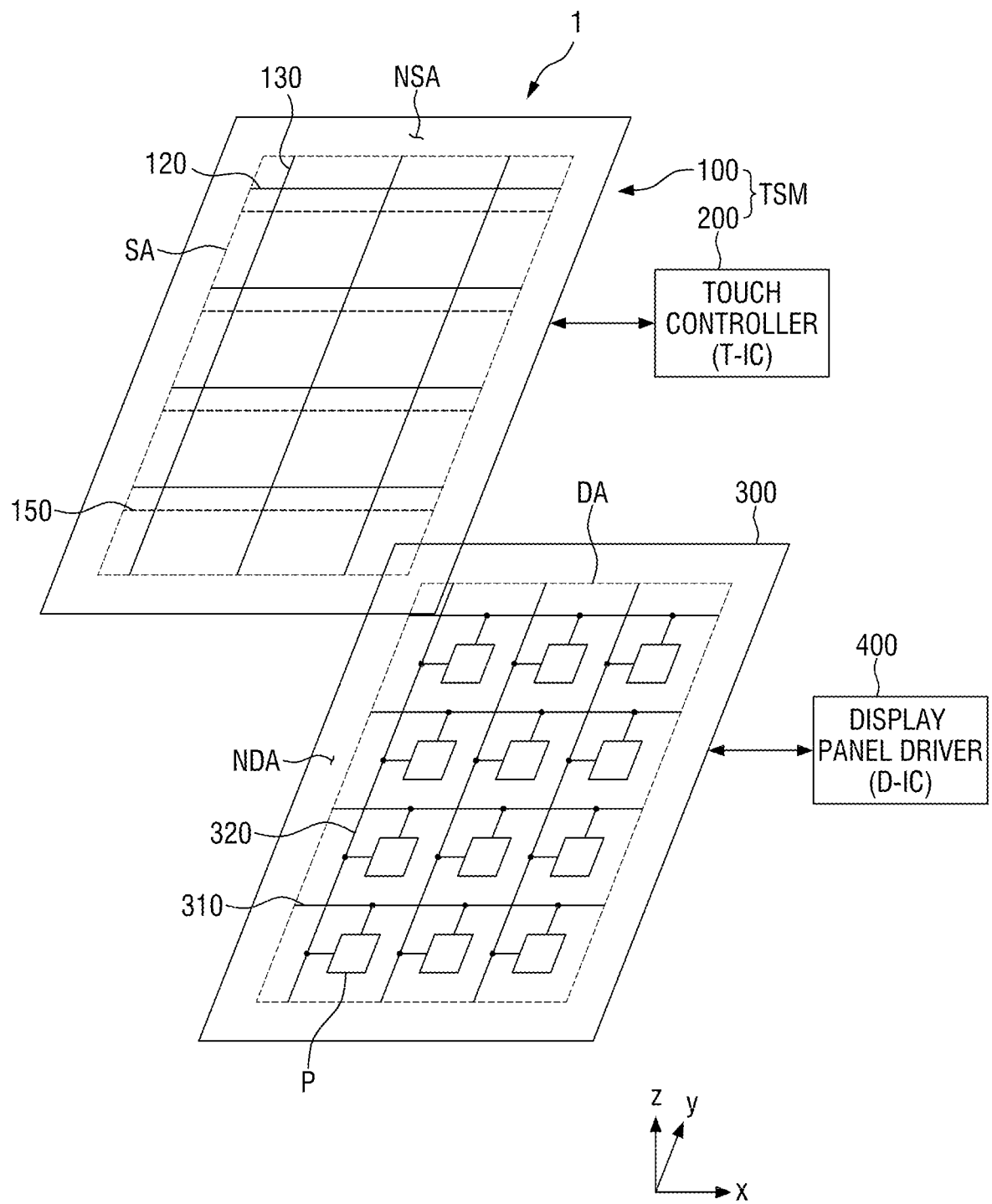
FIG. 1 is a schematic diagram of a touch sensor according to an embodiment and a display device including the touch sensor.

Features of the inventive concept and methods of accomplishing the same may be understood more readily by reference to the following detailed description of example embodiments and the accompanying drawings. The inventive concept may, however, be embodied in many different forms and should not be construed as being limited to the example embodiments set forth herein. Rather, these embodiments are provided so that the present disclosure will be thorough and complete and will fully convey the inventive concept to those skilled in the art. Like reference numerals refer to like elements throughout the specification unless the context clearly indicates otherwise.

The terms used herein are for the purpose of describing particular embodiments only and are not intended to be limiting of the inventive concept. As used herein, the singular forms "a", "an," and "the" are intended to include the plural forms as well, unless the context clearly indicates otherwise. It will be further understood that the terms "comprises" and/or "comprising," when used in the present specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or one or more intervening elements or layers may be present. In contrast, when an element or layer is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the inventive concept.

Embodiments of the present disclosure may be described herein with reference to plan and/or cross-section views that are schematic illustrations of idealized embodiments of the present disclosure. As such, variations from the shapes of the illustrations as a result, for example, of manufacturing techniques and/or tolerances, are to be expected. Thus, embodiments of the present disclosure should not be construed as limited to the particular shapes of regions illustrated herein but are to include deviations in shapes that may result, for example, from manufacturing. Thus, the regions illustrated in the drawings are schematic in nature, and their shapes are not intended to illustrate the actual shape of a region of an element and are not intended to limit the scope of the present disclosure.

The size and thickness of each component illustrated in the drawings are illustrated for ease of description, and the present disclosure is not necessarily limited to the sizes and thicknesses of the components illustrated in the drawings.

Hereinafter, example embodiments will be described with reference to the accompanying drawings.

Figure 2:
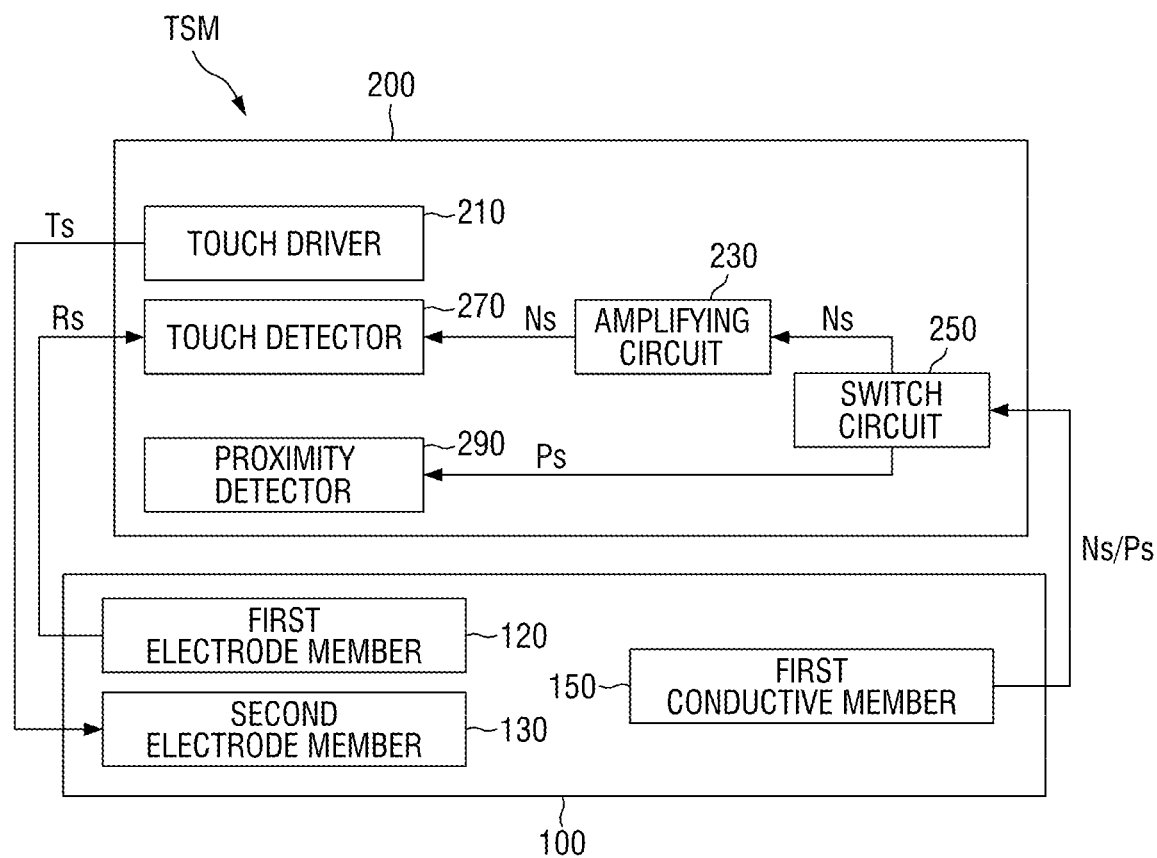
FIG. 2 is a block diagram of the touch sensor according to the embodiment illustrated in FIG. 1.

FIG. 1 is a schematic diagram of a display device 1 according to an embodiment, and FIG. 2 is a block diagram of a touch sensor TSM illustrated in FIG. 1.

Referring to FIGS. 1 and 2, the display device 1 according to the embodiment includes the touch sensor TSM and a display panel 300. The display device 1 may further include a display panel driver 400. The touch sensor TSM includes a sensing part 100 and a touch controller 200.

In FIG. 1, the sensing part 100 and the display panel 300 are shown to be separated from each other. However, it is noted that this is just for ease of description, and the sensing part 100 and the display panel 300 may also be formed integrally with each other.

The display panel 300 includes a display area DA and a non-display area NDA surrounding at least one side of the display area DA. The display area DA includes a plurality of scan lines 310, a plurality of data lines 320, and a plurality of pixels P connected to the scan lines 310 and the data lines 320. The non-display area NDA may include wirings and signal lines for carrying various driving and power signals for driving the pixels P.

In the present disclosure, the display panel 300 may be of various types, and is not particularly limited to a particular type. For example, the display panel 300 may be a self-luminous display panel such as an organic light emitting display panel including a plurality of organic light emitting diodes (OLEDs), a quantum dot light emitting display (QLED) panel, a micro-light emitting diode (LED) display panel, a nano-LED display panel. Alternatively, the display panel 300 may be a non-luminous display panel such as a liquid crystal display (LCD) panel, an electrophoretic display (EPD) panel, or an electrowetting display (EWD) panel. If the display panel 300 is a non-luminous display panel, the display device 1 may further include a backlight for supplying light to the display panel 300. For ease of description, a case where the display panel 300 is an organic light emitting display panel will be described below as an example.

The display panel driver 400 is electrically connected to the display panel 300 to supply signals for driving the display panel 300. For example, the display panel driver 400 may include at least one of a scan driver for supplying scan signals to the scan lines 310, a data driver for supplying data signals to the data lines 320, and a timing controller for supplying timing signals for driving the scan driver and the data driver. According to an embodiment, the scan driver, the data driver, and/or the timing controller may be integrated into a single display integrated circuit (D-IC). Alternatively, in an embodiment, at least one of the scan driver, the data driver, and the timing controller may be integrated or mounted on the display panel 300.

The sensing part 100 may be provided on at least one area of the display panel 300. For example, the sensing part 100 may be provided on at least one surface of the display panel 300 to at least partially overlap a portion of the display panel 300. For example, the sensing part 100 may be disposed on a surface (e.g., an upper surface) of the display panel 300 in a direction in which an image is displayed, between both surfaces (e.g., upper and lower surfaces) of the display panel 300. Alternatively, the sensing part 100 may be formed directly on at least one of both surfaces of the display panel 300 or may be formed inside the display panel 300. For example, the sensing part 100 may be formed directly on an outer surface of an upper substrate (or a thin-film encapsulation layer) or a lower substrate (e.g., an upper surface of the upper substrate or a lower surface of the lower substrate) of the display panel 300 or may be formed directly on an inner surface of the upper substrate or the lower substrate (e.g., a lower surface of the upper substrate or an upper surface of the lower substrate).

The sensing part 100 includes a sensing area SA and a peripheral area NSA surrounding at least a part of the sensing area SA. In some embodiments, the sensing area SA may correspond to an area in which the sensing part 100 can sense a touch input, and the peripheral area NSA may correspond to an area in which the sensing part 100 cannot sense a touch input. According to an embodiment, the sensing area SA may correspond to the display area DA of the display panel 300, and the peripheral area NSA may correspond to the non-display area NDA of the display panel 300. For example, the sensing area SA of the sensing part 100 may overlap the display area DA of the display panel 300, and the peripheral area NSA of the sensing part 100 may overlap the non-display area NDA of the display panel 300.

A plurality of first electrode members 120 and a plurality of second electrode members 130 for detecting a touch input may be provided in the sensing area SA of the sensing part 100.

The first electrode members 120 may extend along a first direction x and may be spaced apart from each other along a second direction y that intersects the first direction x. That is, the first electrode members 120 extending in the first direction x may be spaced apart from each other along the second direction y to form a plurality of electrode rows.

The second electrode members 130 may extend along the second direction y and may be spaced apart from each other along the first direction x. The second electrode members 130 may be spaced apart from the first electrode members 120 and may be insulated from the first electrode members 120. That is, the second electrode members 130 extending in the second direction y may be separated from each other along the first direction x to form a plurality of electrode columns.

Figure 3:
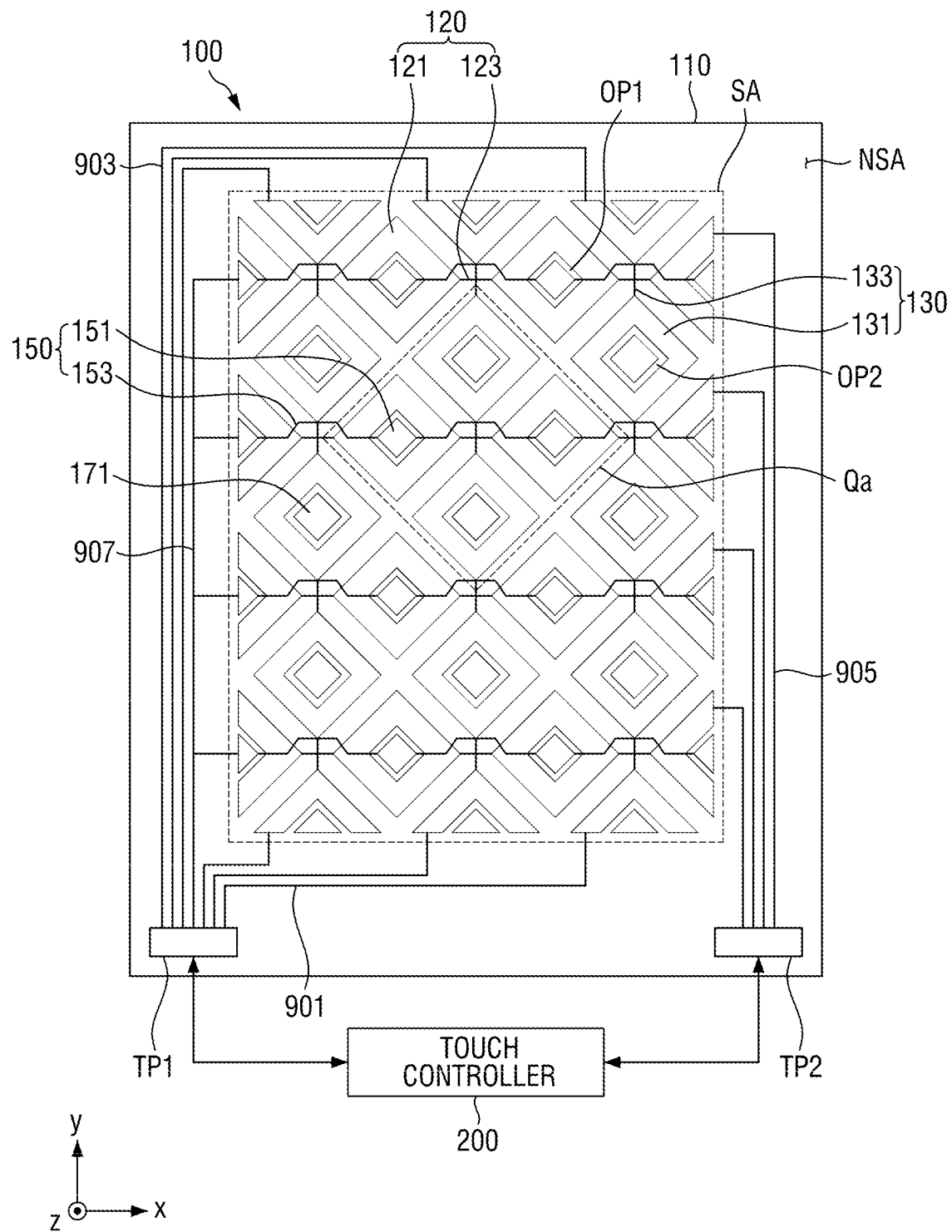
FIG. 3 illustrates the touch sensor of FIG. 2, a plan view of a sensing part of the touch sensor, and the connection relationship between the sensing part and a touch controller.

The shapes, sizes, and/or arrangement directions of the first electrode members 120 and the second electrode members 130 are not particularly limited to the present embodiment. As a non-limiting embodiment, the first electrode members 120 and the second electrode members 130 may be configured as illustrated in FIG. 3. The details of the embodiment illustrated in FIG. 3 will be described later.

The first electrode members 120 and the second electrode members 130 may be electrically connected to the touch controller 200. In some embodiments, each of the second electrode members 130 may be a driving electrode member that receives a driving signal Ts for touch detection from the touch controller 200, and each of the first electrode members 120 may be a sensing electrode member that outputs a sensing signal Rs for touch detection to the touch controller 200.

The first electrode members 120 and the second electrode members 130 may overlap at least one electrode of the display panel 300. For example, when the display panel 300 is an organic light emitting display panel, the first electrode members 120 and the second electrode members 130 may overlap a cathode of an organic light emitting diode (OLED) included in the display panel 300.

A plurality of first conductive members 150 may be provided in the sensing area SA of the sensing part 100. Each of the first conductive members 150 may sense a noise generated by the sensing part 100 according to an operation of a switch circuit 250 and provide the sensed noise to a touch detector 270 as a noise sensing signal Ns. In addition, each of the first conductive members 150 may provide a proximity sensing signal Ps to a proximity detector 290 according to another operation of the switch circuit 250. The first conductive members 150 may be spaced apart from the first electrode members 120 and the second electrode members 130 and may be insulated from the first electrode members 120 and the second electrode members 130.

In some embodiments, the first conductive members 150, like the first electrode members 120, may extend along the first direction x and may be spaced apart from each other along the second direction y that intersects the first direction x. The first conductive members 150 will be described in more detail later.

The touch controller 200 may be electrically connected to the sensing part 100 to supply the driving signal Ts to the sensing part 100 and may detect a touch position by receiving the sensing signal Rs corresponding to the driving signal Ts supplied by the sensing part 100. In addition, the touch controller 200 may be electrically connected to the first conductive members 150 to detect whether an object is in proximity.

In some embodiments, the touch controller 200 may include a touch driver 210, the touch detector 270, and the proximity detector 290. The touch controller 200 may further include the switch circuit 250 and an amplifying circuit 230.

The touch driver 210 may provide the driving signal Ts for detecting a touch input to each of the second electrode members 130.

The touch detector 270 may detect the presence or absence of a touch input and/or the position of the touch input using the sensing signal Rs corresponding to the driving signal Ts received from each of the first electrode members 120 during a period in which a touch sensing operation is performed. In some embodiments, the sensing signal Rs may be a change in mutual capacitance between a first electrode member 120 and a second electrode member 130. More specifically, when a touch input occurs, the mutual capacitance is changed at a position of the touch input and/or around the position of the touch input. The touch detector 270 may receive the sensing signal Rs that indicates a change in mutual capacitance between a first electrode member 120 and a second electrode member 130 and detect the presence or absence and/or position of a touch input based on the sensing signal Rs. In addition, the touch detector 270 may receive the noise sensing signal Ns from each of the first conductive members 150 and remove or cancel a noise component included in the sensing signal Rs using the noise sensing signal Ns.

In some embodiments, the touch detector 270 may include at least one amplifier for amplifying the sensing signal Rs, an analog-digital converter (ADC) connected to an output terminal of the amplifier, and a processor. These components of the touch detector 270 will be described in more detail later with reference to FIGS. 21A and 22.

The proximity detector 290 is electrically connected to the first conductive members 150 and receives the proximity sensing signal Ps from each of the first conductive members 150 to detect the proximity of an object. In some embodiments, the proximity sensing signal Ps may include a signal that indicates a change in the self-capacitance of a first conductive member 150 when an object is in proximity.

The switch circuit 250 may electrically connect the first conductive members 150 to one of the touch detector 270 and the proximity detector 290. In some embodiments, the switch circuit 250 may electrically connect the first conductive members 150 to the touch detector 270 during a first period in which the touch controller 200 performs a touch sensing operation. In addition, the switch circuit 250 may electrically connect the first conductive members 150 to the proximity detector 290 during a second period in which the touch controller 200 performs a proximity sensing operation. That is, in some embodiments, the touch controller 200 may switch between two modes, for example, a touch sensing mode and a proximity sensing mode according to the operation of the switch circuit 250.

The amplifying circuit 230 is connected to the first conductive members 150 and the touch detector 270 and may amplify the noise sensing signal Ns provided by each of the first conductive members 150 or adjust a gain value of the noise sensing signal Ns. In some embodiments, the amplifying circuit 230 may be connected between the switch circuit 250 and the touch detector 270. During the first period in which the touch controller 200 performs the touch sensing operation, the amplifying circuit 230 may be electrically connected to the first conductive members 150 and may amplify the noise sensing signal Ns received from each of the first conductive members 150 or adjust the gain value of the noise sensing signal Ns and provide the amplified or gain value-adjusted noise sensing signal Ns to the touch detector 270.

In some embodiments, the touch driver 210, the touch detector 270, the proximity detector 290, the amplifying circuit 230, and the switch circuit 250 may be integrated into a single touch IC.

In some embodiments, some of the touch driver 210, the touch detector 270, the proximity detector 290, the amplifying circuit 230, and the switch circuit 250 may be located in a position other than the inside of the touch IC.

The touch sensor TSM will now be described in more detail by referring to FIGS. 3 through 10.

Figure 4:
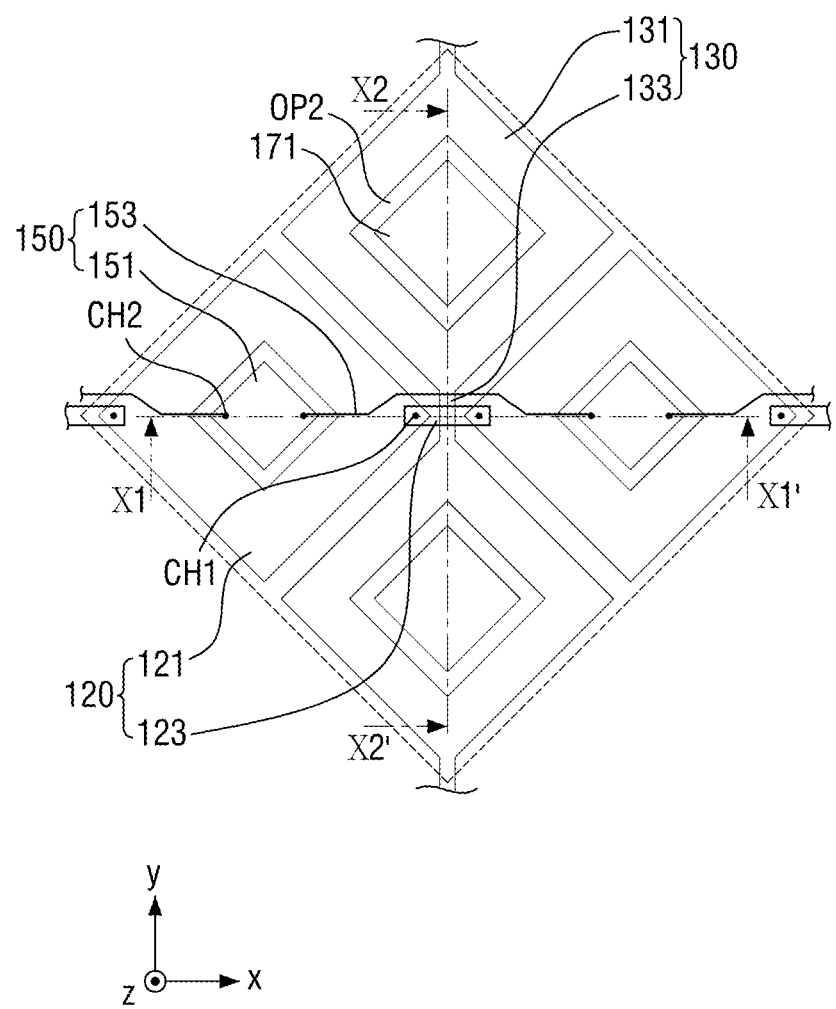
FIG. 4 is an enlarged plan view of a portion Qa of FIG. 3.
Figure 5:
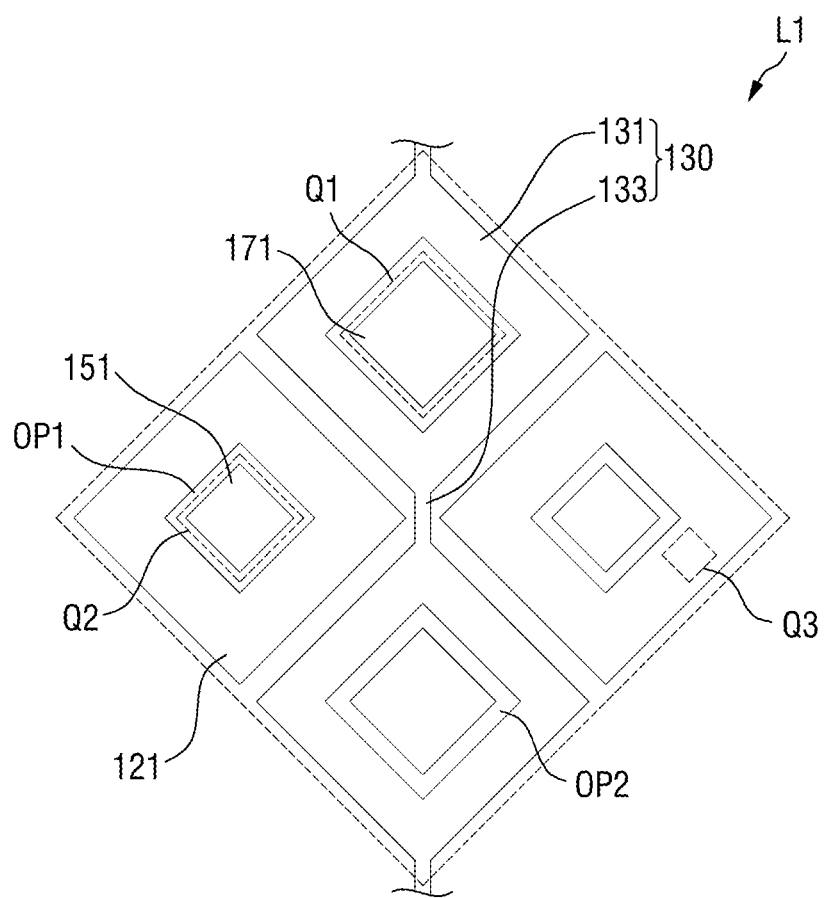
FIG. 5 illustrates an exemplary structure of a first layer of the sensing part of FIG. 4.
Figure 6:
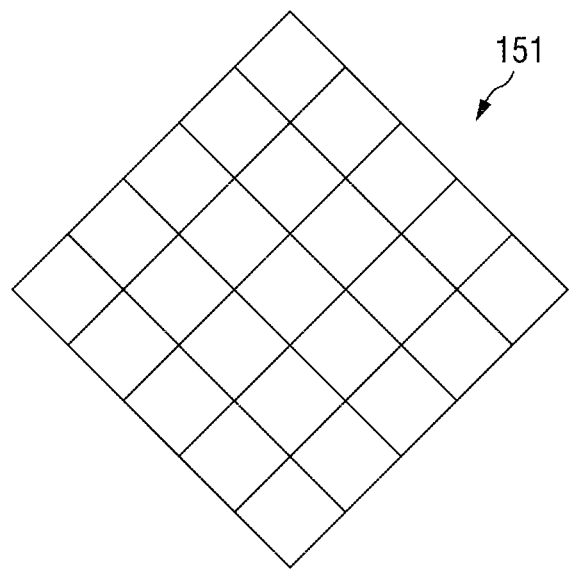
FIG. 6 is an enlarged plan view of a portion Q1 of FIG. 5.
Figure 7:
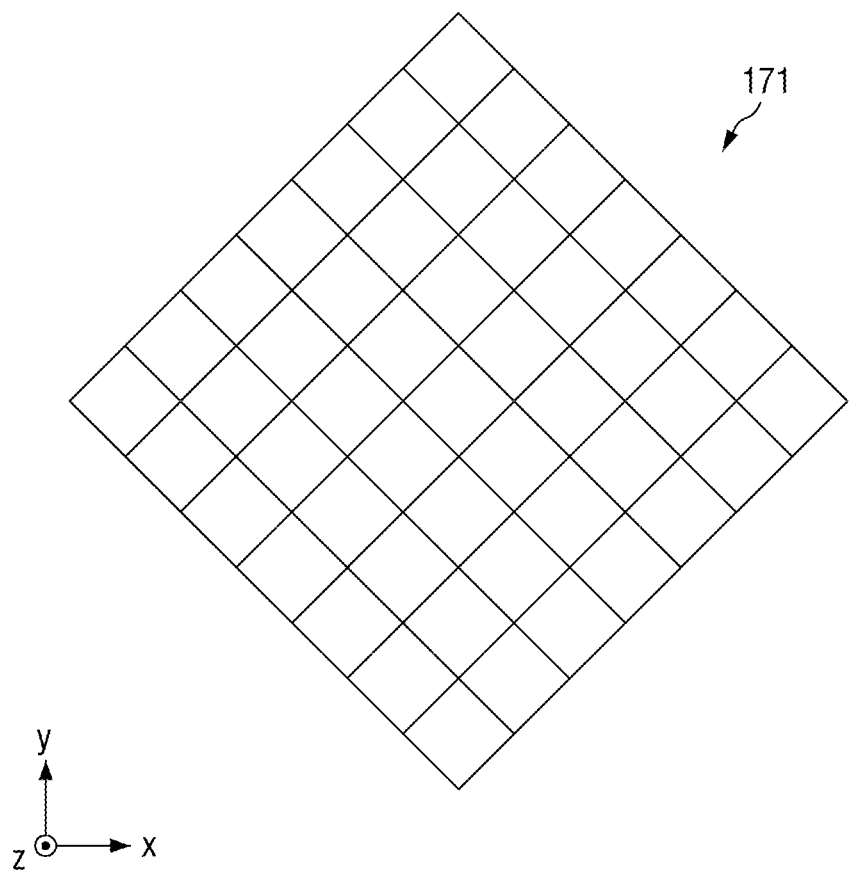
FIG. 7 is an enlarged plan view of a portion Q2 of FIG. 5.
Figure 8:
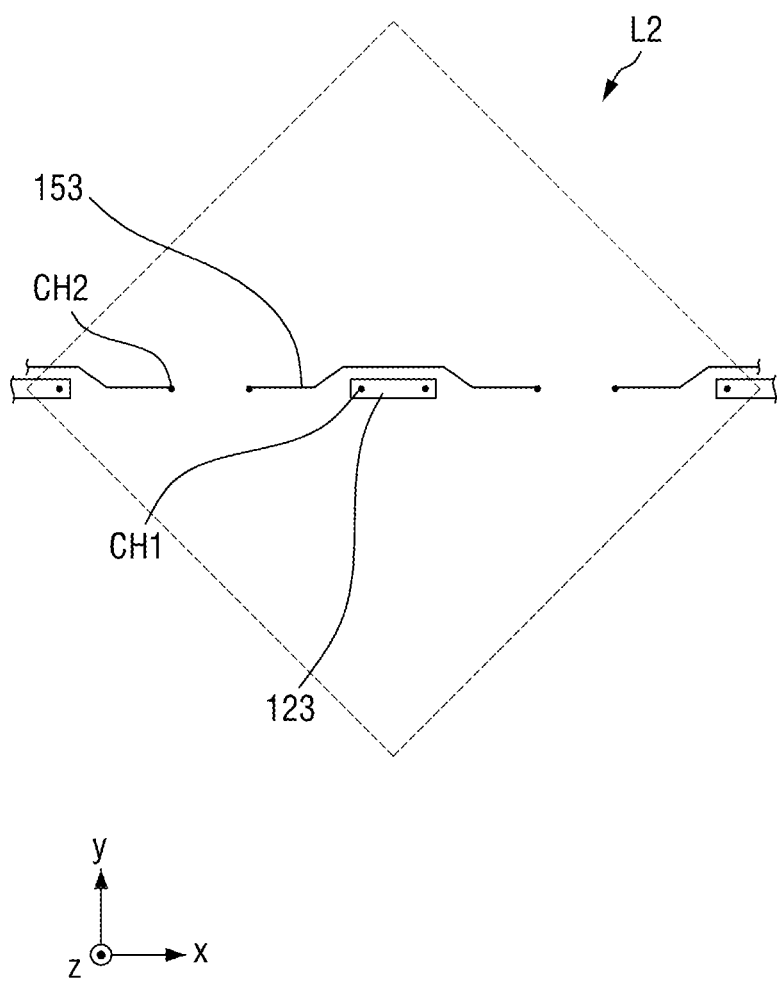
FIG. 8 illustrates an exemplary structure of a second layer of the sensing part of FIG. 4.
Figure 9:
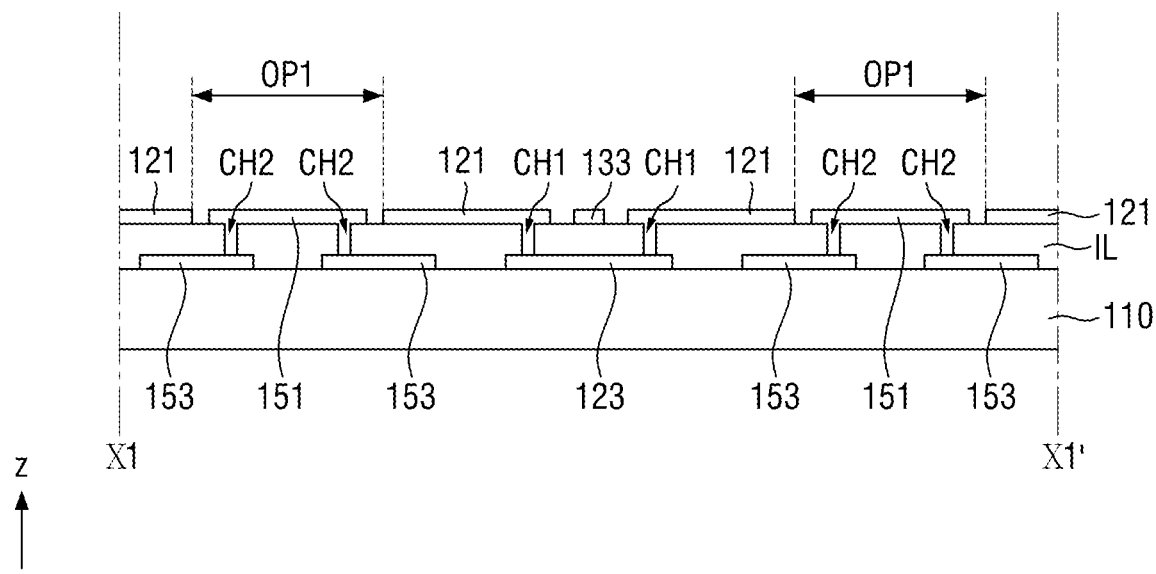
FIG. 9 is a cross-sectional view taken along X1-X1' of FIG. 4.
Figure 10:
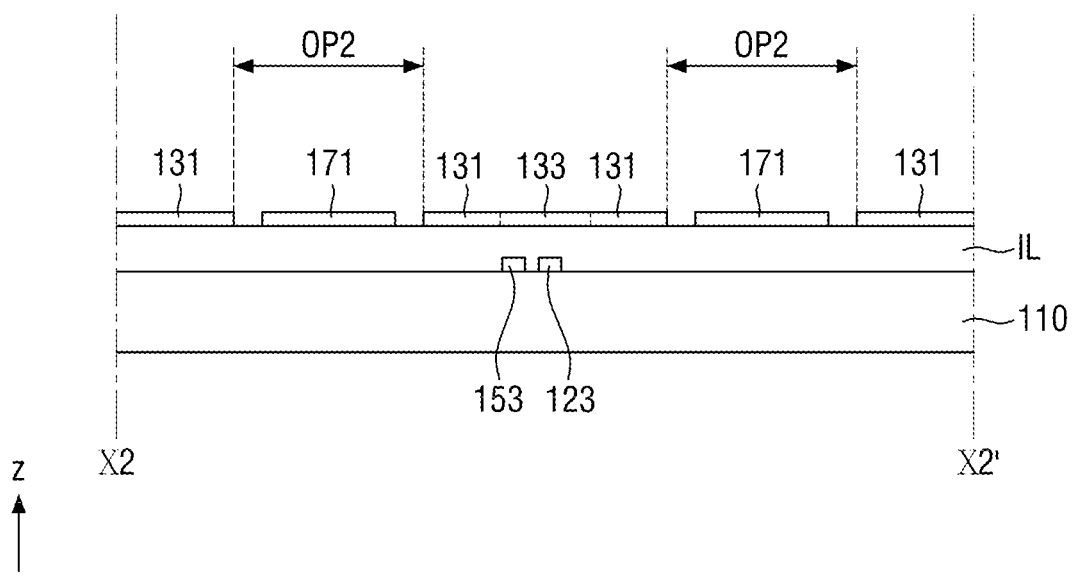
FIG. 10 is a cross-sectional view taken along X2-X2' of FIG. 4.

FIG. 3 illustrates the touch sensor TSM of FIG. 2, a plan view of the sensing part 100 of the touch sensor TSM, and the connection relationship between the sensing part 100 and the touch controller 200. FIG. 4 is an enlarged plan view of a portion Qa of FIG. 3. FIG. 5 illustrates an exemplary structure of a first layer L1 of the sensing part 100 of FIG. 4. FIG. 6 is an enlarged plan view of a portion Q1 of FIG. 5. FIG. 7 is an enlarged plan view of a portion Q2 of FIG. 5. FIG. 8 illustrates an exemplary structure of a second layer L2 of the sensing part 100 of FIG. 4 and a position of contact holes. FIG. 9 is a cross-sectional view taken along X1-X1' of FIG. 4. FIG. 10 is a cross-sectional view taken along X2-X2' of FIG. 4.

Referring to FIGS. 3 through 10, the sensing part 100 includes a base layer 110, the first electrode members 120, the second electrode members 130, and the first conductive members 150. The sensing part 100 may further include conductors 171 as illustrated in FIGS. 3 and 4.

The base layer 110 may include the sensing area SA and the peripheral area NSA. The base layer 110 may be a layer serving as a base of the sensing part 100. In some embodiments, the base layer 110 may be one of the layers constituting the display panel 300. In an embodiment in which the sensing part 100 and the display panel 300 are formed integrally with each other, the base layer 110 may be at least one of the layers constituting the display panel 300. For example, the base layer 110 may be a thin-film encapsulation layer of the display panel 300. Alternatively, according to an embodiment, the base layer 110 may be a rigid substrate or a flexible substrate. For example, the base layer 110 may be a rigid substrate made of glass or tempered glass or a flexible substrate made of a thin film of a flexible plastic material. A case where the base layer 110 is a layer including at least one of the layers constituting the display panel 300 (e.g., the thin-film encapsulation layer) will be described below as an example.

The first electrode members 120, the second electrode members 130, the first conductive members 150, and the conductors 171 may be located on the sensing area SA of the base layer 110.

The first electrode members 120 may extend along the first direction x and may be spaced apart from each other along the second direction y as described above. Each of the first electrode members 120 spaced apart from each other along the second direction y may form an electrode row. In FIG. 3, four first electrode members 120 are arranged along the second direction y to form four electrode rows. However, the present disclosure is not limited to this case, and the number of the first electrode members 120 can be variously changed.

Each of the first electrode members 120 may include a plurality of first electrodes 121 arranged along the first direction x and a plurality of first connection portions 123, each connecting the first electrodes 121 neighboring each other along the first direction x. In the following description of embodiments, the term "connection" may encompass "connection" in physical and/or electrical aspects.

In some embodiments, as illustrated in FIG. 5, the first electrodes 121 may be located in the first layer L1. The first electrodes 121 may have a rhombic shape or a square shape. However, the shape of the first electrodes 121 is not limited to the rhombic shape or the square shape and can be changed to various shapes such as a triangle, a quadrilateral, a quadrilateral, a pentagon, a circle, and a bar.

The first electrodes 121 may include a conductive material. Examples of the conductive material may include metals and alloys of the metals. Examples of the metals may include gold (Au), silver (Ag), aluminum (Al), molybdenum (Mo), chromium (Cr), titanium (Ti), nickel (Ni), neodymium (Nd), copper (Cu), and platinum (Pt). The first electrodes 121 may also be made of a transparent conductive material. Examples of the transparent conductive material may include silver nanowire (AgNW), indium tin oxide (ITO), indium zinc oxide (IZO), antimony zinc oxide (AZO), indium tin zinc oxide (ITZO), zinc oxide (ZnO), tin oxide ($SnO_2$), carbon nanotube, and graphene.

In some embodiments, the first electrodes 121 may have a single-layer structure or a multilayer structure. When the first electrodes 121 have a multilayer structure, the first electrodes 121 may include multiple metal layers. For example, the first electrodes 121 may have a three-layer structure of Ti/Al/Ti.

In some embodiments, the first electrodes 121 may have a mesh structure that is invisible to a user. When the first electrodes 121 have a mesh structure, they may be arranged not to overlap light emitting areas of the display panel 300. In other words, a mesh hole overlapping a light emitting area may be defined in each of the first electrodes 121 that has the mesh structure.

Each of the first electrodes 121 may include a first opening OP1. For example, at least a central portion of each of the first electrodes 121 may be open to expose a layer located under the first electrode 121. For example, when an insulating layer IL is located under the first electrodes 121 as illustrated in FIG. 9, a portion of the insulating layer IL may be exposed through each of the first openings OP1. However, the present disclosure is not limited to this case, and some of the first electrodes 121 may not include the first opening OP1.

Each of the first connection portions 123 may contact and electrically connect the first electrodes 121 neighboring each other along the first direction x. In some embodiments, each of the first connection portions 123 may be configured as a bridge-shaped connection pattern. In some embodiments, the first connection portions 123 may be located in the second layer L2 that is different from the first layer L1 in which the first electrodes 121 are located, as illustrated in FIG. 8.

In some embodiments, as illustrated in FIG. 9, the insulating layer IL may be located between the first electrodes 121 and the first connection portions 123. In some embodiments, the first connection portions 123 that are located in the second layer L2 may be located on the base layer 110, the insulating layer IL may be located on the first connection portions 123, and the first electrodes 121 that are located in the first layer L1 may be located on the insulating layer IL. The first connection portions 123 and the first electrodes 121 may be connected to and directly contact each other through first contact holes CH1 that are formed in the insulating layer IL.

The insulating layer IL may include an insulating material. In some embodiments, the insulating material may be an inorganic insulating material or an organic insulating material. The inorganic insulating material may include at least one of aluminum oxide, titanium oxide, silicon oxide, silicon oxynitride, zirconium oxide, and hafnium oxide. The organic insulating material may include at least one of acrylic resin, methacrylic resin, polyisoprene, vinyl resin, epoxy resin, urethane resin, cellulose resin, siloxane resin, polyimide resin, polyamide resin, and perylene resin.

The first connection portions 123 may include a conductive material. In some embodiments, the first connection portions 123 may include the same material as the first electrodes 121 or may include one or more materials selected from the materials exemplified as the constituent material of the first electrodes 121. In some embodiments, the first connection portions 123 may have a single-layer structure or a multilayer structure. For example, the first connection portions 123 may have a three-layer structure of Ti/Al/Ti. Alternatively, the first connection portions 123 may be made of a material that is different from the first electrodes 121.

In FIGS. 3 and 4, one first connection portion 123 is disposed between two first electrodes 121 neighboring each other along the first direction x. However, the number of the first connection portions 123 connecting two neighboring first electrodes 121 can be variously changed. For example, two or more first connection portions 123 may be disposed between two first electrodes 121 neighboring each other along the first direction x.

The second electrode members 130 may extend along the second direction y and may be spaced apart from each other along the first direction x as described above. Each of the second electrode members 130 spaced apart from each other along the first direction x may form an electrode column. In FIG. 3, three second electrode members 130 are arranged along the first direction x to form three electrode columns. However, the present disclosure is not limited to this case, and the number of the second electrode members 130 can be variously changed.

Each of the second electrode members 130 may include a plurality of second electrodes 131 arranged along the second direction y and a plurality of second connection portions 133, each electrically connecting the second electrodes 131 neighboring each other along the second direction y.

The second electrodes 131 may be electrically connected to each other along the second direction y. In addition, the second electrodes 131 may be spaced apart from each other along the first direction x.

Each of the second electrodes 131 may include a second opening OP2. For example, at least a central portion of each of the second electrodes 131 may be open to expose a layer located under the second electrode 131. For example, when the insulating layer IL is located under the second electrodes 131 as illustrated in FIG. 10, a portion of the insulating layer IL may be exposed through each of the second openings OP2. However, the present disclosure is not limited to this case, and some of the second electrodes 131 may not include the second opening OP2.

In some embodiments, in a plan view, the area of each of the second openings OP2 may be different from the area of each of the first openings OP1. For example, the area of each of the second openings OP2 may be larger than the area of each of the first openings OP1.

In some embodiments, as illustrated in FIG. 5, the second electrodes 131 may be located in the same first layer L1 as the first electrodes 121. The second electrodes 131 may have a rhombic planar shape. However, the planar shape of the second electrodes 131 is not limited to the rhombic shape and can be changed to various shapes such as a triangle, a quadrilateral, a pentagon, a circle, and a bar.

Each of the second connection portions 133 may contact and electrically connect the second electrodes 131 neighboring each other along the second direction y. In some embodiments, the second connection portions 133 may be located in the same first layer L1 as the first electrodes 121 and the second electrodes 131, as illustrated in FIG. 5.

The second connection portions 133 may be insulated from the first connection portions 123 and may intersect the first connection portions 123 in a plan view. In some embodiments, the insulating layer IL may be located between the second connection portions 133 and the first connection portions 123 as illustrated in FIGS. 9 and 10.

The second electrodes 131 and the second connection portions 133 may include a conductive material. In some embodiments, the second electrodes 131 and the second connection portions 133 may be made of the same conductive material as the first electrodes 121.

In some embodiments, when the first electrodes 121 have a mesh structure, the second electrodes 131 may also have a mesh structure.

In some embodiments, each of the second electrodes 131 may be a touch driving electrode that receives the driving signal Ts for detecting a touch input and the position of the touch input, and each of the first electrodes 121 may be a touch sensing electrode that outputs the sensing signal Rs for detecting a touch input and the position of the touch input.

The first conductive members 150 may be located in the electrode rows formed by the first electrode members 120. In some embodiments, the first conductive members 150 may be located in the electrode rows formed by the first electrode members 120, respectively. Each of the first conductive members 150 may output the noise sensing signal Ns or the proximity sensing signal Ps according to the operational mode of the touch sensor TSM as described above.

Each of the first conductive members 150 may include a plurality of first conductive patterns 151 and a plurality of first connection lines 153.

The first conductive patterns 151 may be located within the first openings OP1 of the first electrodes 121, respectively, and may be spaced apart from the first electrodes 121. In some embodiments, as illustrated in FIG. 5, the first conductive patterns 151 may be located in the same first layer L1 as the first electrodes 121 and may be made of the same material as the first electrodes 121.

In some embodiments, when the first electrodes 121 have a mesh structure, the first conductive patterns 151 may also have a mesh structure, as illustrated in FIG. 6.

Each of the first connection lines 153 may electrically connect the first conductive patterns 151 located in the same electrode row and neighboring each other along the first direction x. In some embodiments, as illustrated in FIG. 8, the first connection lines 153 may be located in the same second layer L2 as the first connection portions 123 and may be made of the same material as the first connection portions 123.

In some embodiments, the first conductive patterns 151 and the first connection lines 153 may be connected to each other through second contact holes CH2 that are formed in the insulating layer IL.

The conductors 171 may be located within the second openings OP2 of the second electrodes 131, respectively. The second openings OP2 formed in the second electrodes 131 may cause a difference in external light reflectance. Accordingly, pattern stains may be visible from the outside. The conductors 171 may reduce the difference in external light reflectance, thereby reducing the occurrence of pattern stains that may be visible from the outside.

The conductors 171 may be spaced apart from the second electrodes 131. In some embodiments, the conductors 171 may be in a floating state.

In some embodiments, the conductors 171 may have the same shape as the second openings OP2. For example, when the second openings OP2 are rhombic, the conductors 171 may also be rhombic.

The conductors 171 may be located in the same first layer L1 as the first electrodes 121, the second electrodes 131, and the first conductive patterns 151 as illustrated in FIG. 5 and may be made of the same material as one of the first electrodes 121, the second electrodes 131, and the first conductive patterns 151.

In some embodiments, when the second electrodes 131 have a mesh structure, the conductors 171 may also have a mesh structure as illustrated in FIG. 7.

In some embodiments, in a plan view, the area of each of the first openings OP1 may be smaller than the area of each of the second openings OP2. Accordingly, the area of each of the conductors 171 may be larger than the area of each of the first conductive patterns 151.

In some embodiments, wirings 901, 903, 905, and 907 may be disposed on the peripheral area NSA of the base layer 110 as illustrated in FIG. 3.

For example, the wirings 901, 903, 905, and 907 may include a third wiring 905 that is connected to each of the first electrode members 120, a first wiring 901 that is connected to an end of each of the second electrode members 130, a second wiring 903 that is connected to the other end of each of the second electrode members 130, and a fourth wiring 907 connected to each of the first conductive members 150. Here, the other end of each of the second electrode members 130 refers to an end that is opposite to an end of each second electrode member 130 to which the first wiring 901 is connected. That is, a wiring connected to each of the second electrode members 130 may have a double routing structure, which can improve a resistive-capacitive (RC) delay caused by the resistance of the second electrode members 130. However, the present disclosure is not limited to this case. For example, one of the first wirings 901 and the second wirings 903 illustrated in FIG. 3 may be omitted. In an embodiment, a wiring connected to each of the second electrode members 130 may have a single routing structure.

Each of the first wiring 901 and the second wiring 903 may be provided in plural numbers, and the first wirings 901 and the second wirings 903 may be connected to the second electrode members 130, respectively. In addition, the third wiring 905 may be provided in plural numbers, and the third wirings 905 may be connected to the first electrode members 120, respectively.

In some embodiments, only a single fourth wiring 907 may be provided, unlike the first wirings 901, the second wirings 903, and the third wirings 905. The single fourth wiring 907 may be connected to all of the first conductive members 150. Accordingly, the number of channels or pads allocated to the first conductive members 150 can be reduced, and the area occupied by the fourth wiring 907 in the peripheral area NSA can be reduced. In other embodiments, two or more fourth wirings 907 can also be provided.

Pad portions TP1 and TP2 may be located on the peripheral area NSA of the base layer 110. The pad portions TP1 and TP2 may be electrically connected to the wirings 901, 903, 905 and 907, and the touch controller 200 may be electrically connected to the pad portions TP1 and TP2.

In some embodiments, the pad portions TP1 and TP2 may include a first pad portion TP1 and a second pad portion TP2 that are spaced apart from each other along the first direction x. The first pad portion TP1 may be connected to the first wirings 901, the second wirings 903, and the one or more fourth wirings 907, and the second pad portion TP2 may be connected to the third wirings 905. However, the present disclosure is not limited to this case. For example, the first pad portion TP1 and the second pad portion TP2 may form a single pad portion without being spaced apart from each other. In addition, wirings connected to each of the first pad portion TP1 and the second pad portion TP2 can be variously changed.

In the touch sensor TSM according to the above-described embodiment, the first electrodes 121, the second electrodes 131, the first conductive patterns 151, and the conductors 171 that are located in the same first layer L1 can be simultaneously formed in the same process, thus simplifying a manufacturing process. In addition, since the first electrodes 121, the second electrodes 131, and the first conductive patterns 151 are located in the same first layer L1, the touch sensor TSM can be implemented as a thin sensor while serving as a proximity sensor. Further, since the touch sensor TSM serves also as a proximity sensor, there is no need to form a layer and/or a hole for implementing the proximity sensor in the display device 1.

In addition, the first connection lines 153 of the first conductive members 150 that are located in the same second layer L2 as the first connection portions 123 can be formed at the same time in the same process, thus further simplifying the manufacturing process.

Furthermore, since each of the first conductive members 150 can output the noise sensing signal Ns during the touch sensing operation of the touch sensor TSM, the touch sensor TSM can stably detect a touch input, and the sensing sensitivity of the touch sensor TSM can be improved.

However, the structure of the sensing part 100 is not limited to that described above.

Figure 62:
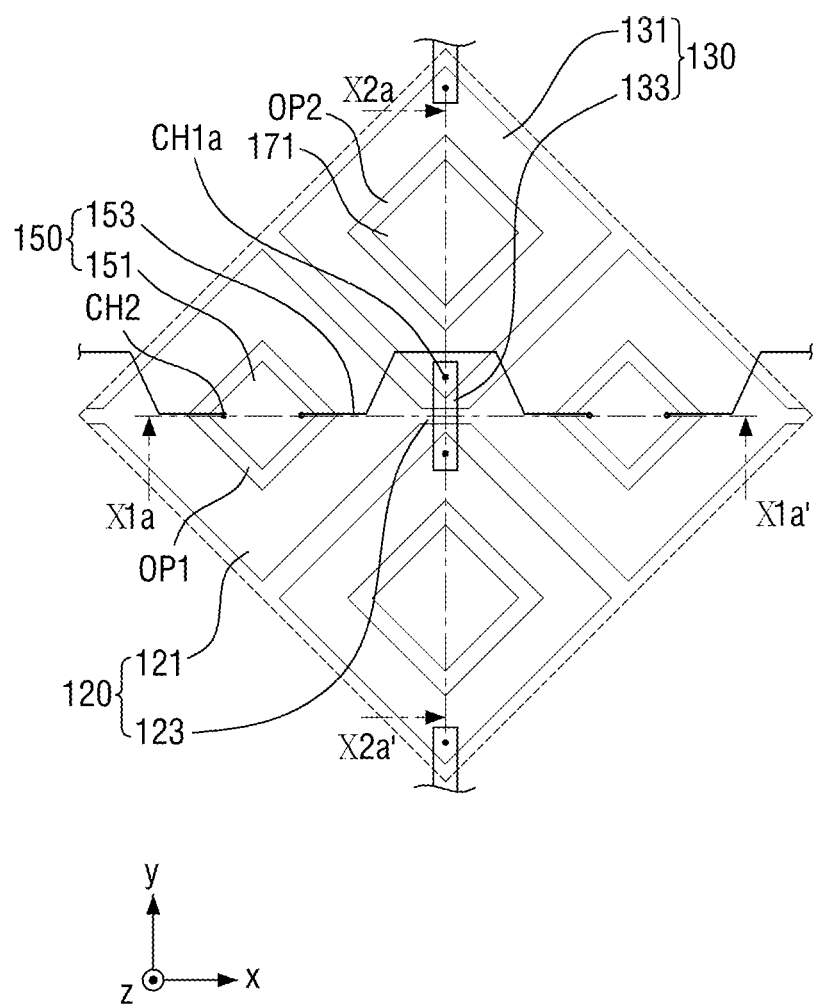
FIG. 62 illustrates a modified example of FIG. 4.
Figure 63:
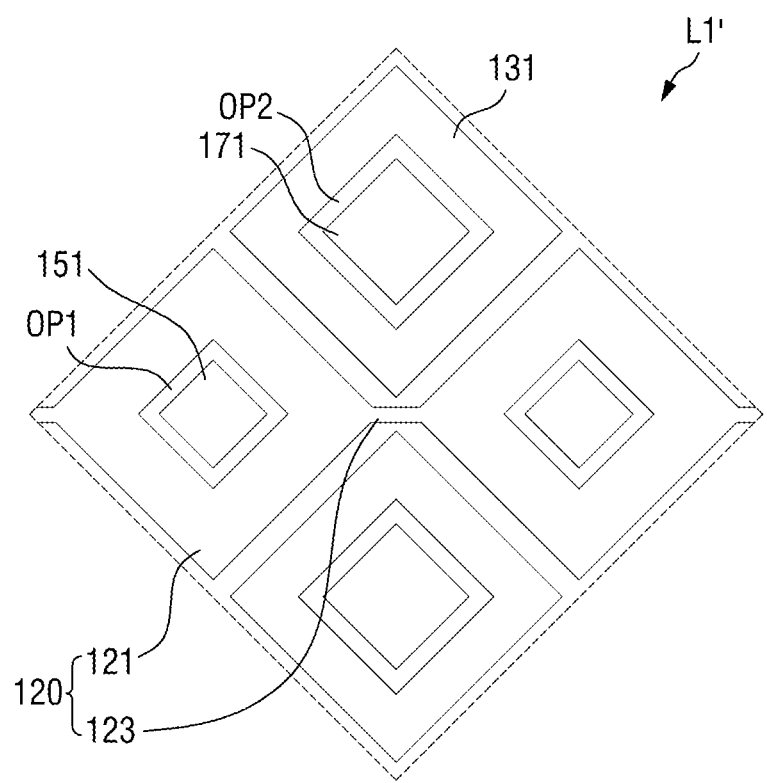
FIG. 63 illustrates an exemplary structure of a first layer of a sensing part of FIG. 62.
Figure 64:
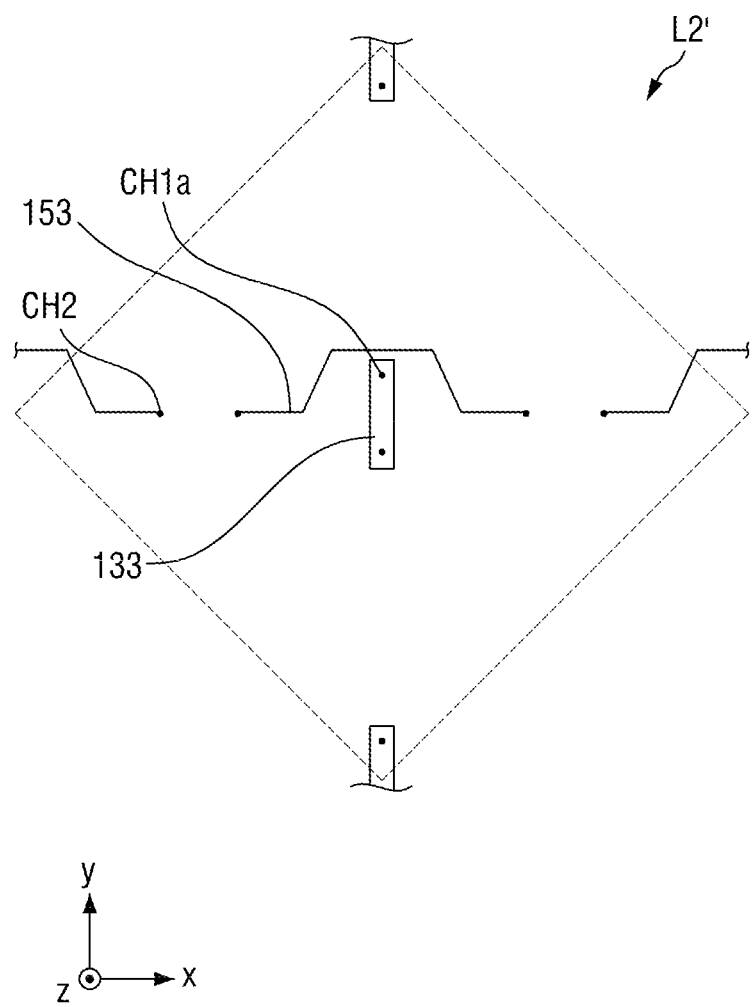
FIG. 64 illustrates an exemplary structure of a second layer of the sensing part of FIG. 62.
Figure 65:
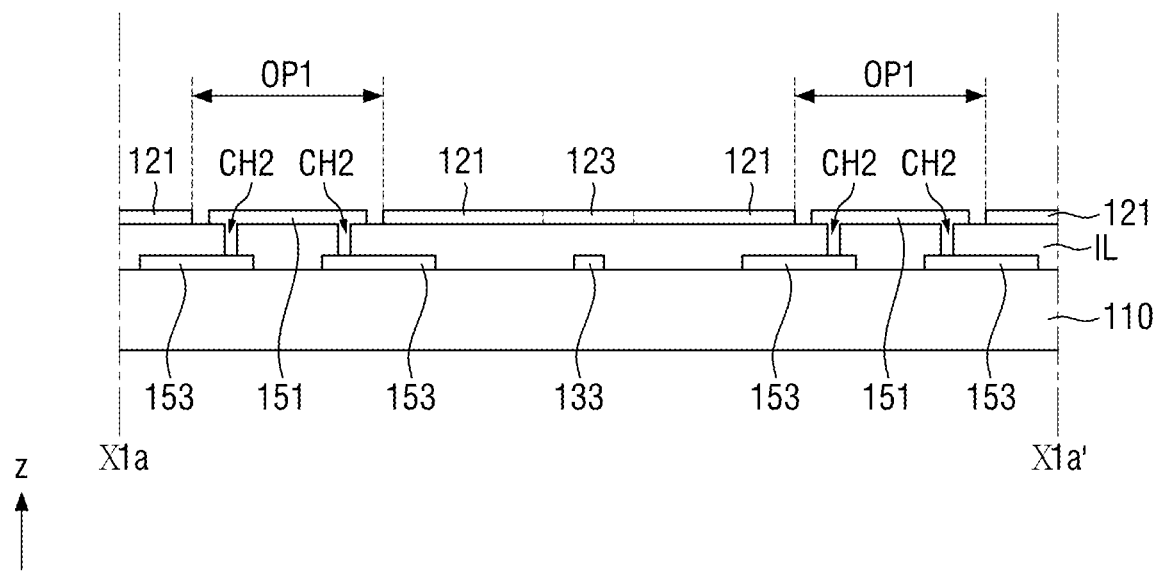
FIG. 65 is a cross-sectional view taken along X1a-X1a' of FIG. 62.
Figure 66:
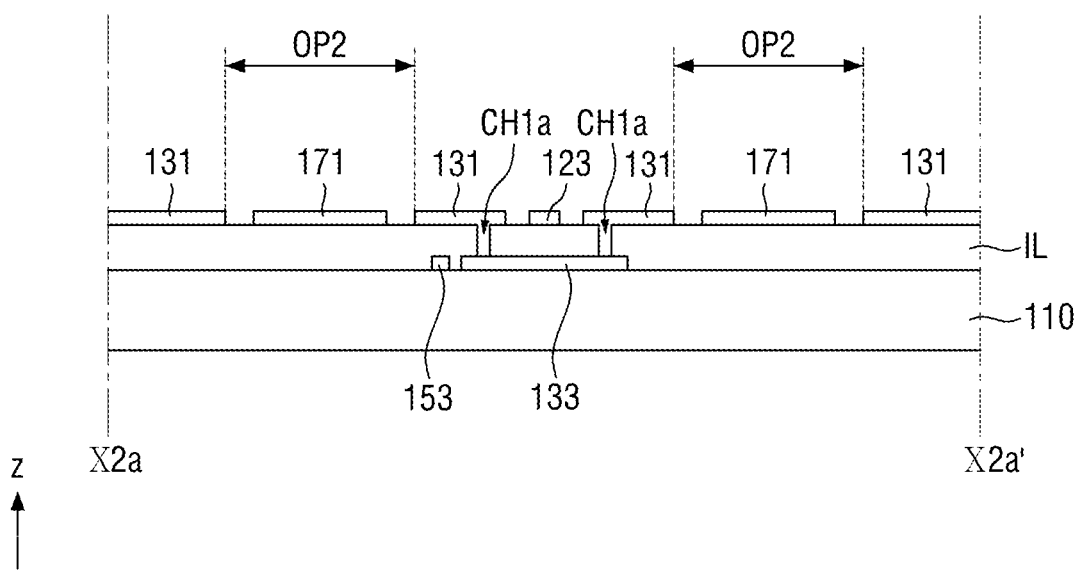
FIG. 66 is a cross-sectional view taken along X2a-X2a' of FIG. 62.

FIG. 62 illustrates a modified example of FIG. 4. FIG. 63 illustrates an exemplary structure of a first layer L1' of a sensing part of FIG. 62. FIG. 64 illustrates an exemplary structure of a second layer L2' of the sensing part of FIG. 62. FIG. 65 is a cross-sectional view taken along X1a-X1a' of FIG. 62. FIG. 66 is a cross-sectional view taken along X2a-X2a' of FIG. 62.

Referring to FIGS. 62 through 66, in comparison to FIGS. 4, 5, 8, 9 and 10, a first connection portion 123 of a first electrode member 120 may be located in the same first layer L1' as first electrodes 121 and second electrodes 131 and may be made of the same material as one of the first electrodes 121 and the second electrodes 131. In addition, a second connection portion 133 of a second electrode member 130 may be located in the same second layer L2' as a first connection line 153 and may be made of the same material as the first connection line 153. The second connection portion 133 and the second electrodes 131 may be connected to each other through contact holes CH1a that are formed in an insulating layer IL.

In the current modified example, since the second connection portion 133 is located in the second layer L2', the first connection line 153 may bypass the second connection portion 133 and overlap a portion of a second electrode 131 in a plan view.

Other components are the same as those described above with reference to FIGS. 4 through 10, and thus their description is omitted.

Figure 67:
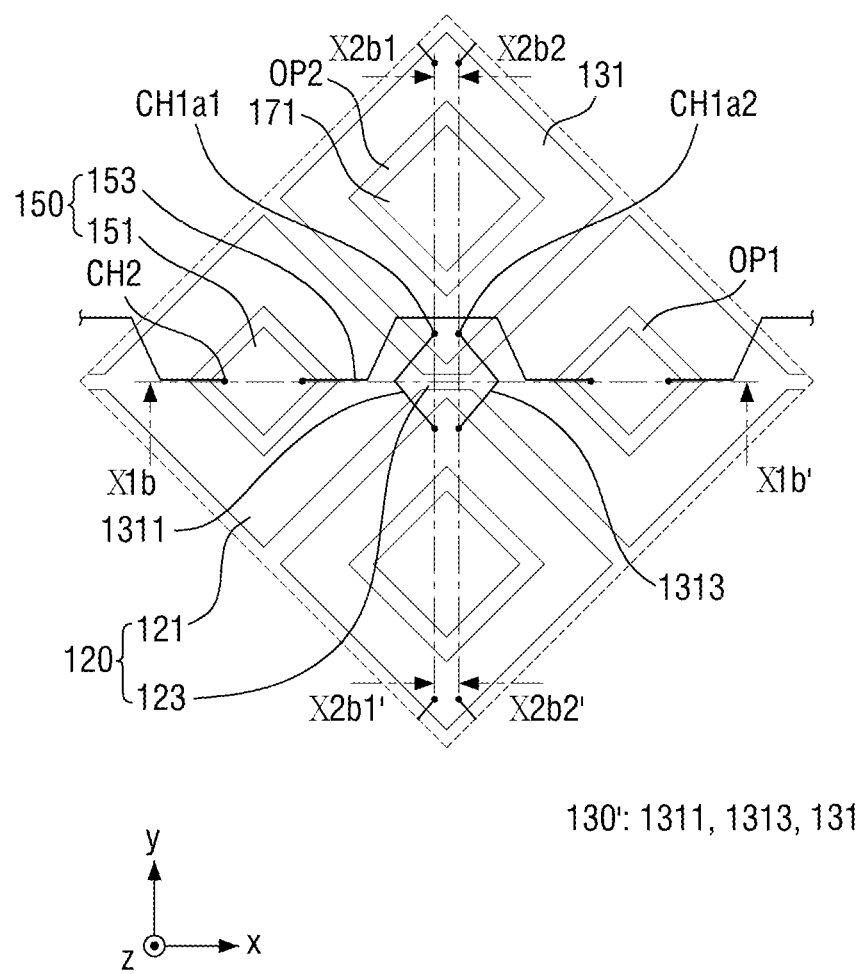
FIG. 67 illustrates a modified example of FIG. 62.
Figure 68:
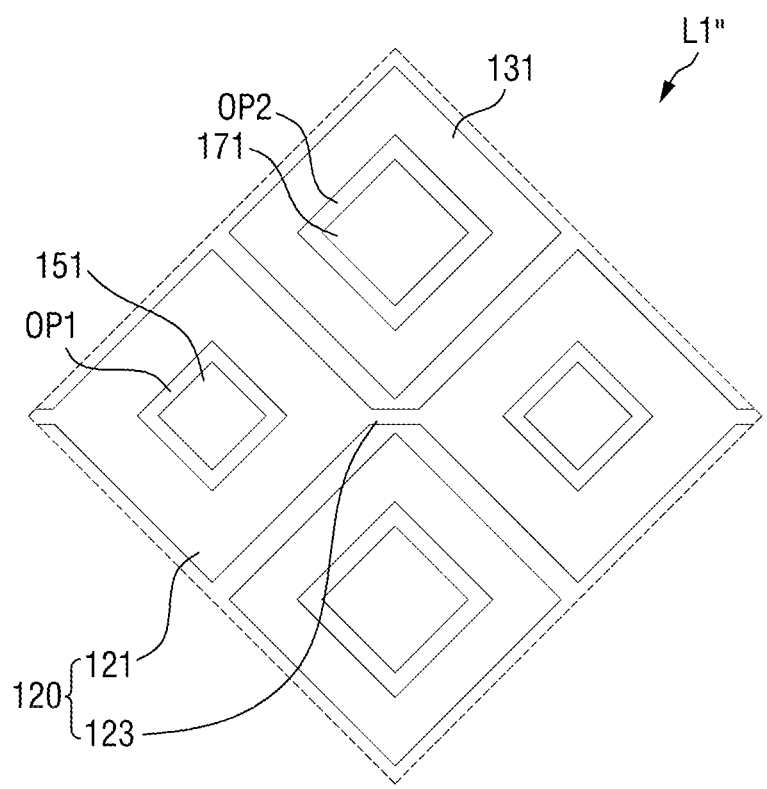
FIG. 68 illustrates an exemplary structure of a first layer of a sensing part of FIG. 67.
Figure 69:
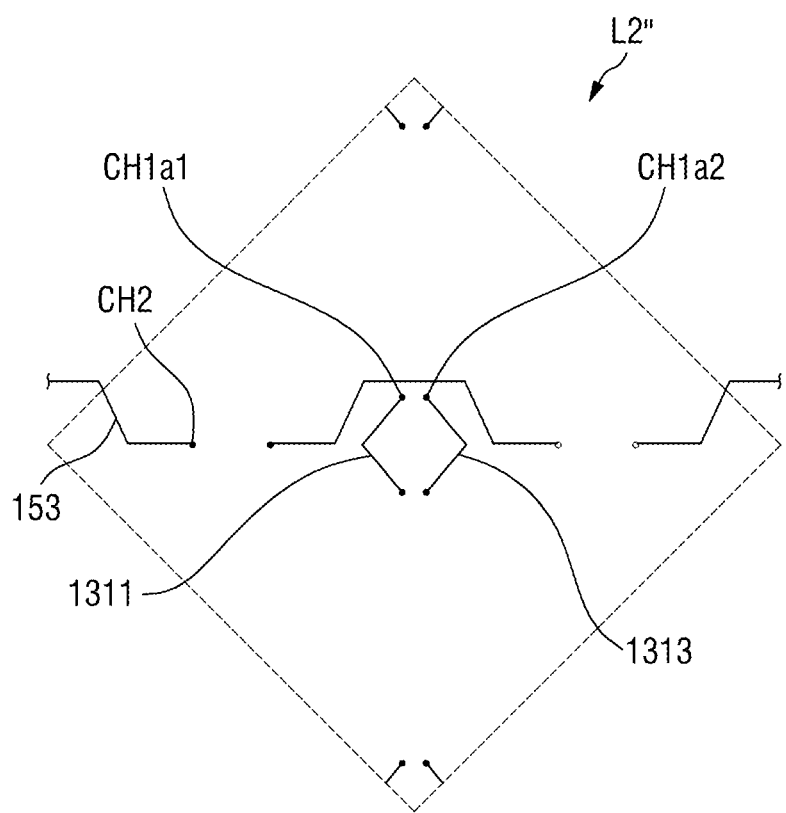
FIG. 69 illustrates an exemplary structure of a second layer of the sensing part of FIG. 67.
Figure 70:
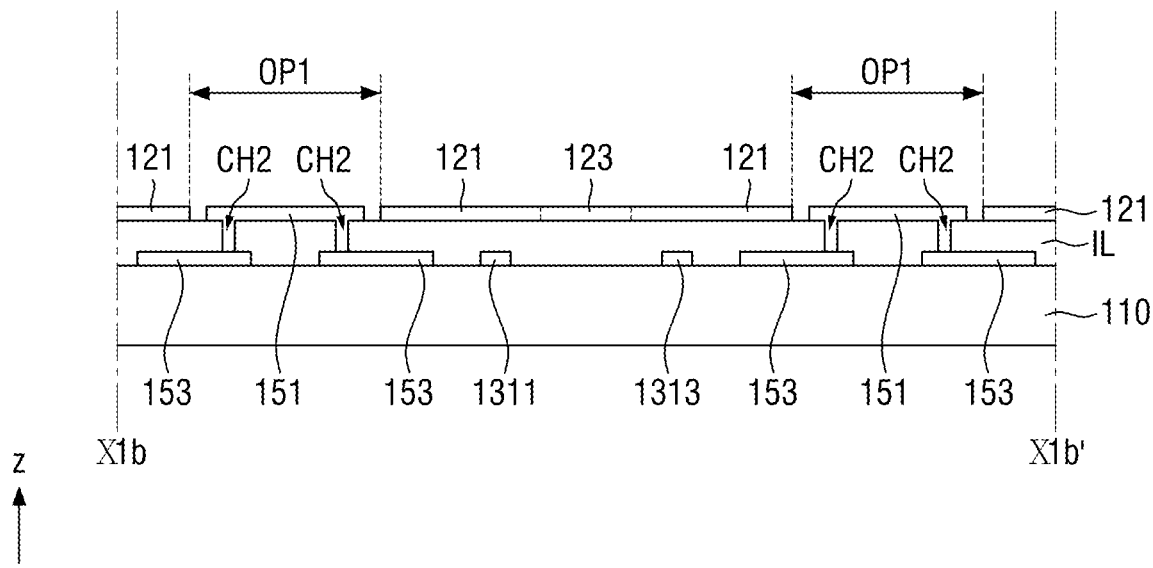
FIG. 70 is a cross-sectional view taken along X1b-X1b' of FIG. 67.
Figure 71:
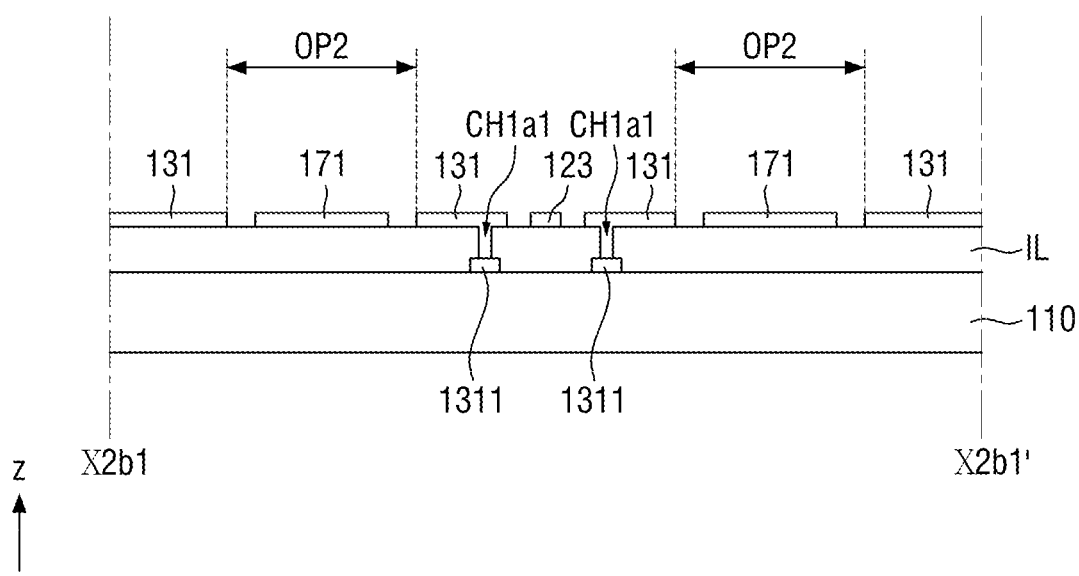
FIG. 71 is a cross-sectional view taken along X2b1-X2b1' of FIG. 67.
Figure 72:
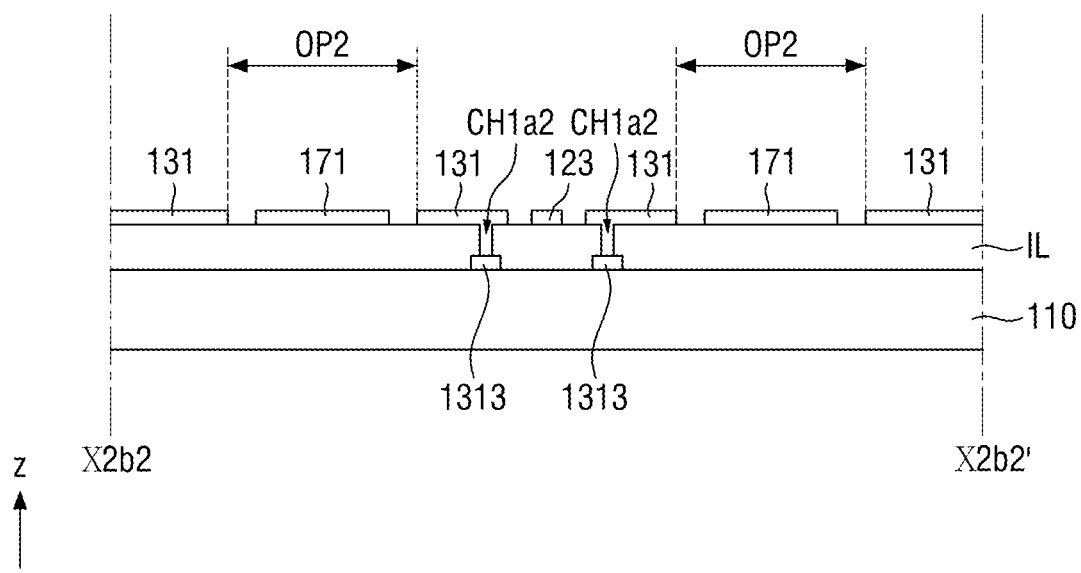
FIG. 72 is a cross-sectional view taken along X2b2-X2b2' of FIG. 67.

FIG. 67 illustrates a modified example of FIG. 62. FIG. 68 illustrates an exemplary structure of a first layer L1" of a sensing part of FIG. 67. FIG. 69 illustrates an exemplary structure of a second layer L2" of the sensing part of FIG. 67. FIG. 70 is a cross-sectional view taken along X1b-X1b' of FIG. 67. FIG. 71 is a cross-sectional view taken along X2b1-X2b1' of FIG. 67. FIG. 72 is a cross-sectional view taken along X2b2-X2b2' of FIG. 67.

Referring to FIGS. 67 through 72, a second electrode member 130' may include second electrodes 131 and two second connection portions 1311 and 1313, in comparison to FIG. 62. One of the two second connection portions 1311 and 1313 is referred to as a first sub-connection portion 1311, and the other is referred to as a second sub-connection portion 1313. Each of the first sub-connection portion 1311 and the second sub-connection portion 1313 may electrically connect the second electrodes 131 neighboring each other along the second direction y.

A first connection portion 123 of a first electrode member 120 may be located in the same first layer L1" as first electrodes 121 and the second electrodes 131 and may be made of the same material as one of the first electrodes 121 and the second electrodes 131.

The first sub-connection portion 1311 and the second sub-connection portion 1313 may be located in the same second layer L2" as a first connection line 153 and may be made of the same material as the first connection line 153.

The first sub-connection portion 1311 and the second electrodes 131 may be connected to each other through contact holes CH1a1 that are formed in an insulating layer IL. The second sub-connection portion 1313 and the second electrodes 131 may be connected to each other through contact holes CH1a2 that are formed in the insulating layer IL.

In the current embodiment, neighboring second electrodes 131 are connected to each other by two or more connection portions. Therefore, even if any one of the first sub-connection portion 1311 and the second sub-connection portion 1313 is broken, the electrical connection between the neighboring second electrodes 131 can be maintained by the other one. This can improve connection reliability between the neighboring second electrodes 131.

Other components are the same as those described above with reference to FIGS. 4 through 10 and 62 through 66, and thus their description is omitted.

Figure 73:
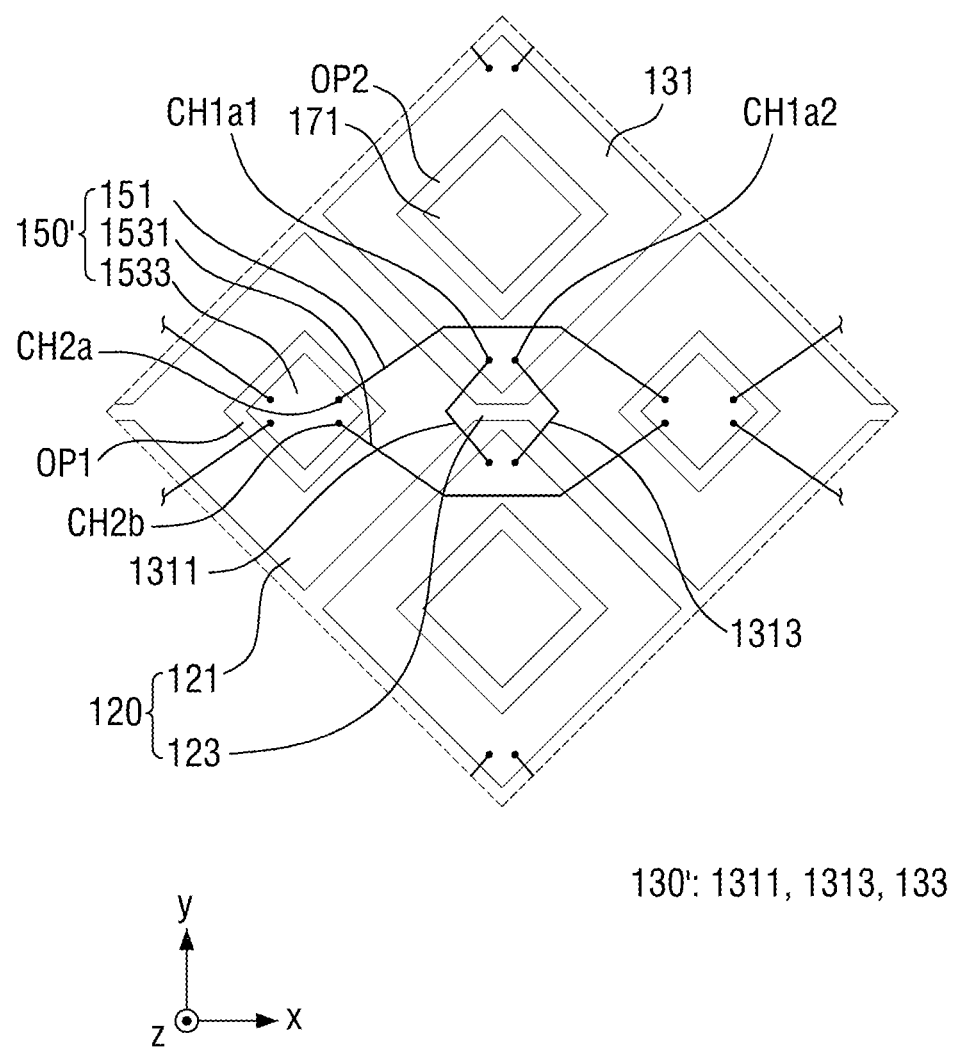
FIG. 73 illustrates a modified example of FIG. 67.
Figure 74:
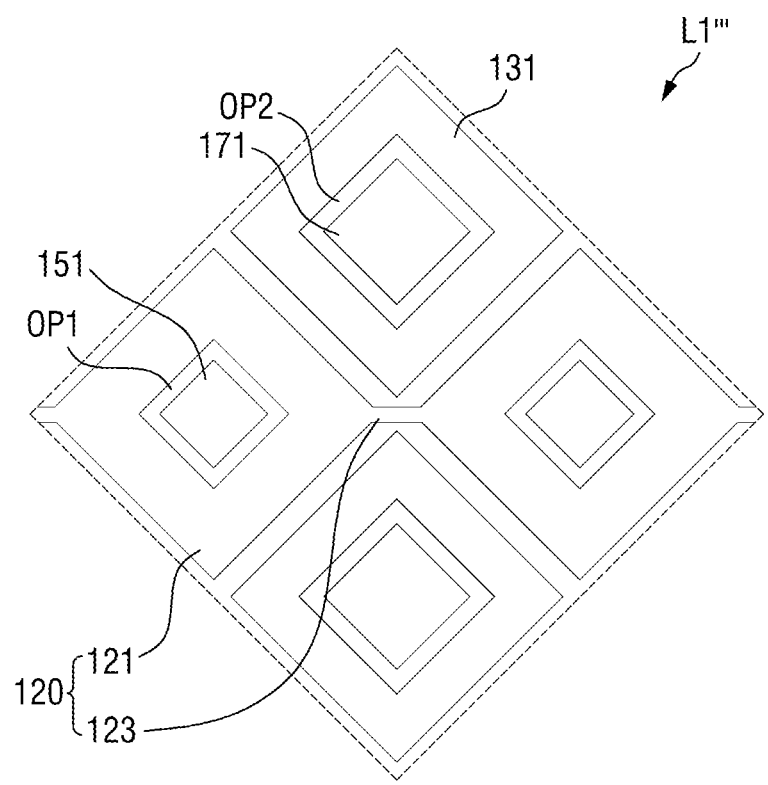
FIG. 74 illustrates an exemplary structure of a first layer of a sensing part of FIG. 73.
Figure 75:
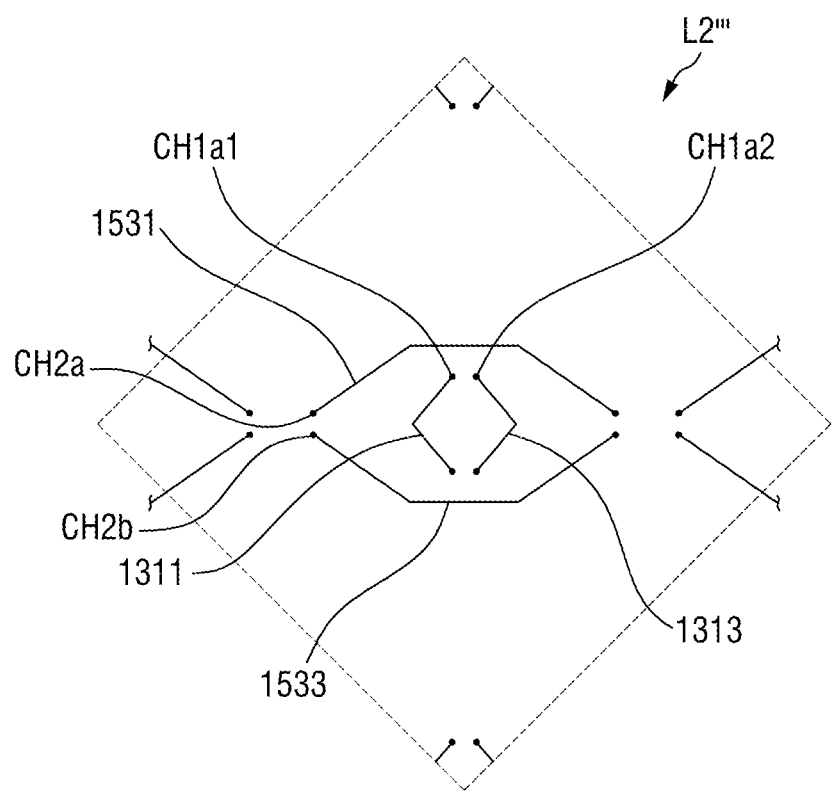
FIG. 75 illustrates an exemplary structure of a second layer of the sensing part of FIG. 73.

FIG. 73 illustrates a modified example of FIG. 67. FIG. 74 illustrates an exemplary structure of a first layer L1''' of a sensing part of FIG. 73. FIG. 75 illustrates an exemplary structure of a second layer L2''' of the sensing part of FIG. 73.

Referring to FIGS. 73 through 75, a first conductive member 150' may include first conductive patterns 151 and two first connection lines 1531 and 1533, in comparison to FIGS. 67 through 72. One of the two first connection lines 1531 and 1533 will be referred to as a first sub-connection line 1531, and the other will be referred to as a second sub-connection line 1533. Each of the first sub-connection line 1531 and the second sub-connection line 1533 may electrically connect the first conductive patterns 151 neighboring each other along the first direction x.

A first connection portion 123 of a first electrode member 120 may be located in the same first layer L1''' as first electrodes 121 and second electrodes 131 and may be made of the same material as one of the first electrodes 121 and the second electrodes 131.

A first sub-connection portion 1311, a second sub-connection portion 1313, the first sub-connection line 1531, and the second sub-connection line 1533 may be located in the same second layer L2''' and may be made of the same material.

The first sub-connection line 1531 and the first conductive patterns 151 may be connected to each other through contact holes CH2a that are formed in an insulating layer IL. In addition, the second sub-connection line 1533 and the first conductive patterns 151 may be connected to each other through contact holes CH2b that are formed in the insulating layer IL.

In the current embodiment, neighboring first conductive patterns 151 are connected to each other by two or more connection portions. Therefore, even if any one of the first sub-connection line 1531 and the second sub-connection line 1533 is broken, the electrical connection between the neighboring first conductive patterns 151 can be maintained by the other one. This can improve connection reliability between the neighboring first conductive patterns 151.

Other components are the same as those described above with reference to FIGS. 4 through 10 and 62 through 72, and thus their description is omitted.

In some embodiments, the structure of the touch sensor TSM, in particular, the position of the first conductive patterns 151 and the position of the first connection lines 153 may be variously changed, and the position of the conductors 171 may also be variously changed.

Modified examples of the position of the first conductive patterns 151, the position of the first connection lines 153, and the position of the conductors 171 will now be described with respect to the embodiment of FIGS. 4 through 10. In the modified examples described above with reference to FIGS. 62 through 75, the position of the first conductive patterns 151, the position of the first connection lines 153, and the position of the conductors 171 can be changed similarly to the following description. In addition, the position of the first sub-connection line 1531 and the position of the second sub-connection line 1533 described above with reference to FIGS. 73 through 75 can be changed similarly to the position of the first connection lines 153 described below.

Figure 11:
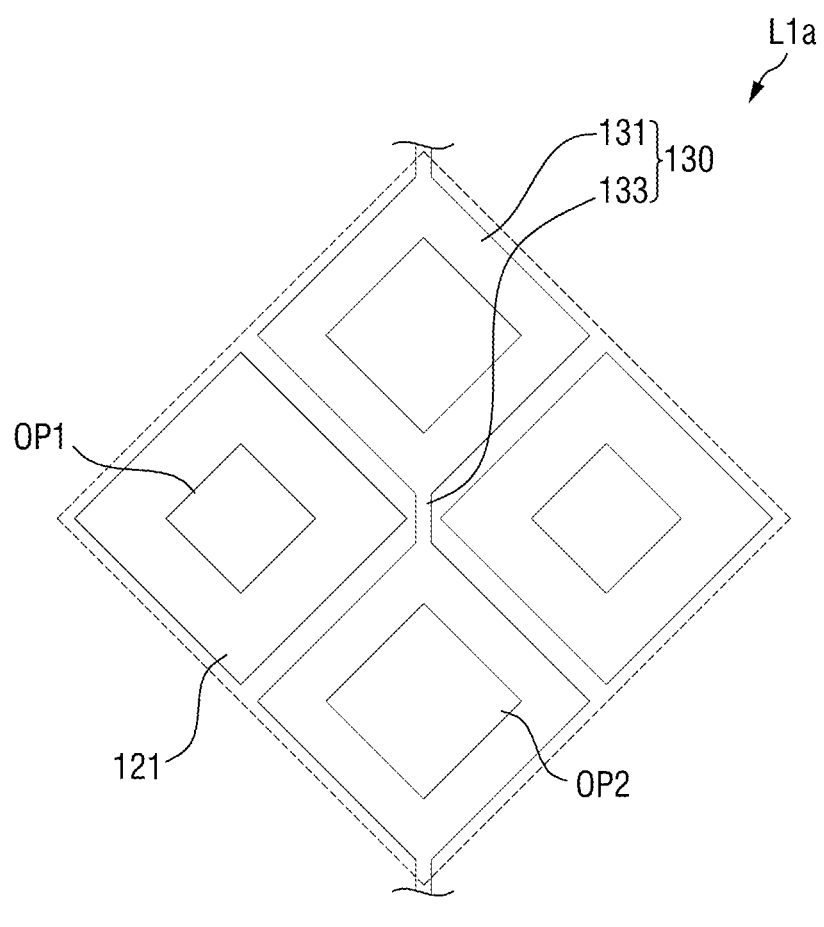
FIG. 11 illustrates an exemplary structure of a first layer according to a modified example of FIG. 5.
Figure 12:
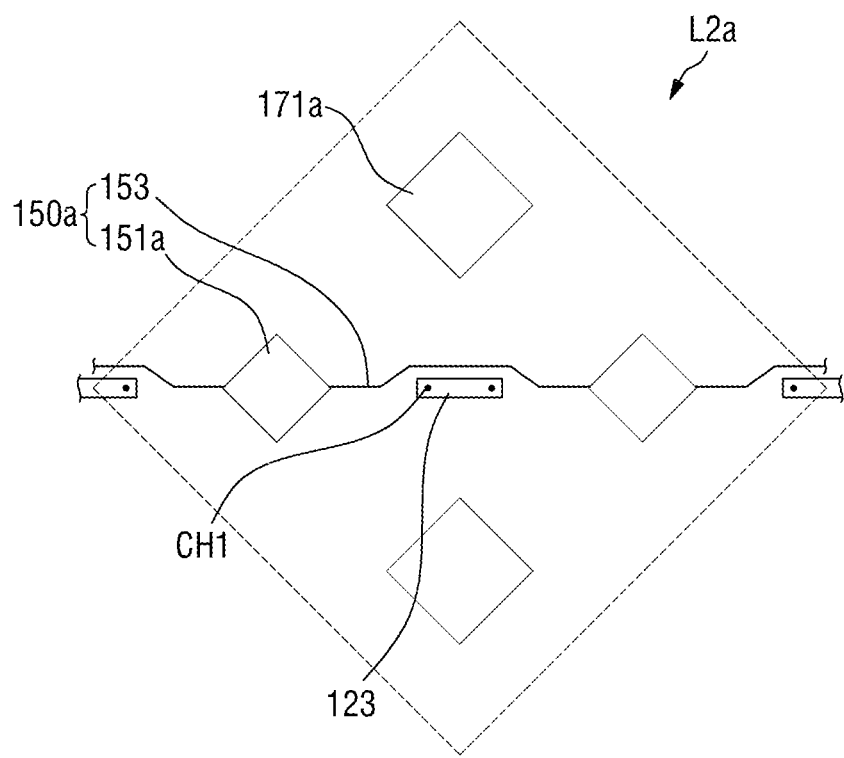
FIG. 12 illustrates an exemplary structure of a second layer according to a modified example of FIG. 8.
Figure 13:
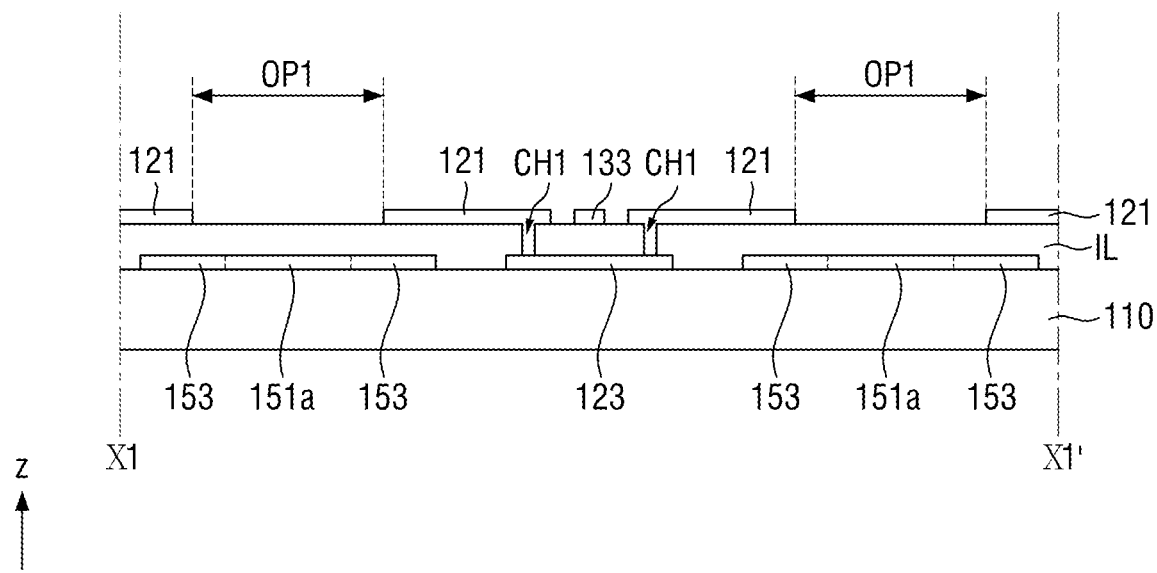
FIG. 13 is a cross-sectional view illustrating a modified example of FIG. 9.
Figure 14:
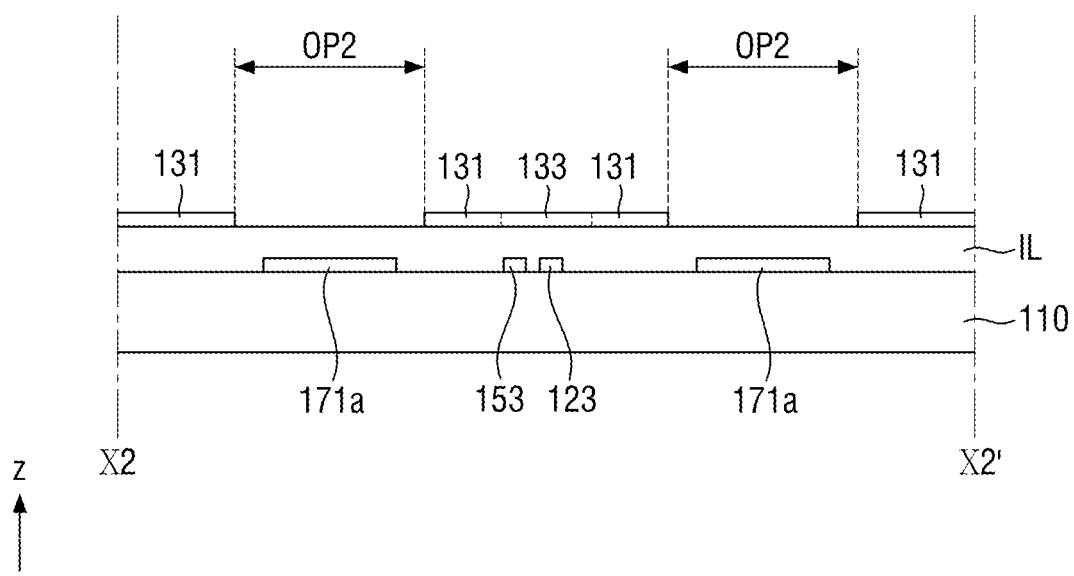
FIG. 14 is a cross-sectional view illustrating a modified example of FIG. 10.

FIG. 11 illustrates an exemplary structure of a first layer L1a according to a modified example of FIG. 5. FIG. 12 illustrates an exemplary structure of a second layer L2a according to a modified example of FIG. 8. FIG. 13 is a cross-sectional view illustrating a modified example of FIG. 9. FIG. 14 is a cross-sectional view illustrating a modified example of FIG. 10.

Referring to FIGS. 11 through 14, in comparison to FIGS. 5, 8, 9, and 10, a first conductive member 150a may include first lower conductive patterns 151a and a first connection line 153.

The first lower conductive patterns 151a may be located in a different layer from first electrodes 121 and second electrodes 131. For example, the first electrodes 121 and the second electrodes 131 may be located in the first layer L1a. In addition, the first lower conductive patterns 151a of the first conductive member 150a may be located in the same second layer L2a as a first connection portion 123 and the first connection line 153 of the first conductive member 150a and may be made of the same material as one of the first connection portion 123 and the first connection line 153. The first lower conductive patterns 151a may be connected to the first connection line 153 in the second layer L2a.

In the current modified example, since the first lower conductive patterns 151a and the first connection line 153 of the first conductive member 150a are located in the same second layer L2a, the second contact holes CH2 that are formed in the insulating layer IL illustrated in FIGS. 8 and 9 may be omitted.

In some embodiments, the conductors 171 may be omitted, and lower conductors 171a may be located in second openings OP2, in comparison to FIGS. 5, 8, 9, and 10. The lower conductors 171a may be located in the same second layer L2a as the first connection portion 123 and the first connection line 153 of the first conductive member 150a and may be made of the same material as one of the first connection portion 123 and the first connection line 153.

Figure 15:
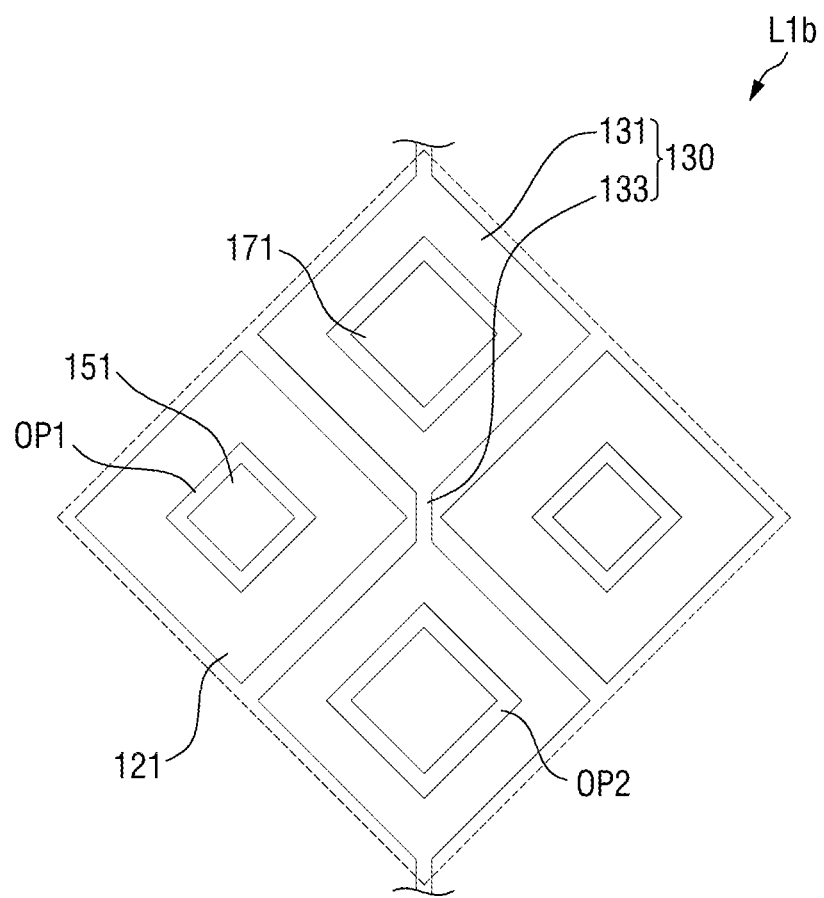
FIG. 15 illustrates an exemplary structure of a first layer according to a modified example of FIG. 5.
Figure 16:
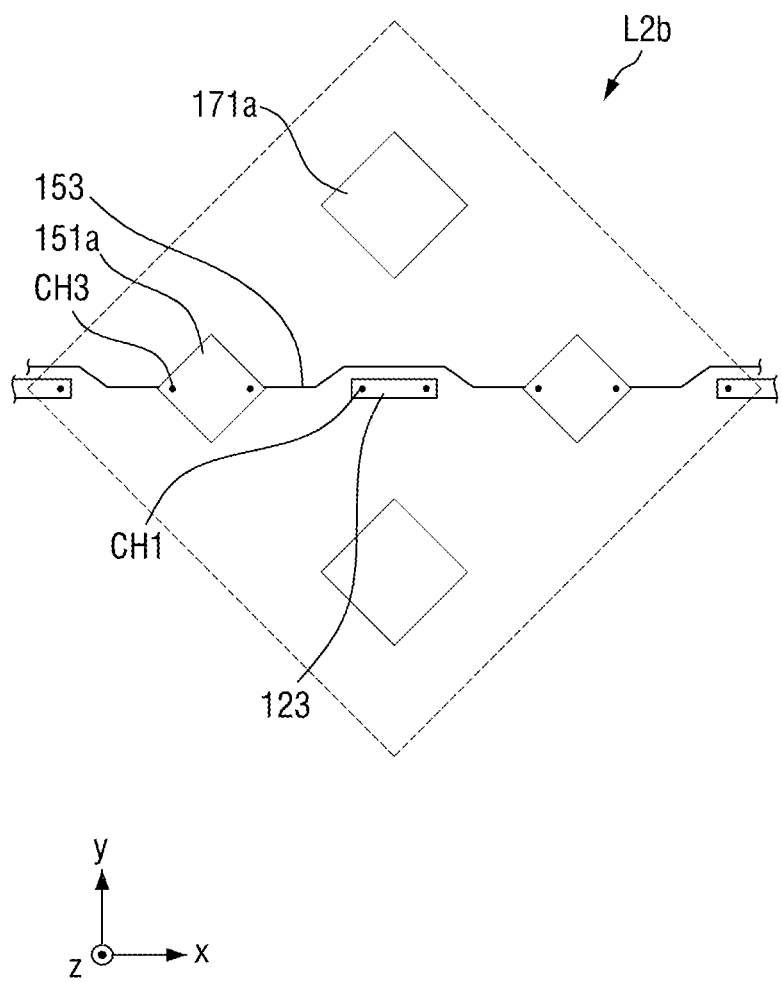
FIG. 16 illustrates an exemplary structure of a second layer according to a modified example of FIG. 8.
Figure 17:
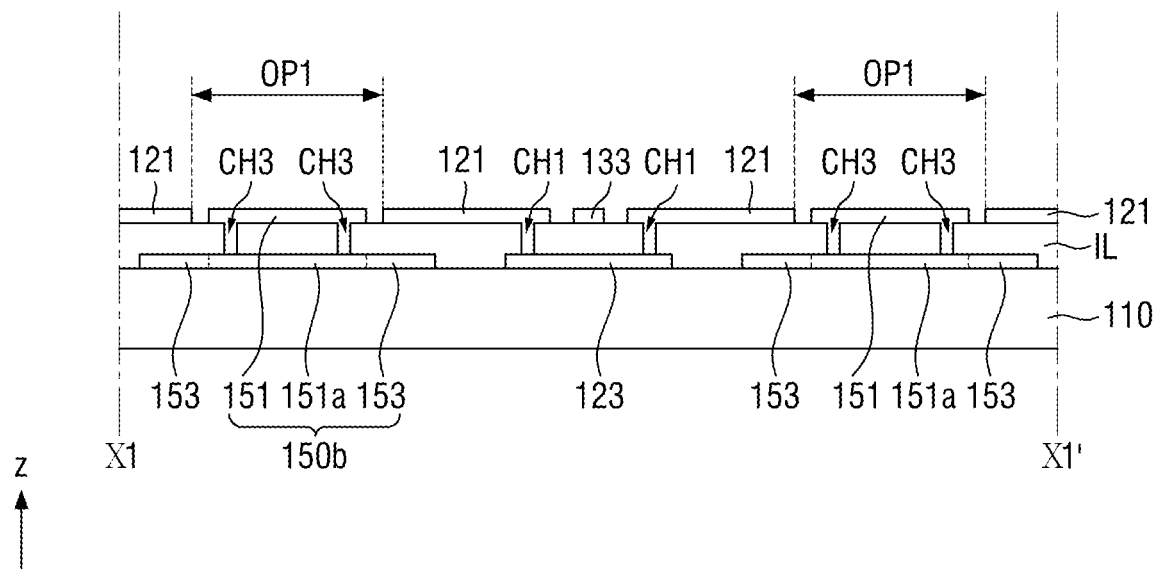
FIG. 17 is a cross-sectional view illustrating a modified example of FIG. 9.
Figure 18:
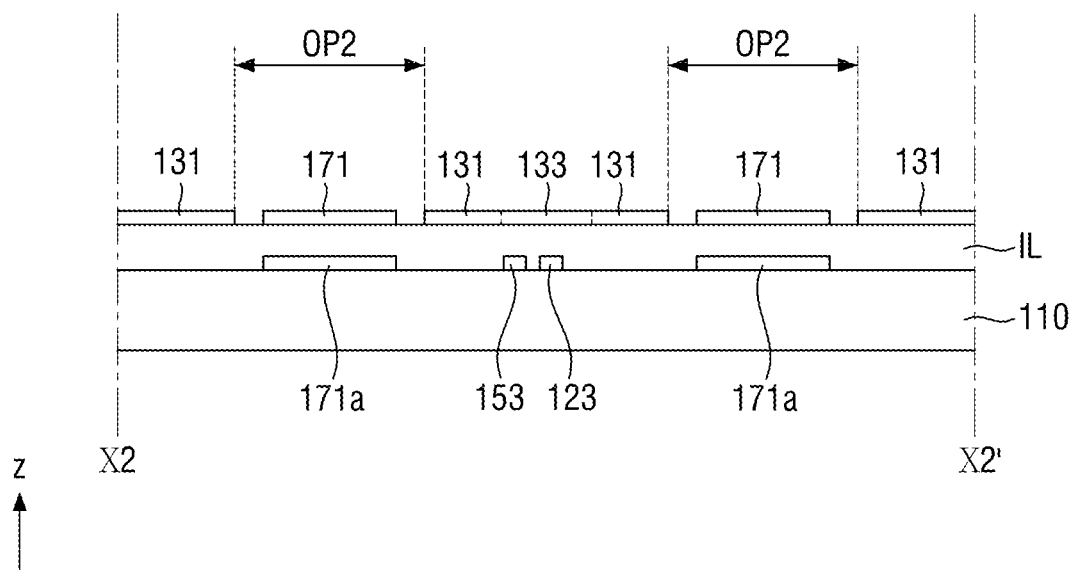
FIG. 18 is a cross-sectional view illustrating a modified example of FIG. 10.

FIG. 15 illustrates an exemplary structure of a first layer L1b according to a modified example of FIG. 5. FIG. 16 illustrates an exemplary structure of a second layer L2b according to a modified example of FIG. 8. FIG. 17 is a cross-sectional view illustrating a modified example of FIG. 9. FIG. 18 is a cross-sectional view illustrating a modified example of FIG. 10.

Referring to FIGS. 15 through 18, in comparison to FIGS. 5, 8, 9, and 10, a first conductive member 150b may include first conductive patterns 151, a first connection line 153, and first lower conductive patterns 151a.

The first conductive patterns 151 may be located in the same first layer L1b as first electrodes 121 and second electrodes 131. In addition, the first lower conductive patterns 151a and the first connection line 153 of the first conductive member 150b may be located in the same second layer L2b as a first connection portion 123 and may be made of the same material as the first connection portion 123. The first lower conductive patterns 151a may be connected to the first connection line 153 in the second layer L2b.

In some embodiments, the first lower conductive patterns 151a and the first conductive patterns 151 may be connected to each other through third contact holes CH3 that are formed in an insulating layer IL.

In some embodiments, lower conductors 171a may be further located in second openings OP2, in comparison to FIGS. 5, 8, 9, and 10. The lower conductors 171a may be located in the same second layer L2b as the first connection portion 123 and the first connection line 153, and may be made of the same material as one of the first connection portion 123 and the first connection line 153. In some embodiments, the lower conductors 171a may overlap conductors 171 in a plan view.

According to an embodiment, the base layer 110 that serves as the base of the sensing part 100 may be a thin-film encapsulation layer of an organic light emitting display panel. In this case, the base layer 110 may be implemented as a multilayer including at least one organic layer and at least one inorganic layer or may be implemented as a single layer including a combination of organic and inorganic materials. For example, the base layer 110 may be a multilayer including at least two inorganic layers and at least one organic layer interposed between the inorganic layers. In a display device in which the base layer 110 is implemented as a thin-film encapsulation layer of an organic light emitting display panel, electrodes constituting the sensing part 100 and components constituting the display panel 100 may be formed on different surfaces of the base layer 110.

Figure 19:
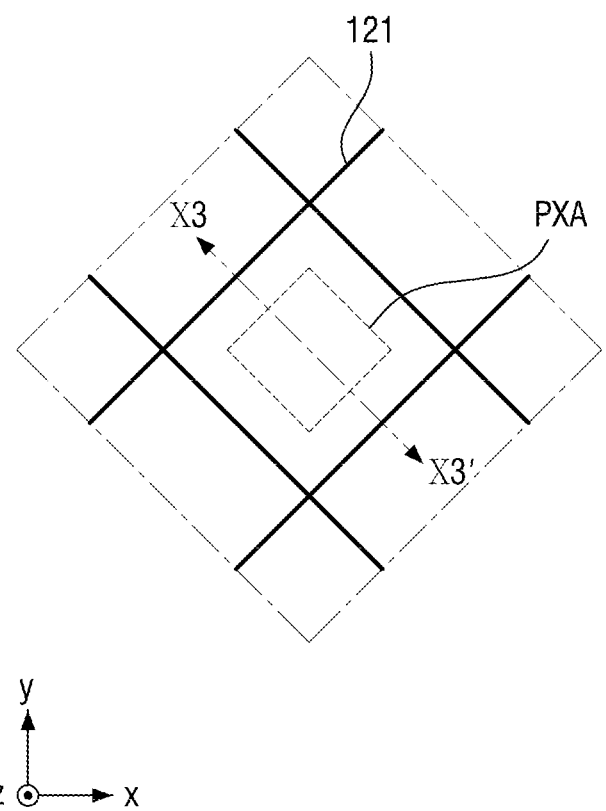
FIG. 19 is an enlarged plan view of a portion Q3 of FIG. 5.
Figure 20:
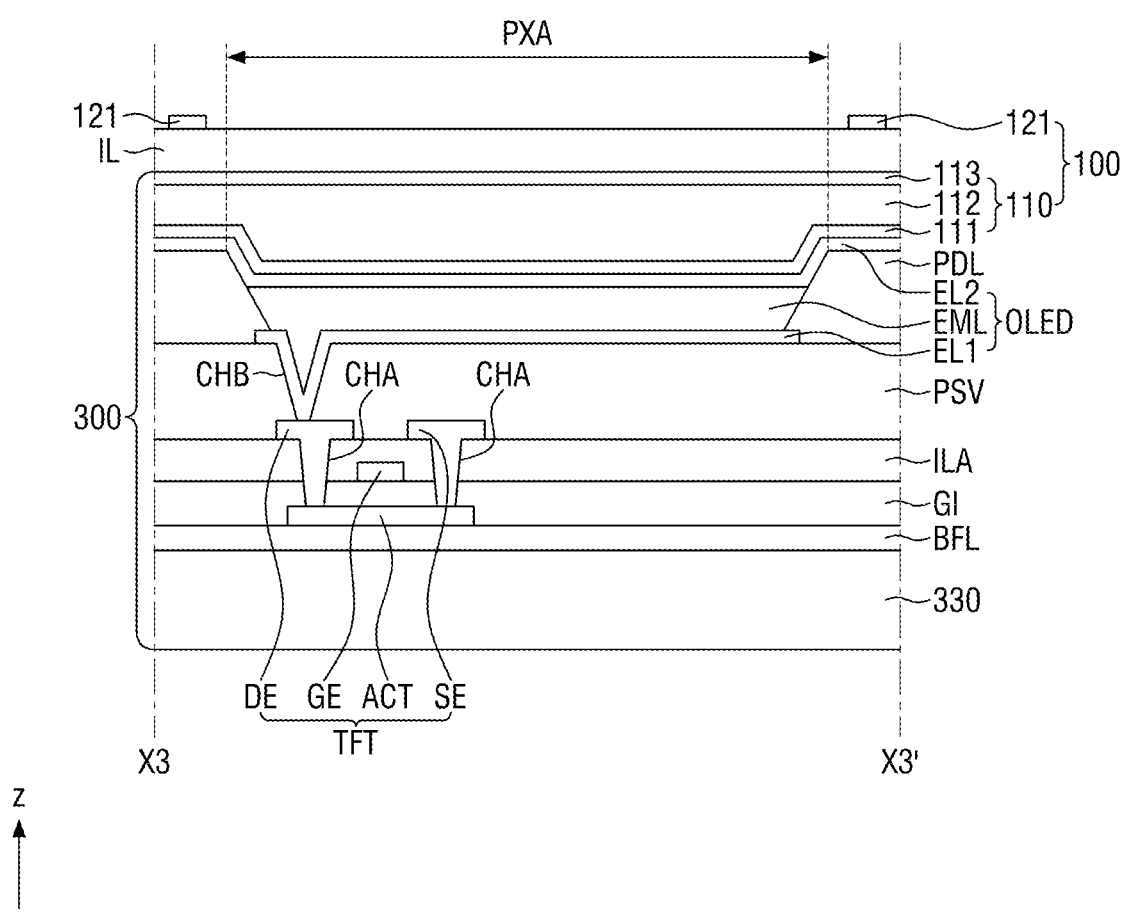
FIG. 20 is a cross-sectional view taken along X3-X3' of FIG. 19.

FIG. 19 is an enlarged plan view of a portion Q3 of FIG. 5. FIG. 20 is a cross-sectional view of the sensing part 100 and the display panel 300 taken along X3-X3' of FIG. 19.

Referring to FIGS. 19 and 20, the sensing part 100 may include a thin-film encapsulation layer of the display panel 300 (e.g., an organic light emitting display panel) as the base layer 110. That is, the display panel 300 and the sensing part 100 may be formed integrally with each other. The same reference numeral will hereinafter be given to the base layer 110 and the thin-film encapsulation layer indicating that the base layer 110 corresponds to the thin-film encapsulation layer of the display panel 300. For convenience, only a light emitting element OLED (e.g., an organic light emitting diode (OLED)) and one thin-film transistor TFT connected to the light emitting element OLED among elements provided in each pixel of the display panel 300 are illustrated in FIG. 20.

The display panel 300 includes a base substrate 330, the light emitting element OLED provided on a surface of the base substrate 330, and the thin-film encapsulation layer 110 provided on the light emitting element OLED and covering at least a portion of the light emitting element OLED. In addition, according to an embodiment, the display panel 300 may further include at least one thin-film transistor TFT connected to the light emitting element OLED. The thin-film transistor TFT may be located between the base substrate 330 and the light emitting element OLED.

The display panel 300 may further include at least one power supply line, a signal line, and/or a capacitor that are not illustrated in the drawings.

According to an embodiment, the base substrate 330 may be a rigid substrate or a flexible substrate, and the material of the base substrate 330 is not particularly limited. For example, the base substrate 330 may be a thin-film substrate having flexible characteristics.

A buffer layer BFL is provided on a surface of the base substrate 330. The buffer layer BFL may prevent diffusion of impurities through the base substrate 330 and improve the flatness of the base substrate 330. The buffer layer BFL may be provided as a single layer, but may also be provided as a multilayer including at least two layers. The buffer layer BFL may be an inorganic insulating layer made of an inorganic material. For example, the buffer layer BFL may be made of silicon nitride, silicon oxide, or silicon oxynitride.

The thin-film transistor TFT is provided on the buffer layer BFL. The thin-film transistor TFT includes an active layer ACT, a gate electrode GE, a source electrode SE, and a drain electrode DE. According to an embodiment, the active layer ACT may be provided on the buffer layer BFL and may be made of a semiconductor material. For example, the active layer ACT may be a semiconductor pattern made of polysilicon, amorphous silicon, or an oxide semiconductor, one or more regions (e.g., regions overlapping the gate electrode GE and the drain electrode DE) of the active layer ACT may not be doped with an impurity, and the other region of the active layer ACT may be doped with an impurity.

Agate insulating layer GI may be provided on the active layer ACT, and the gate electrode GE may be provided on the gate insulating layer GI. In addition, an interlayer insulating film ILA may be provided on the gate electrode GE, and the source electrode SE and the drain electrode DE may be provided on the interlayer insulating film ILA. The source electrode SE and the drain electrode DE may contact and be electrically connected to the active layer ACT respectively through contact holes CHA that penetrate through the gate insulating layer GI and the interlayer insulating film ILA.

According to an embodiment, a passivation layer PSV is provided on the source electrode SE, the drain electrode DE, and the interlayer insulating film ILA. The passivation layer PSV may cover the thin-film transistor TFT.

The light emitting element OLED is provided on the passivation layer PSV. The light emitting element OLED may include a first electrode EL1, a second electrode EL2, and a light emitting layer EML interposed between the first electrode EL1 and the second electrode EL2. According to an embodiment, the first electrode EL1 of the light emitting element OLED may be an anode. The first electrode EL1 of the light emitting element OLED may contact and be electrically connected to an electrode (e.g., the drain electrode DE) of the thin-film transistor TFT through a contact hole CHB that penetrates through the passivation layer PSV.

A pixel defining layer PDL for defining a light emitting area PXA of each pixel is provided on the surface of the base substrate 330 on which the first electrode EL1 of the light emitting element OLED, etc. are formed. The pixel defining layer PDL may expose at least a portion of an upper surface of the first electrode EL1 and protrude from the base substrate 330 along the periphery of each pixel area.

The light emitting layer EML is provided in the light emitting area PXA defined by the pixel defining layer PDL. For example, the light emitting layer EML may be disposed on the exposed portion of the upper surface of the first electrode EL1. According to an embodiment, the light emitting layer EML may have a multilayer thin-film structure including at least a light generation layer. For example, the light emitting layer EML may include a hole injection layer, a hole transport layer, a light generation layer, a hole blocking layer (HBL), an electron transport layer (ETL), and an electron injection layer (EIL). According to an embodiment, the color of light generated by the light emitting layer EML may be one of red, green, and blue. Alternatively, the color of light generated by the light emitting layer EML may be one of magenta, cyan, and yellow.

The second electrode EL2 of the light emitting element OLED may be disposed on the light emitting layer EML. The second electrode EL2 of the light emitting element OLED may be a cathode.

The thin-film encapsulation layer 110 may be provided on the second electrode EL2 of the light emitting element OLED to cover the second electrode EL2 of the light emitting element OLED. The thin-film encapsulation layer 110 may seal the light emitting element OLED. The thin-film encapsulation layer 110 may include at least one inorganic layer (hereinafter, referred to as an encapsulating inorganic layer). The thin-film encapsulation layer 110 may further include at least one organic layer (hereinafter, referred to as an encapsulating organic layer). The encapsulating inorganic layer protects the light emitting element OLED from moisture/oxygen, and the encapsulating organic layer protects the light emitting element OLED from foreign matters such as dust particles. When the light emitting element OLED is sealed by the thin-film encapsulation layer 110, the thickness of the display device 1 can be reduced, and impart flexible characteristics.

The thin-film encapsulation layer 110 may have a multilayer structure or a single-layer structure. For example, the thin-film encapsulation layer 110 may include a first encapsulating inorganic layer 111, an encapsulating organic layer 112, and a second encapsulating inorganic layer 113 that are sequentially stacked on the second electrode EL2.

In some embodiments, each of the first encapsulating inorganic layer 111 and the second encapsulating inorganic layer 113 may be made of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), or lithium fluoride.

In some embodiments, the encapsulating organic layer 112 may be made of acrylic resin, methacrylic resin, polyisoprene, vinyl resin, epoxy resin, urethane resin, cellulose resin, or perylene resin.

It is noted that the structure of the thin-film encapsulation layer 110 is not limited to the above example, and the stacked structure of the thin-film encapsulation layer 110 can be variously changed.

The components of the second layer L2 of the touch sensor TSM described above may be disposed on the thin-film encapsulation layer 110. The insulating layer IL may be located on the second layer L2, and the first layer L1 of the touch sensor TSM may be located on the insulating layer IL. In FIG. 20, the first electrodes 121 are illustrated as components of the first layer L1. The first electrodes 121 may have a mesh structure that is invisible to a user as described above and may be disposed not to overlap the light emitting areas PXA. In other words, a mesh hole overlapping the light emitting area PXA may be defined in each of the first electrodes 121 that has the mesh structure.

In the display device 1 according to the above-described embodiment, the display panel 300 may be implemented as an organic light emitting display panel having the thin-film encapsulation layer 110, and the components of the sensing part 100 may be disposed on the thin-film encapsulation layer 110.

A touch position detection operation of the touch sensor TSM will now be described by referring to FIGS. 21A, 21B, and 22.

Figure 21A:
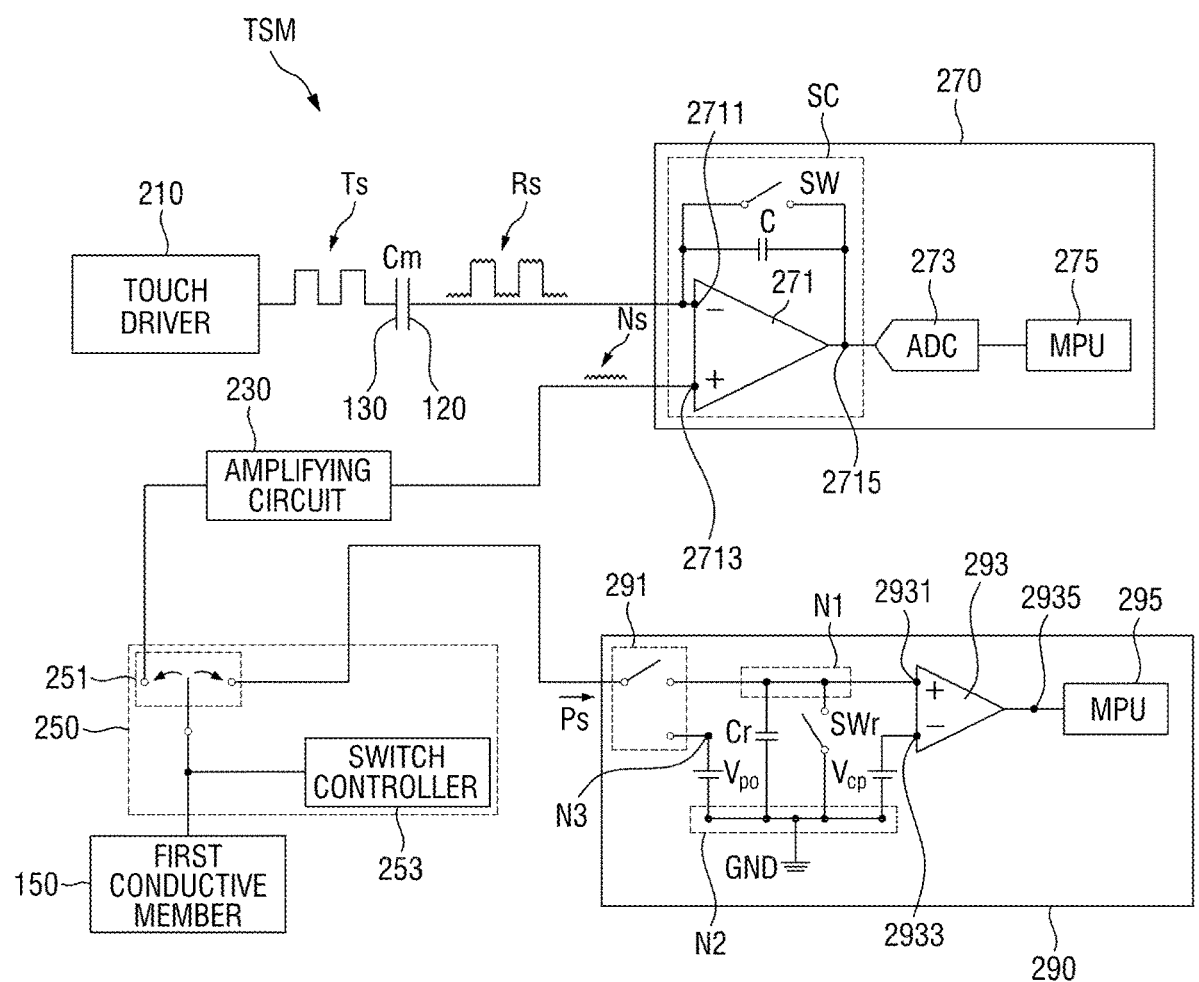
FIG. 21A is a diagram for explaining a touch position detection operation of the touch sensor according to an embodiment.

FIG. 21A is a diagram for explaining a touch position detection operation of the touch sensor TSM according to an embodiment. FIG. 21B is a diagram for explaining the operation of a switch circuit 250 illustrated in FIG. 21A. FIG. 22 specifically illustrates the connection relationship between the sensing part 100 and the touch controller 200 according to an embodiment.

Figure 21B:
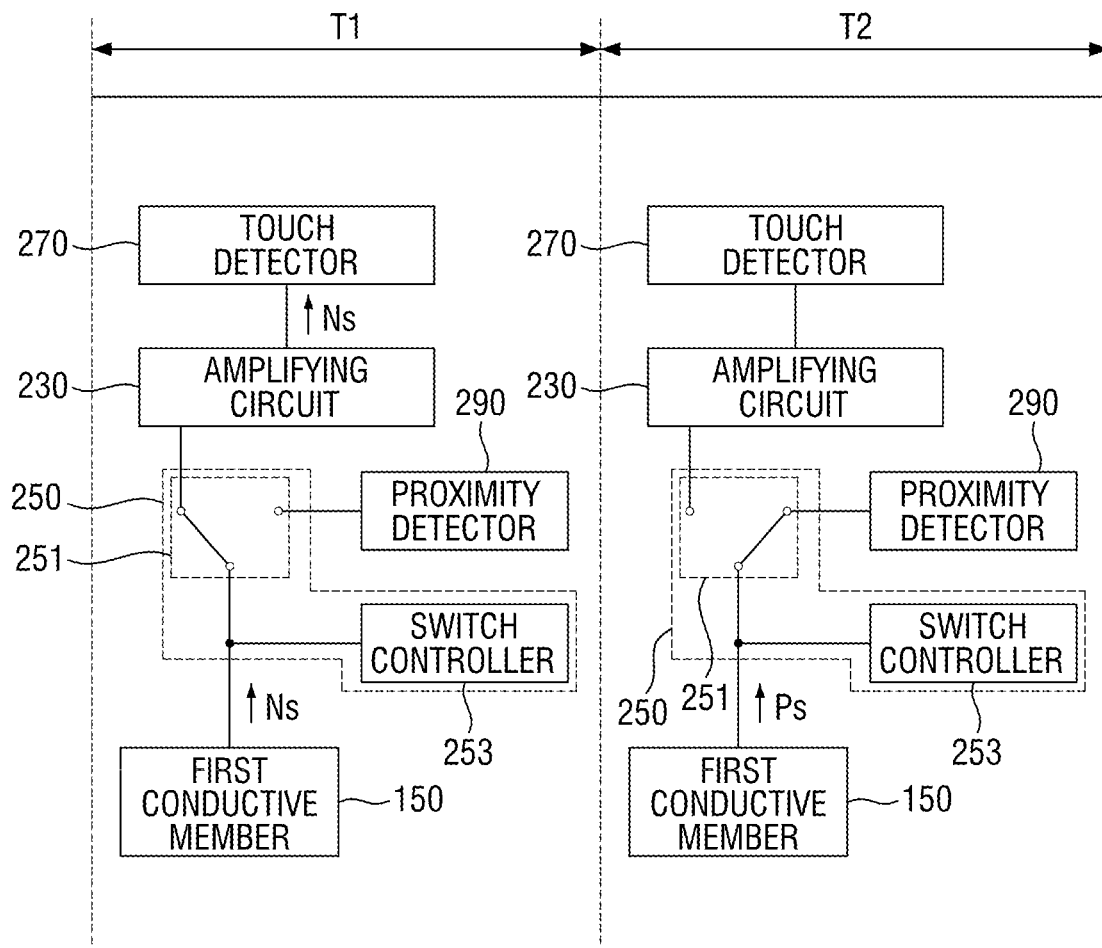
FIG. 21B is a diagram for explaining the operation of a switch circuit illustrated in FIG. 21A.
Figure 22:
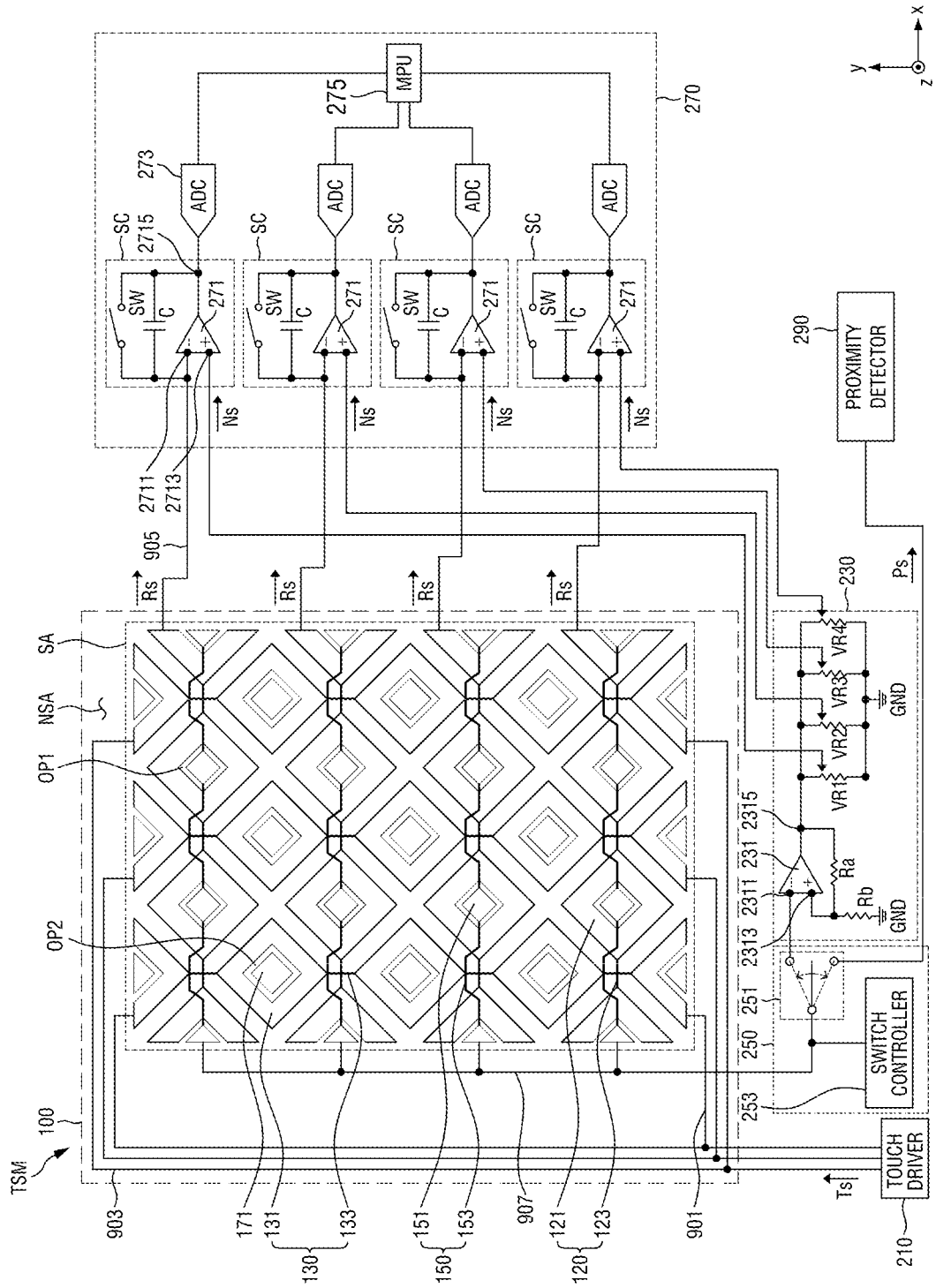
FIG. 22 specifically illustrates the connection relationship between the sensing part and the touch controller according to an embodiment.

Referring to FIGS. 21A, 21B and 22, in some embodiments, the touch controller 200 may perform different operations during a first period T1 and a second period T2. For example, the touch controller 200 may perform a touch sensing operation based on a change in mutual capacitance between each first electrode member 120 and each second electrode member 130 during the first period T1 and may perform a proximity sensing operation based on a change in the self-capacitance of each first conductive member 150 during the second period T2 that is different from the first period Ti. The operation of each component of the touch controller 200 will now be described in more detail.

The touch driver 210 may provide driving signal Ts to the second electrode members 130 through the first wirings 901 and the second wirings 903. In some embodiments, the driving signal Ts may be sequentially provided to each of the second electrode members 130. In some embodiments, the touch driver 210 may provide the driving signal Ts to the second electrode members 130 only during the first period T1. During the second period T2, the touch driver 210 may not provide the driving signal Ts or may provide a signal that is different from the driving signal Ts.

The touch detector 270 may receive sensing signal Rs from each of the first electrode members 120 through the third wirings 905. In some embodiments, the sensing signal Rs may include about a signal that indicates a change in mutual capacitance between a particular first electrode member 120 and its corresponding second electrode member 130 as described above. When the driving signal Ts is provided to each of the second electrode members 130, mutual capacitance Cm is formed between each second electrode member 130 and each first electrode member 120. When a touch event such as a touch input occurs, the mutual capacitance Cm may change. Each of the first electrode members 120 may output the sensing signal Rs corresponding to the driving signal Ts, and the sensing signal Rs that is output from each of the first electrode members 120 may be input to the touch detector 270. In some embodiments, the sensing signal Rs may include about a signal that indicates the change in the mutual capacitance Cm.

In some embodiments, the touch detector 270 may include a plurality of sensing channels SC electrically connected to the first electrode members 120, respectively. In addition, the touch detector 270 may include at least one ADC 273 connected to each of the sensing channels SC and a processor 275. In the following description, the sensing channel SC and the ADC 273 are described as separate components. However, in an embodiment, the ADC 273 may be included in each sensing channel SC.

The sensing channels SC may receive the sensing signals Rs from the first electrode members 120, amplify the received sensing signals Rs, and output an amplified sensing signals. In some embodiments, each of the sensing channels SC may include an analog front-end including at least one amplifier 271 such as an operational amplifier (OP amp).

The amplifier 271 may include a first input terminal 2711, a second input terminal 2713, and an output terminal 2715.

According to an embodiment, the first input terminals 2711 of the amplifiers 271 (e.g., inverting input terminals of OP amps) may be electrically connected to the first electrode members 120 by the third wirings 905, and the sensing signals Rs may be input to the first input terminals 2711, respectively.

In some embodiments, the second input terminals 2713 of the amplifiers 271 (e.g., non-inverting input terminals of the OP amps) may be electrically connected to the first conductive members 150 or the amplifying circuit 230 by the fourth wiring 907, and the noise sensing signals Ns may be provided to the second input terminals 2713 of the amplifiers 271, respectively. Accordingly, reference voltages of the amplifiers 271 may vary according to voltage variations of the first conductive members 150, respectively. That is, reference potentials of the amplifiers 271 may vary according to potentials (voltage levels) of the first conductive members 150, respectively.

During the first period T1 in which a touch is sensed based on a change in mutual capacitance, the potential of each of the first conductive members 150 may vary according to a noise signal introduced from, for example, the display panel 300 to the sensing part 100. For example, the potential of each of the first conductive members 150 during the first period T1 may vary according to a common mode noise introduced from, for example, the display panel 300 to the sensing part 100.

Therefore, if the first conductive members 150 are further disposed in the sensing area SA and the reference potentials of the amplifiers 271 are changed using the noise sensing signals Ns that are sensed by the first conductive members 150 during the first period T1, the common mode noise introduced to the sensing part 100 can be canceled (or eliminated). Specifically, the first electrode members 120 and the first conductive members 150 that are sensing electrode members may have ripples corresponding to each other in response to the common mode noise. In particular, since the first electrode members 120 and the first conductive members 150 extend in the same direction in the sensing area SA and are arranged at positions corresponding to each other, they may receive noise signals of the same or very similar shapes and/or amplitudes. In addition, the first electrode members 120 are electrically connected to the first input terminals 2711 of the amplifiers 271 by the third wirings 905, and the first conductive members 150 are electrically connected to the second input terminals 2713 of the amplifiers 271 by the fourth wirings 907 that are different from the third wirings 905. Therefore, noise components (ripples) included in the sensing signals Rs provided from the first electrode members 120 can be effectively canceled. Accordingly, signals output from the output terminals 2715 of the amplifiers 271 may be noise-canceled sensing signals.

In some embodiments, each of the sensing channels SC may further include a capacitor C and a reset switch SW that are connected in parallel to each other between the first input terminal 2711 and the output terminal 2715 of the amplifier 271.

In the above example, each of the amplifiers 271 is implemented as an inverting amplifier (i.e., the sensing signals Rs are subtracted from the noise sensing signals Ns). In an embodiment, each of the amplifiers 271 may also be implemented as a non-inverting amplifier.

The output terminals 2715 of the amplifiers 271 may be electrically connected to the ADCs 273.

Each of the ADCs 273 may convert an input analog signal into a digital signal. According to an embodiment, the number of the ADCs 273 may be equal to the number of the first electrode members 120 so that the ADCs 273 can correspond one-to-one to the first electrode members 120. Alternatively, in an embodiment, two or more of the first electrode members 120 may be configured to share a single ADC 273. In this case, a switch circuit (not shown) for selecting a sensing channel of the shared first electrode members may be further provided.

The processor 275 may process a converted signal (digital signal) received from each of the ADCs 273 and detect a touch input based on the signal processing result. For example, the processor 275 may comprehensively analyze a first sensing signal that is amplified by each amplifier 271 and converted by each ADC 273 to detect an occurrence of a touch input and a position of the touch input. According to an embodiment, the processor 275 may be implemented as a microprocessor (MPU). In this case, a memory required for driving the processor 275 may be additionally provided in the touch detector 270. However, the configuration of the processor 275 is not limited to this example. In another example, the processor 275 may be implemented as a microcontroller (MCU).

The touch controller 200 may further include the amplifying circuit 230 that is connected between the second input terminals 2713 of the sensing channels SC and the first conductive members 150. According to an embodiment, the amplifying circuit 230 may include at least one amplifier 231. According to an embodiment, the amplifier 231 may include a first input terminal 2311 that is commonly connected to the first conductive members 150 by the fourth wirings 907 and a second input terminal 2313 that is connected to an output terminal 2315 via at least one resistor Ra. According to an embodiment, the first input terminal 2311 and the second input terminal 2313 may be an inverting input terminal and a non-inverting input terminal, respectively. For reference, resistors Ra and Rb in FIG. 22 correspond to input and output impedances of the amplifier 231.

The amplifying circuit 230 may receive the noise sensing signals Ns from the first conductive members 150 via the fourth wirings 907, amplify the noise sensing signals Ns to a gain value of the amplifier 231, and output the amplified noise signals to the sensing channels SC, respectively. Here, the magnitudes of the noise sensing signals Ns to be input to the sensing channels SC can be easily adjusted by adjusting the gain value of the amplifying circuit 230. In some embodiments, the gain value of the amplifying circuit 230 may be adjusted such that noise components included in the sensing signals Rs that are output from the first electrode members 120 can be effectively canceled in the sensing channels SC.

In some embodiments, the amplifying circuit 230 may receive the noise sensing signals Ns from the first conductive members 150 during the first period T1 according to the operation of the switch circuit 250 and may not receive the noise sensing signals Ns from the first conductive members 150 during the second period T2.

According to an embodiment, the amplifying circuit 230 may further include a plurality of variable resistors VR1 through VR4 that are connected in parallel to one another between an output terminal 2315 of the amplifier 231 and a predetermined reference power source GND such as a ground power source. For example, the amplifying circuit 230 may include a plurality of resistors VR1 through VR4 corresponding to the number of the sensing channels SC.

According to an embodiment, the sensing channels SC may respectively be connected to different variable resistors VR1 through VR4 provided in the amplifying circuit 230. For example, the second input terminal 2713 of a first sensing channel SC located at the top in FIG. 22 may be connected to the first variable resistor VR1, and the second input terminal 2713 of a second sensing channel SC may be connected to the second variable resistor VR2. In addition, the second input terminal 2713 of a third sensing channel SC may be connected to the third variable resistor VR3, and the second input terminal 2713 of a fourth sensing channel SC may be connected to the fourth variable resistor VR4.

According to the above-described embodiment, the gain value of the noise sensing signal Ns that is input to the second input terminal 2713 of a sensing channel SC may be independently adjusted according to the magnitude of a noise component included in the sensing signal Rs that is input to the sensing channel SC. For example, the gain values of the noise sensing signals Ns that are input to the sensing channels SC connected to the first electrode members 120 may be differentially applied according to the positions of the first electrode members 120. Among the electrode rows formed by the first electrode members 120 (an electrode row located at the top in FIG. 22 is referred to as a first electrode row and an electrode row located at the bottom is referred to as a last electrode row), the magnitudes of the noise sensing signals Ns that are input to the sensing part 100 may vary from the first electrode row toward the last electrode row. For example, when the magnitudes of the noise sensing signals Ns that are input to the sensing part 100 gradually decrease from the first electrode row toward the last electrode row in the sensing area SA, the gain values of the noise sensing signals Ns may be gradually reduced from the first sensing channel SC that is connected to the first sensing electrode member 120 of the first electrode row toward the last sensing channel SC that is connected to the first electrode member 120 of the last electrode row. Accordingly, the gain values of the noise sensing signals Ns can be independently adjusted according to vertical positions (e.g., Y coordinates) of the first electrode members 120 in the sensing part 100 to more effectively cancel the noise components included in the sensing signals Rs.

In addition, according to the above-described embodiment, during a period in which the second electrode members 130 are sequentially driven, the gain values of the noise sensing signals Ns may also be independently adjusted in units of sub-periods during which each of the second electrode members 130 is driven by adjusting resistance values of the variable resistors VR1 through VR4 in units of sub-periods. Accordingly, a difference in the magnitude of noise between horizontal positions (e.g., X coordinates) in the sensing part 100 can be compensated for. Therefore, according to the above-described embodiment, the noise components included in the sensing signals Rs can be more accurately and effectively canceled.

The switch circuit 250 may be connected to the first conductive members 150, the amplifying circuit 230, and the proximity detector 290. The switch circuit 250 may include a switch 251 and a switch controller 253.

The switch 251 may connect the first conductive members 150 to either the amplifying circuit 230 or the proximity detector 290. The switch controller 253 may control the operation of the switch 251 according to an operational mode.

In some embodiments, the switch 251 may be controlled by the switch controller 253 to connect the first conductive members 150 to the amplifying circuit 230 during the first period T1. As described above, the first period T1 may be a period during which the touch detector 270 detects a touch input based on a change in mutual capacitance between each first electrode member 120 and each second electrode member 130. The noise sensing signals Ns that are output from the first conductive members 150 during the first period T1 may be provided to the touch detector 270 via the switch 251 and the amplifying circuit 230. The touch detector 270 may detect a touch position based on the sensing signals Rs that are received from the first electrode members 120 and the noise sensing signals Ns that are received from the first conductive members 150.

In addition, the switch 251 may be controlled by the switch controller 253 to connect the first conductive members 150 to the proximity detector 290 during the second period T2. As described above, the second period T2 may be a period during which the proximity detector 290 detects the proximity of an object based on a change in the self-capacitance of each of the first conductive members 150. The proximity sensing signals Ps that are output from each of the first conductive members 150 during the second period T2 may be provided to the proximity detector 290 via the switch 251. The proximity detector 290 may detect the proximity of an object based on the proximity sensing signals Ps that are received from each of the first conductive members 150.

In some embodiments, the switch circuit 250 may be implemented in software, firmware, or hardware.

The proximity detector 290 may be connected to the first conductive members 150 via the switch circuit 250 during the second period T2. The proximity detector 290 may receive the proximity sensing signal Ps from each of the first conductive members 150 during the second period T2 and detect the proximity of an object based on the proximity sensing signals Ps.

In some embodiments, the proximity detector 290 includes a switch 291, a driving power source Vpo, an amplifier 293 operating as a comparator, a comparative power source Vcp connected to the amplifier 293, and a processor 295.

The switch 291 may switch the connection between the first conductive members 150 and a first node N1 and the connection between the first conductive members 150 and a third node N3. Here, the first node N1 is connected to a first input terminal 2931 of the amplifier 293, and the third node N3 is connected to the driving power source Vpo.

The driving power source Vpo may provide a driving voltage for proximity detection to the first conductive members 150. An end of the driving power source Vpo may be connected to a second node N2 that is provided with a reference power source GND, and the other end of the driving power source Vpo may be connected to the third node N3.

The comparative power source Vcp may provide a threshold voltage to the amplifier 293 to determine whether an object is in proximity. An end of the comparative power source Vcp may be connected to the second node N2 provided with the reference power source GND, and the other end of the comparative power source Vcp may be connected to a second input terminal 2933 of the amplifier 293.

The amplifier 293 may include the first input terminal 2931, the second input terminal 2933, and an output terminal 2935. According to an embodiment, the first input terminal 2931 of the amplifier 293 (e.g., a non-inverting input terminal of an OP amp) may be connected to the first node N1 that is connected to the first conductive members 150 via the switch 291, and the proximity sensing signal Ps may be input to the first input terminal 2931.

In some embodiments, the second input terminal 2933 of the amplifier 293 (e.g., an inverting input terminal of the OP amp) may be connected to the comparative power source Vcp. Accordingly, a high signal or a low signal may be output from the output terminal 2935 of the amplifier 293 according to the magnitude relationship between the proximity sensing signal Ps and the comparative power source Vcp.

The processor 295 may process a signal output from the amplifier 293 and detect the proximity of an object according to the signal processing result. According to an embodiment, the processor 295 may be implemented as an MPU.

During the second period T2, the switch 291 of the proximity detector 290 may be connected to the third node N3. Accordingly, the driving voltage provided by the driving power source Vpo may be provided to each of the first conductive members 150 via the switch 291, and self-capacitance may be formed in each of the first conductive members 150. After the driving voltage is applied to each of the first conductive members 150, the switch 291 may be connected to the first node N1. Accordingly, the proximity sensing signal Ps output from each of the first conductive members 150 may be provided to the first input terminal 2931 of the amplifier 293. The proximity sensing signal Ps may include a signal indicating a change in the self-capacitance of a first conductive member 150 that occurs when an object is in proximity thereof. Therefore, the proximity detector 290 can detect the proximity of an object by comparing the threshold voltage of the comparative power source Vcp with the proximity sensing signal Ps.

In some embodiments, the proximity detector 290 may further include a capacitor Cr and a reset switch SWr that are connected in parallel to each other between the first node N1 and the second node N2.

It is noted that the above-described structure of the proximity detector 290 is only an example, and the present disclosure is not limited to this structure. The components of the proximity detector 290 can also be variously changed.

The touch sensor TSM according to the above-described embodiment can effectively cancel a noise signal introduced from, for example, the display panel 300 and improve a signal-to-noise ratio (SNR). Accordingly, the touch sensor TSM can stably detect a touch input by effectively canceling the noise signal, and the sensing sensitivity of the touch sensor TSM can be improved.

In addition, since the touch sensor TSM according to the above-described embodiment can detect the proximity of an object, the structure of the display device 1 can be simplified, and there is no need to form a hole for an additional optical proximity sensor. In some embodiments, the display device 1 may be pre-programmed to perform an operation depending on the proximity of an object sensed by the touch sensor TSM. For example, the display device 1 may perform a pre-programmed feature such as screen locking, screen-off operation, stopping a touch sensing operation of a touch sensor, application calling, or call receiving.

Figure 23:
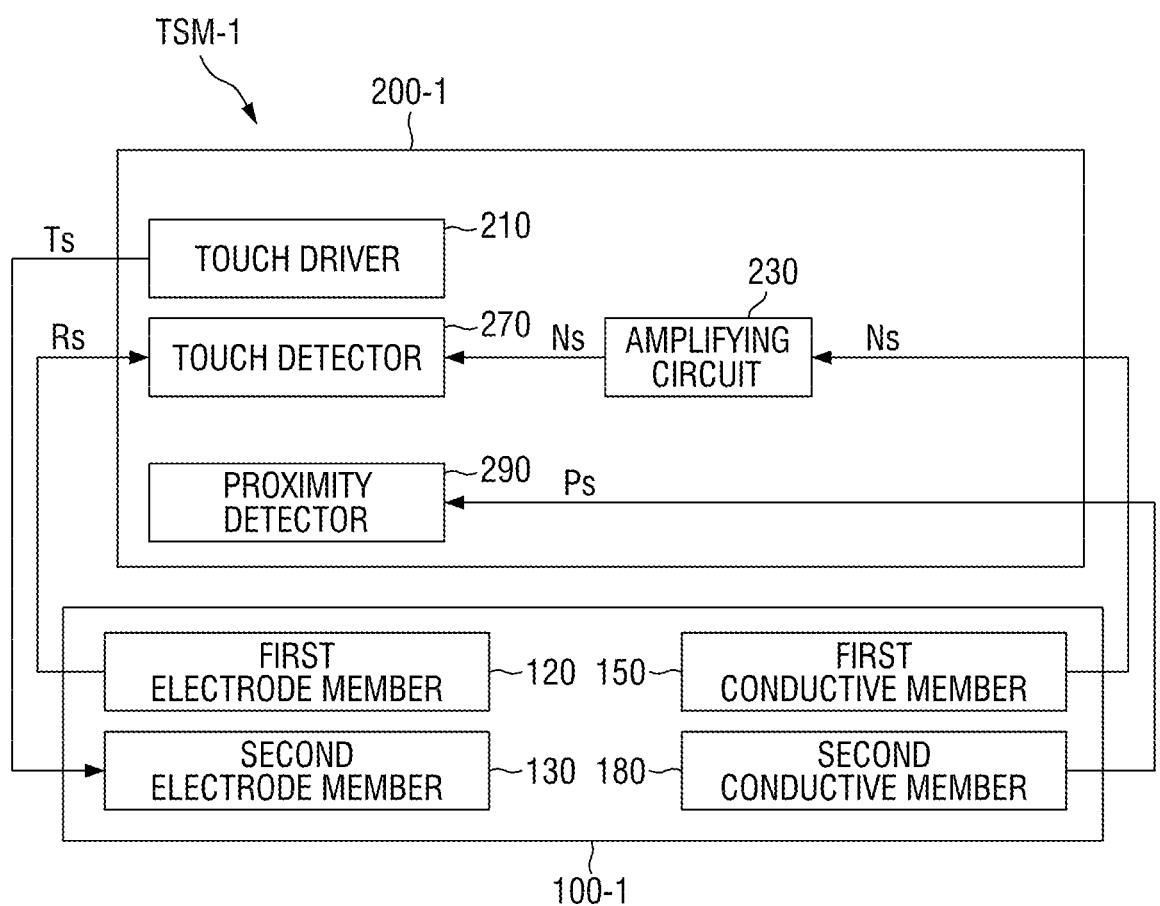
FIG. 23 is a block diagram of a touch sensor according to an embodiment.

FIG. 23 is a block diagram of a touch sensor TSM-1 according to an embodiment.

Referring to FIG. 23, the touch sensor TSM-1 according to the current embodiment includes a touch controller 200-1 and a sensing part 100-1.

The touch controller 200-1 may include a touch driver 210, a touch detector 270, a proximity detector 290, and an amplifying circuit 230.

The current embodiment is substantially the same as or similar to the embodiment of FIG. 2 except that the touch controller 200-1 of the touch sensor TSM-1 does not include a switch circuit, and the sensing part 100-1 includes a second conductive member 180. Therefore, redundant description will be omitted, and differences will be mainly described below.

A noise sensing signal Ns that is output from a first conductive member 150 may be provided to the touch detector 270 via the amplifying circuit 230.

The second conductive member 180 may be connected to the proximity detector 290. The second conductive member 180 may provide a proximity sensing signal Ps to the proximity detector 290, and the proximity detector 290 may detect the proximity of an object based on the proximity sensing signal Ps received from the second conductive member 180.

Figure 24:
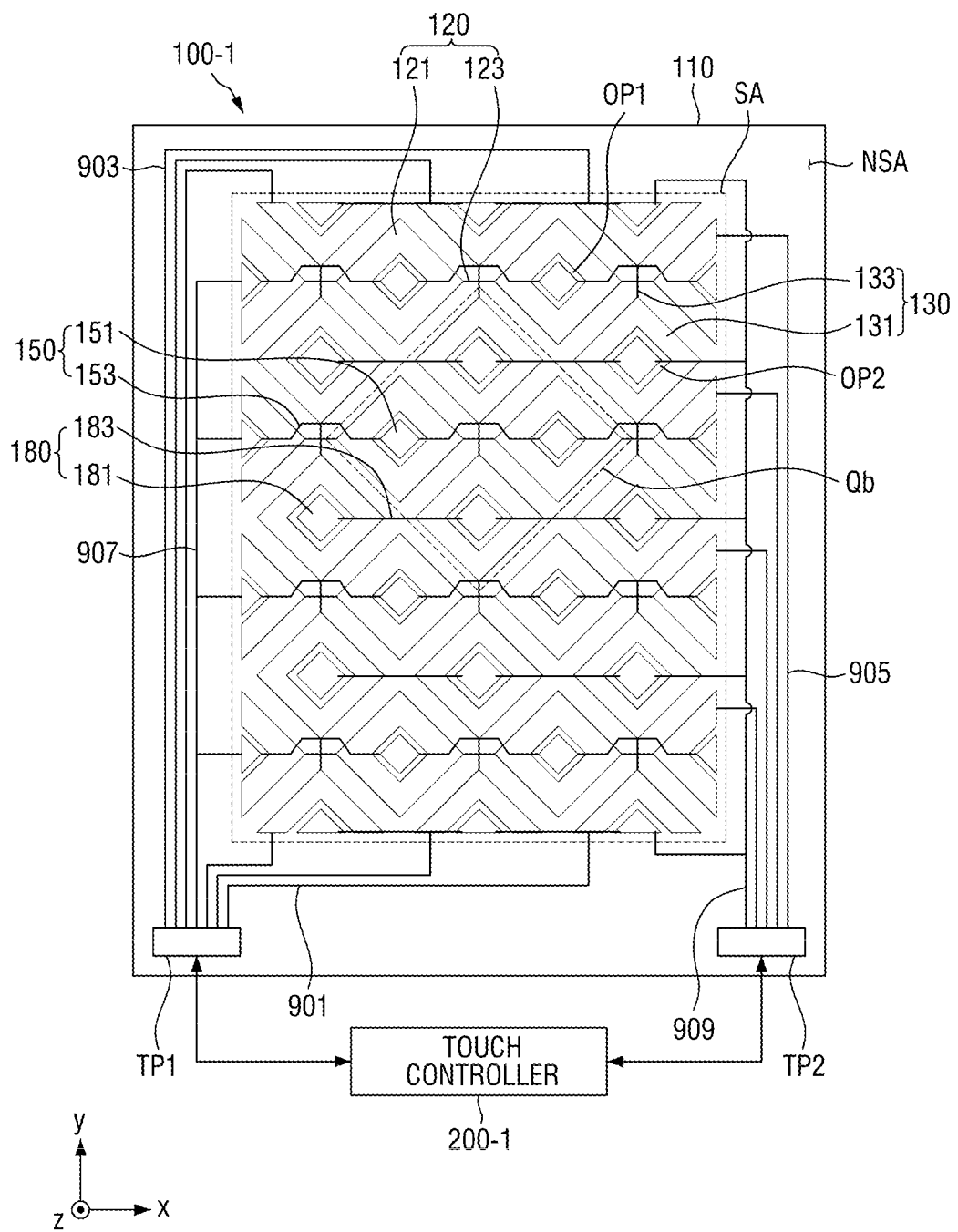
FIG. 24 illustrates the touch sensor of FIG. 23, a plan view of a sensing part of the touch sensor, and the connection relationship between the sensing part and a touch controller.
Figure 25:
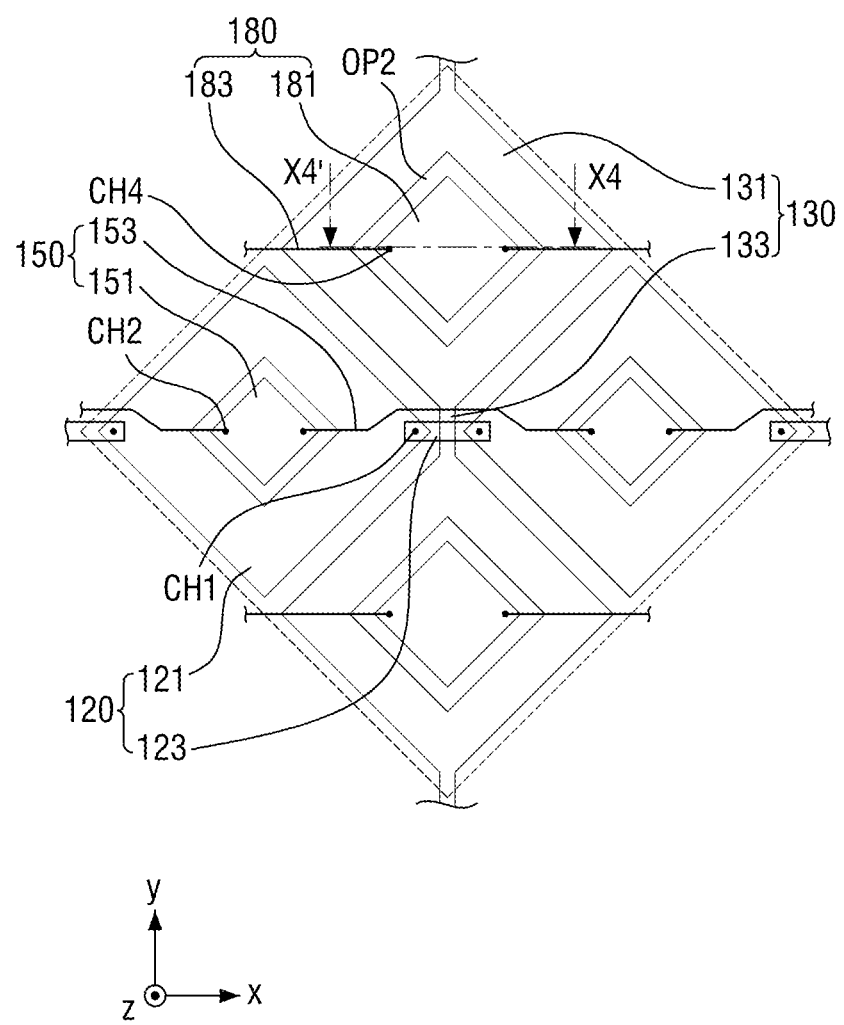
FIG. 25 is an enlarged plan view of a portion Qb of FIG. 24.
Figure 26:
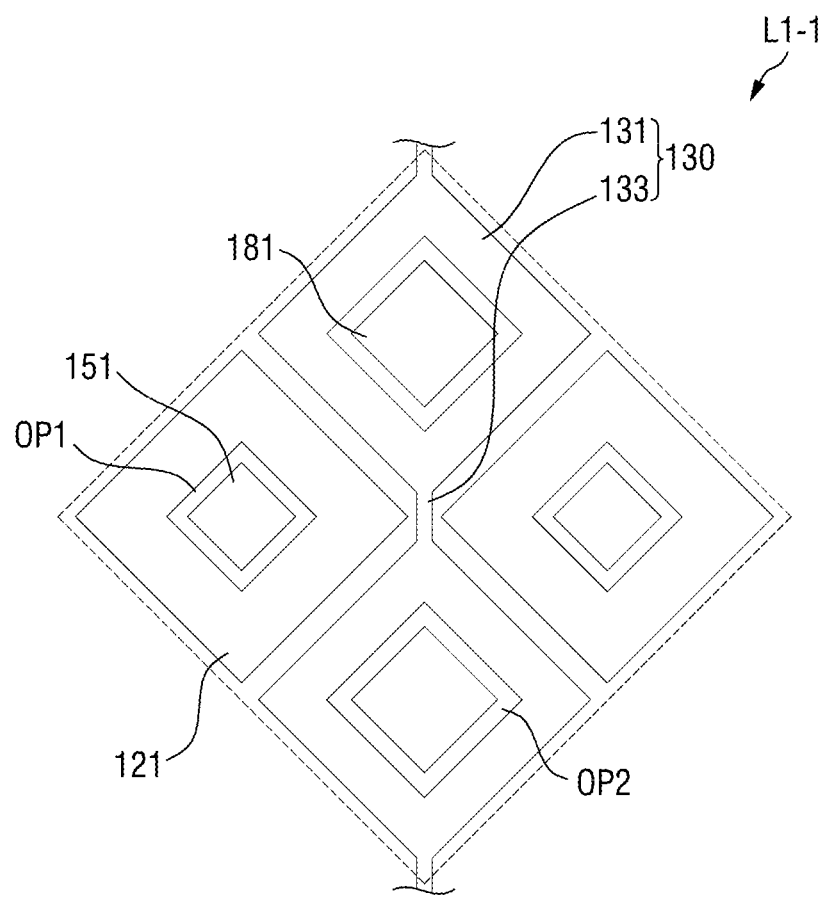
FIG. 26 illustrates an exemplary structure of a first layer of the sensing part of FIG. 25.
Figure 27:
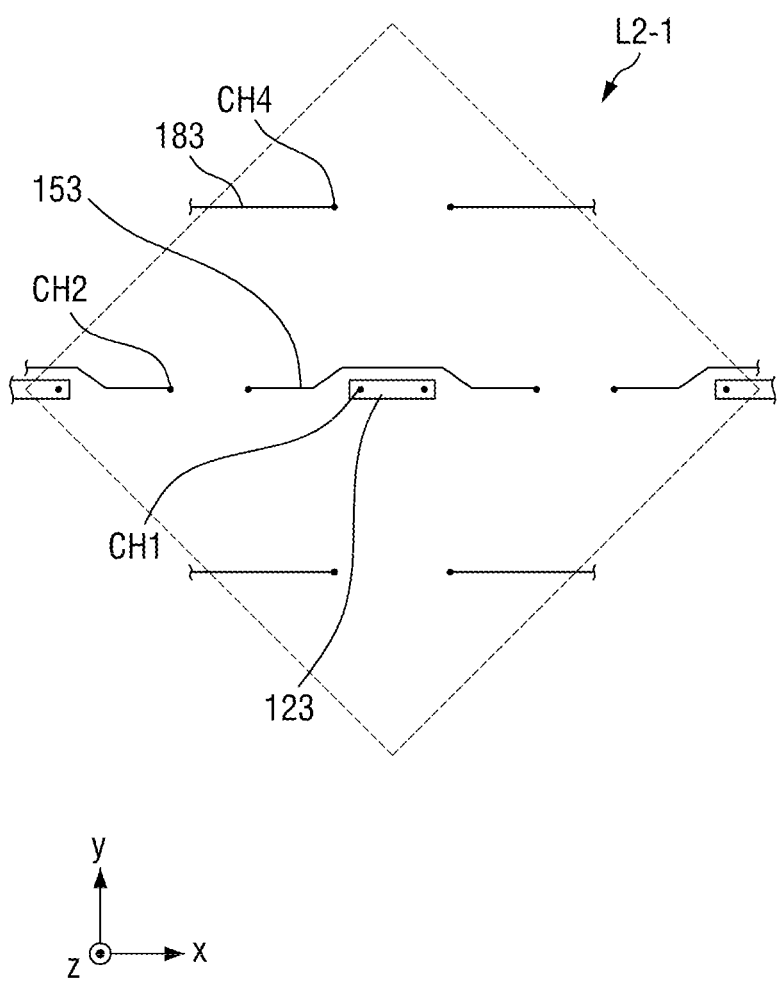
FIG. 27 illustrates an exemplary structure of a second layer of the sensing part of FIG. 25.
Figure 28:
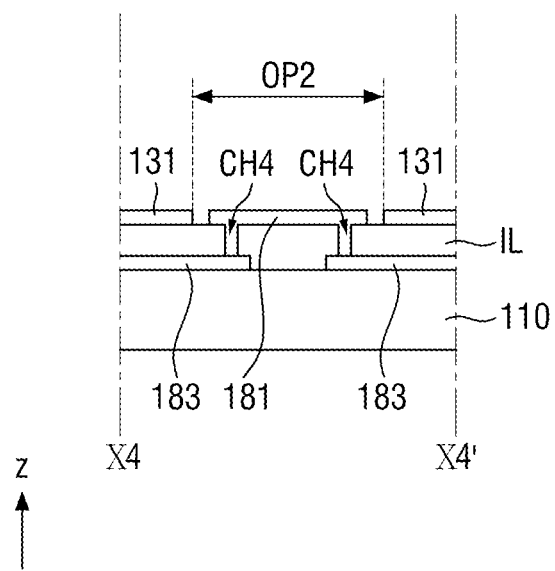
FIG. 28 is a cross-sectional view taken along X4-X4' of FIG. 25.

FIG. 24 illustrates the touch sensor TSM-1 of FIG. 23, a plan view of the sensing part 100-1 of the touch sensor TSM-1, and the connection relationship between the sensing part 100-1 and the touch controller 200-1. FIG. 25 is an enlarged plan view of a portion Qb of FIG. 24. FIG. 26 illustrates an exemplary structure of a first layer L1-1 of the sensing part 100-1 of FIG. 25. FIG. 27 illustrates an exemplary structure of a second layer L2-1 of the sensing part 100-1 of FIG. 25. FIG. 28 is a cross-sectional view taken along X4-X4' of FIG. 25.

Referring to FIGS. 24 through 28, the sensing part 100-1 may further include a plurality of second conductive members 180 and may not include conductors, in comparison to the embodiment of FIGS. 3 through 10.

Each of the second conductive members 180 may be located in an electrode row formed by second electrodes 131 neighboring each other along the first direction x. In some embodiments, the second conductive member 180 may be located in each electrode row formed by the second electrodes 131. Although the number of rows formed by the second electrodes 131 is five in FIG. 24, the present disclosure is not limited to this case.

Each of the second conductive members 180 may output the proximity sensing signal Ps as described above.

Each of the second conductive members 180 may include second conductive patterns 181 and second connection lines 183.

The second conductive patterns 181 may be located within second openings OP2 of the second electrodes 131 and may be spaced apart from the second electrodes 131. In some embodiments, as illustrated in FIG. 26, the second conductive patterns 181 may be located in the same first layer L1-1 as first electrodes 121, the second electrodes 131, second connection portions 133, and first conductive patterns 151 and may be made of the same material as one of the first electrodes 121, the second electrodes 131, the second connection portions 133, and the first conductive patterns 151.

In some embodiments, when the second electrodes 131 have a mesh structure, the second conductive patterns 181 may also have a mesh structure. For example, the mesh structure of the second conductive patterns 181 may be substantially the same as or similar to the structure illustrated in FIG. 7.

Each of the second connection lines 183 may electrically connect the second conductive patterns 181 that are located in the same row and neighboring each other along the first direction x. In some embodiments, as illustrated in FIG. 27, the second connection lines 183 may be located in the same second layer L2-1 as first connection portions 123 and first connection lines 153 and may be made of the same material as one of the first connection portions 123 and the first connection lines 153.

In some embodiments, the second conductive patterns 181 and the second connection lines 183 may be connected to each other through fourth contact holes CH4 that are formed in an insulating layer IL.

One or more fifth wirings 909 that are connected to the second conductive members 180 may be disposed in a peripheral area NSA of a base layer 110, in addition to first wirings 901, second wirings 903, third wirings 905 and fourth wirings 907.

In some embodiments, only a single fifth wiring 909 may be provided, unlike the first wirings 901, the second wirings 903, and the third wirings 905. In addition, the single fifth wiring 909 may be connected to all of the second conductive members 180. Accordingly, the number of channels or pads allocated to the second conductive members 180 can be reduced, and the area occupied by the fifth wiring 909 in the peripheral area NSA can be reduced. In other embodiments, two or more fifth wirings 909 can also be provided.

In some embodiments, the one or more fifth wirings 909 may be connected to a second pad portion TP2.

In the touch sensor TSM-1 according to the above-described embodiment, each of the first conductive members 150 outputs the noise sensing signal Ns, and each of the second conductive members 180 outputs the proximity sensing signal Ps. Therefore, the proximity detector 290 of the touch controller 200-1 can detect the proximity of an object while the touch detector 270 of the touch controller 200-1 performs a touch input detection operation. That is, the touch controller 200-1 can perform a touch detection operation and a proximity detection operation independently without being driven in a time-division manner and can simultaneously perform both the touch detection operation and the proximity detection operation. However, the present disclosure is not limited to this case.

In some embodiments, the touch controller 200-1 may be driven in a time-division manner to perform the touch detection operation and the proximity detection operation in different periods.

In some embodiments, the structure of the touch sensor TSM-1, in particular, the position of the first conductive patterns 151, the position of the first connection lines 153, the position of the second conductive patterns 181, and the position of the second connection lines 183 may be variously changed.

Figure 29:
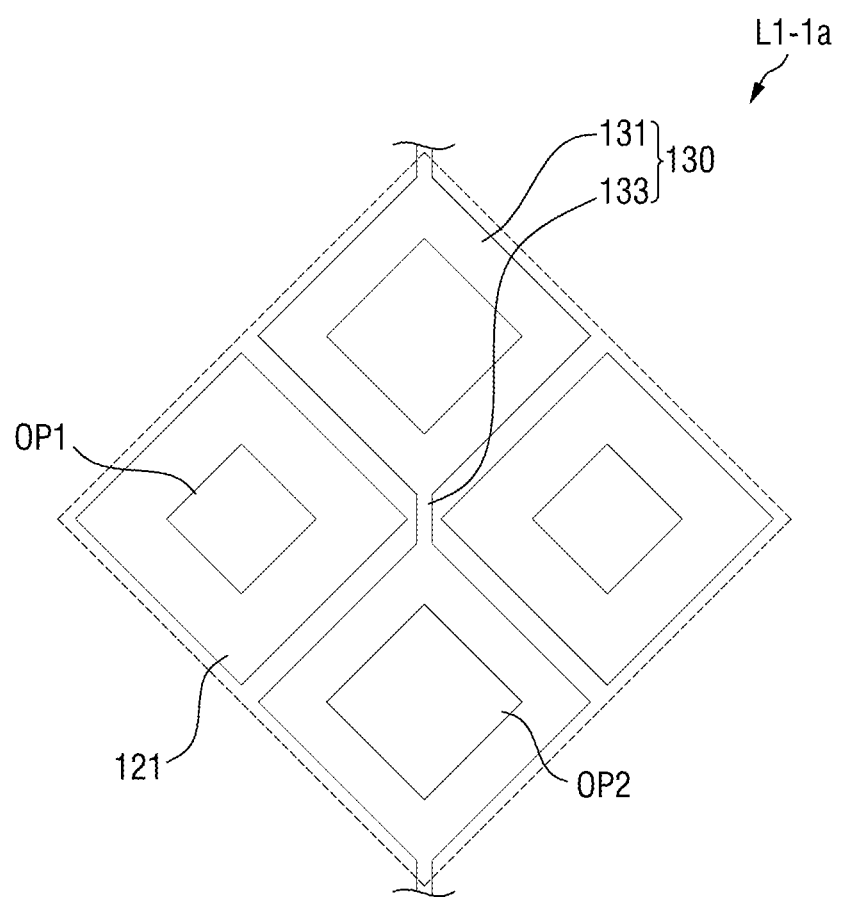
FIG. 29 illustrates an exemplary structure of a first layer according to a modified example of FIG. 26.
Figure 30:
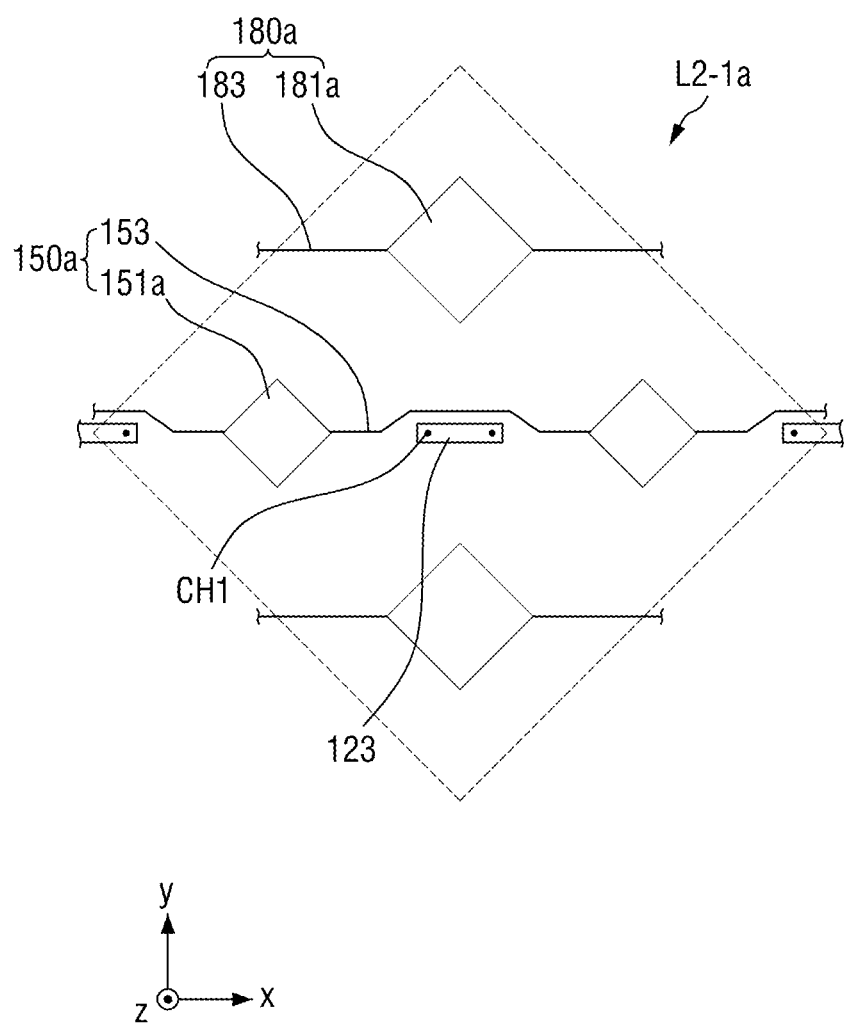
FIG. 30 illustrates an exemplary structure of a second layer according to a modified example of FIG. 27.
Figure 31:
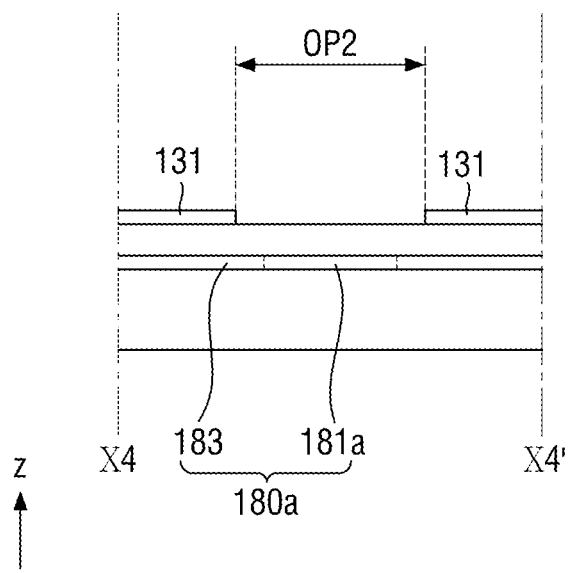
FIG. 31 is a cross-sectional view illustrating a modified example of FIG. 28.

FIG. 29 illustrates an exemplary structure of a first layer L1-1a according to a modified example of FIG. 26. FIG. 30 illustrates an exemplary structure of a second layer L2-1a according to a modified example of FIG. 27. FIG. 31 is a cross-sectional view illustrating a modified example of FIG. 28.

Referring to FIGS. 29 through 31, in comparison to FIGS. 26 through 28, a first conductive member 150a may include first lower conductive patterns 151a and a first connection line 153, and a second conductive member 180a may include a second lower conductive pattern 181a and second connection lines 183.

The first conductive member 150a is the same as that described above with reference to FIGS. 11 through 14, and thus its description is omitted.

The second lower conductive patterns 181a may be located in a different layer from the first electrodes 121 and the second electrodes 131. For example, the first electrodes 121 and the second electrodes 131 may be located in the first layer L1-1a. In addition, the second lower conductive patterns 181a may be located in the same second layer L2-1a as a first connection portion 123, the first connection line 153, and the second connection lines 183 and may be made of the same material as one of the first connection portion 123, the first connection line 153, and the second connection lines 183. The second lower conductive patterns 181a may be connected to the second connection lines 183 in the second layer L2-1a.

In the current modified example, since the second lower conductive patterns 181a and the second connection lines 183 are located in the same second layer L2-1a, the contact holes CH4 illustrated in FIGS. 25, 27, and 28 may be omitted.

Figure 32:
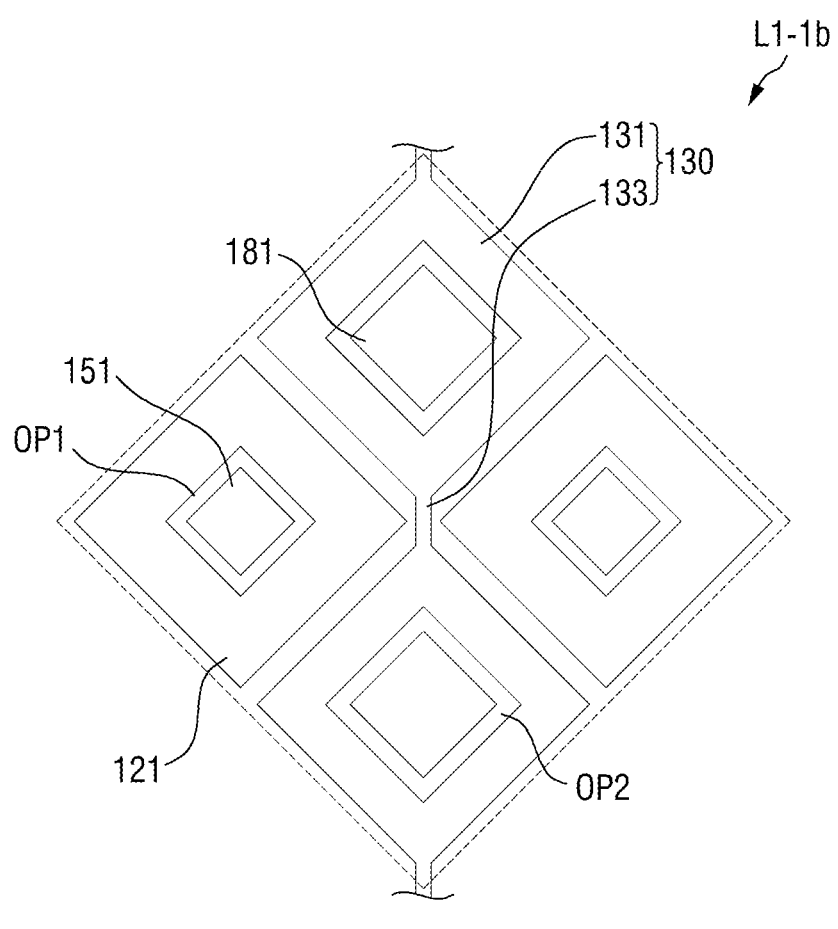
FIG. 32 illustrates an exemplary structure of a first layer according to a modified example of FIG. 26.
Figure 33:
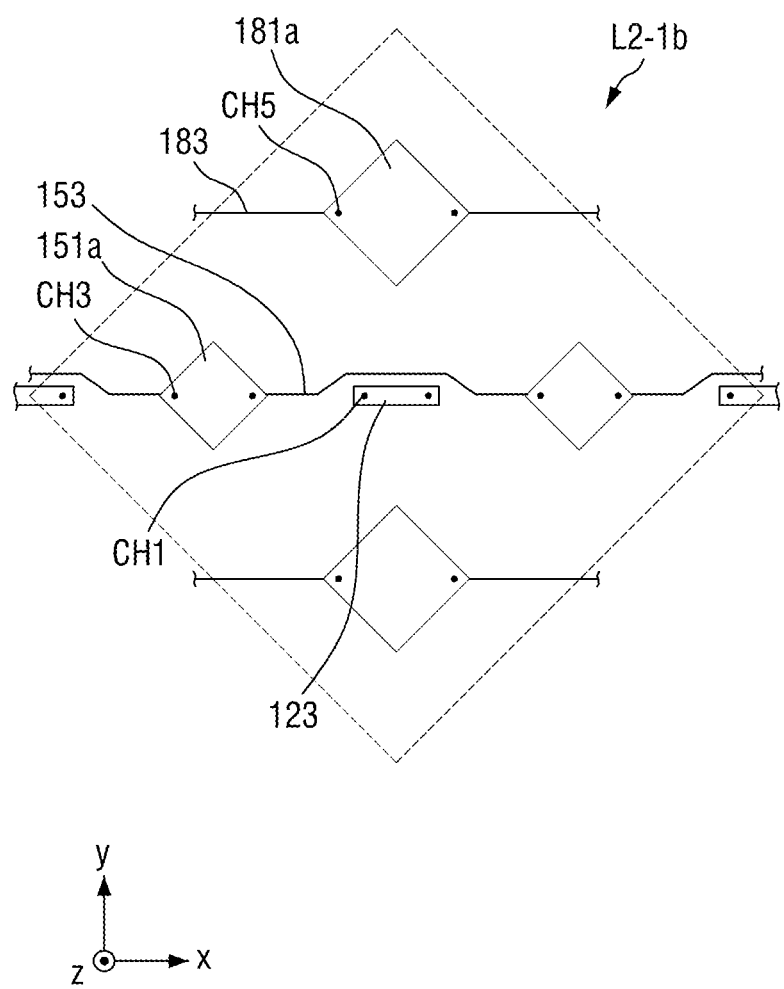
FIG. 33 illustrates an exemplary structure of a second layer according to a modified example of FIG. 27.
Figure 34:
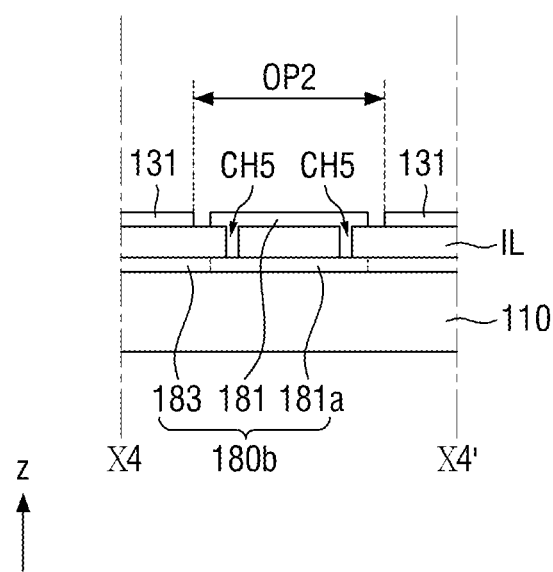
FIG. 34 is a cross-sectional view illustrating a modified example of FIG. 28.

FIG. 32 illustrates an exemplary structure of a first layer L1-1b according to a modified example of FIG. 26. FIG. 33 illustrates an exemplary structure of a second layer L2-1b according to a modified example of FIG. 27. FIG. 34 is a cross-sectional view illustrating a modified example of FIG. 28.

Referring to FIGS. 32 through 34, in comparison to FIGS. 26 through 28, each second conductive member 180b may include a second conductive pattern 181, second connection lines 183, and a second lower conductive pattern 181a.

The second conductive patterns 181 may be located in the same first layer L1-1b as first electrodes 121, second electrodes 131, and first conductive patterns 151. In addition, the second lower conductive patterns 181a and the second connection lines 183 may be located in the same second layer L2-1b as a first connection portion 123, first lower conductive patterns 151a, and a first connection line 153 and may be made of the same material as one of the first connection portion 123, the first lower conductive patterns 151a, and the first connection line 153. The second lower conductive patterns 181a may be connected to the second connection lines 183 in the second layer L2-1b.

In some embodiments, the second lower conductive patterns 181a and the second conductive patterns 181 may be connected to each other through fifth contact holes CH5 that are formed in an insulating layer IL.

The first conductive patterns 151, the first lower conductive patterns 151a, and the first connection line 153 are the same as those described above with reference to FIGS. 15 through 18, and thus their detailed description is omitted.

Figure 35:
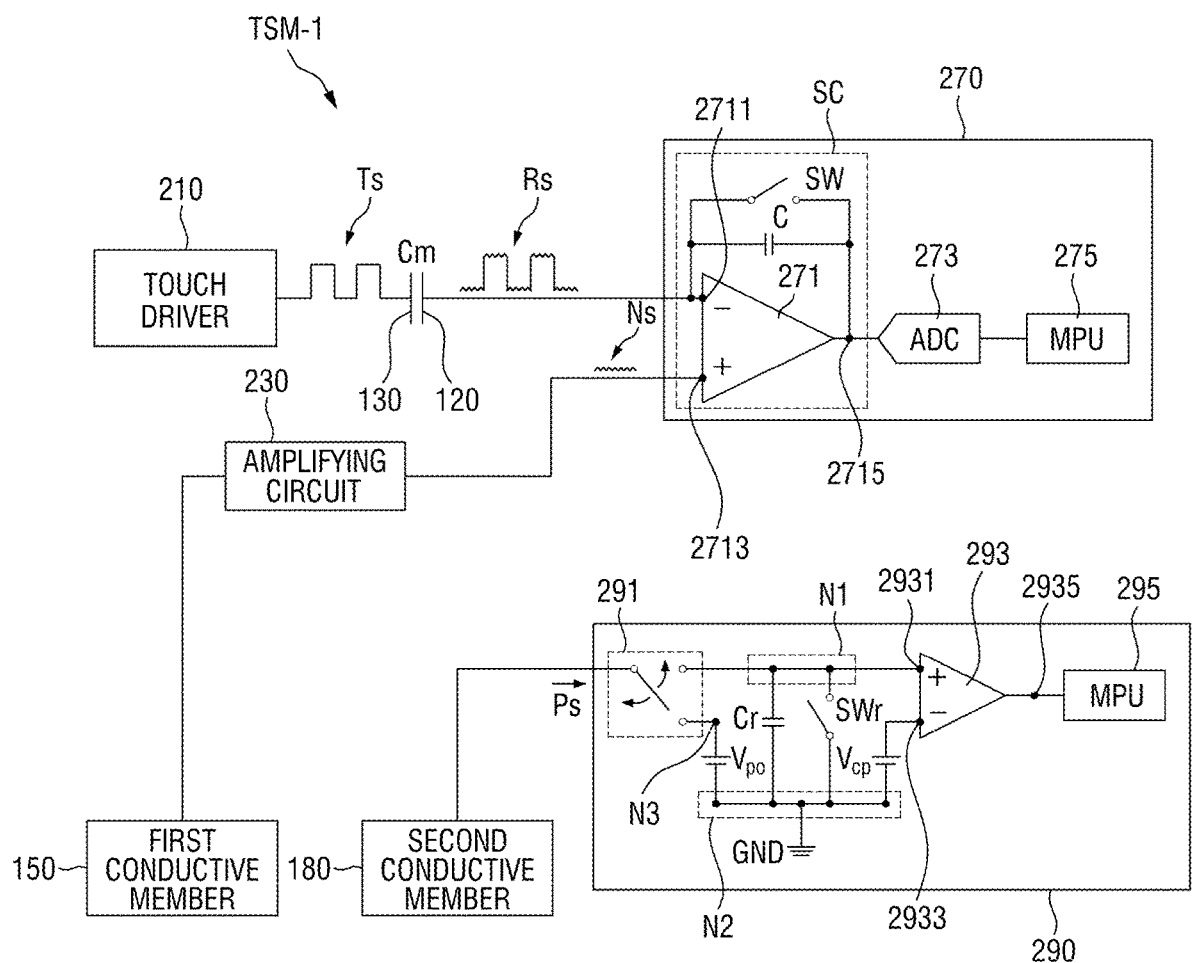
FIG. 35 is a diagram for explaining a touch position detection operation of the touch sensor according to an embodiment.
Figure 36:
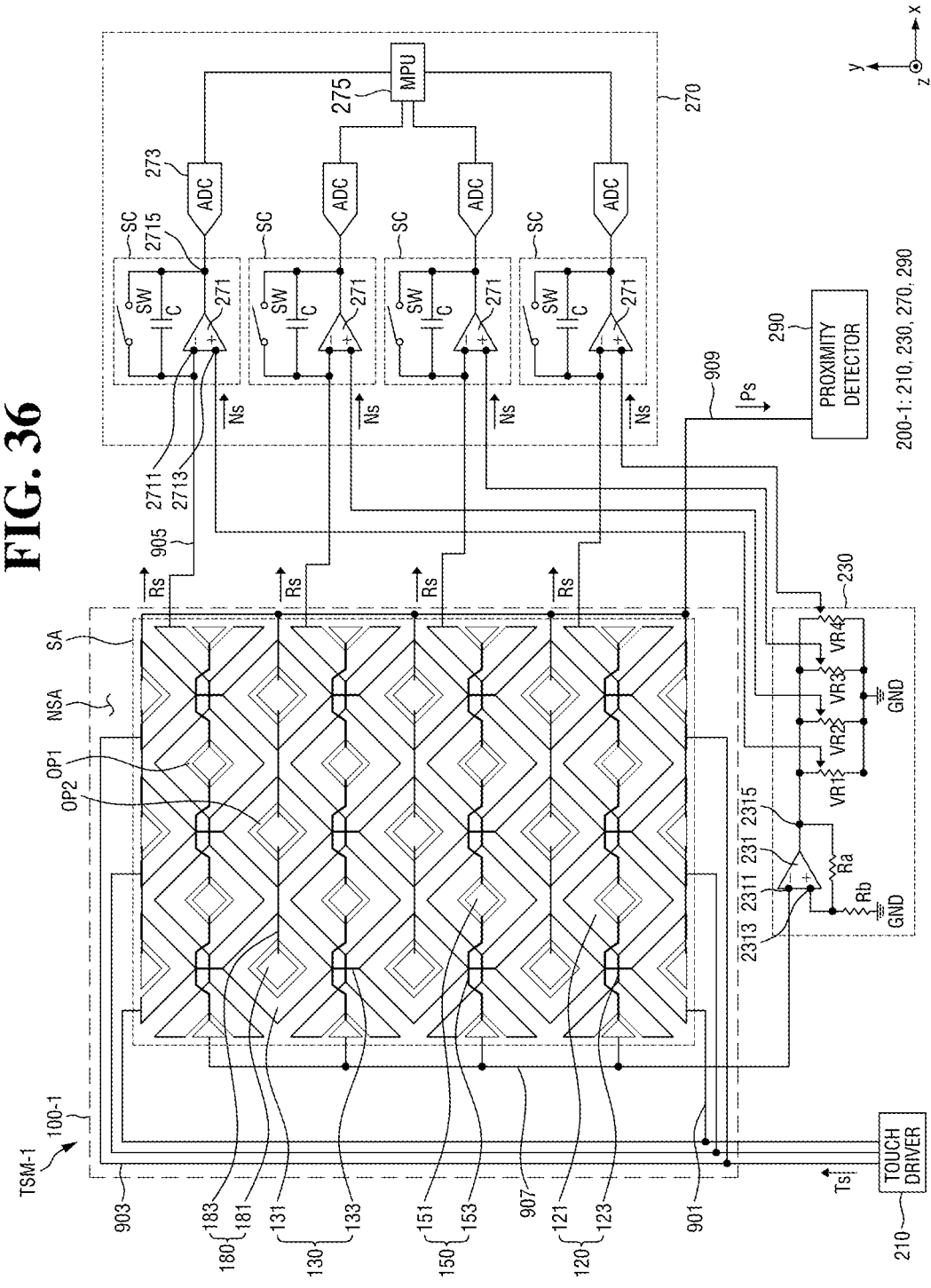
FIG. 36 specifically illustrates the connection relationship between the sensing part and the touch controller according to an embodiment.

FIG. 35 is a diagram for explaining a touch position detection operation of the touch sensor TSM-1 according to an embodiment. FIG. 36 specifically illustrates the connection relationship between the sensing part 100-1 and the touch controller 200-1 according to an embodiment.

Referring to FIGS. 35 and 36, the touch controller 200-1 may not operate by distinguishing between a first period and a second period, in comparison to the embodiment of FIGS. 21A and 22.

The noise sensing signal Ns may be output from each of the first conductive members 150, and the proximity sensing signal Ps may be output from each of the second conductive members 180 that are separate from the first conductive members 150. That is, the sensing part 100-1 may simultaneously output the noise sensing signals Ns and the proximity sensing signals Ps. Accordingly, the touch detector 270 may detect a touch input/touch position based on sensing signals Rs including a signal that indicates a change in mutual capacitance and the noise sensing signals Ns. In addition, the proximity detector 290 may provide a driving voltage for proximity detection (or a driving voltage for forming self-capacitance) to each of the second conductive members 180 and detect the proximity of an object by receiving the proximity sensing signals Ps including a signal that indicates a change in self-capacitance from each of the second conductive members 180. That is, the touch controller 200-1 may simultaneously and independently perform both a touch sensing operation and a proximity sensing operation.

However, the operation of the touch controller 200-1 is not limited to that described above, and the touch controller 200-1 can also perform the touch sensing operation and the proximity sensing operation separately.

Figure 37:
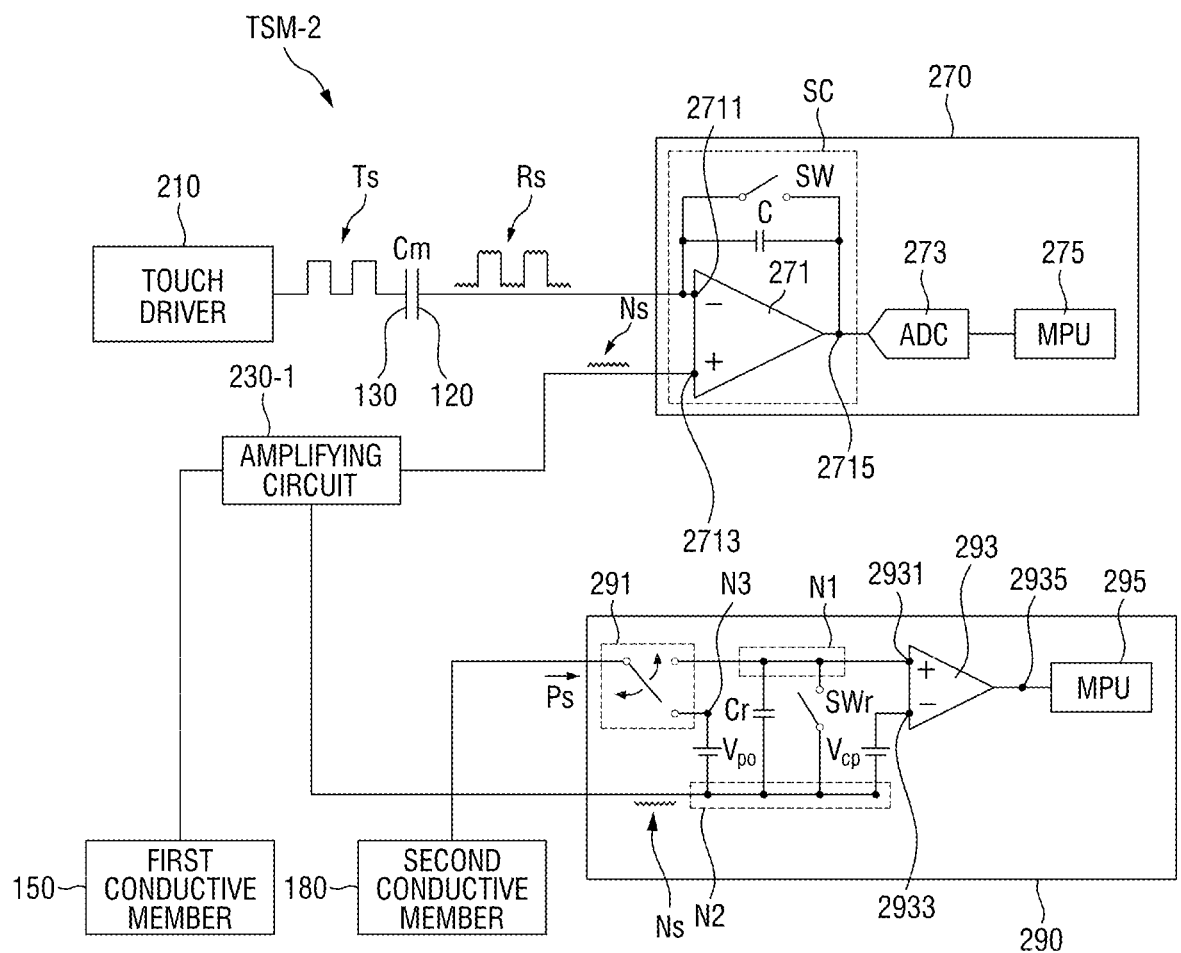
FIG. 37 is a diagram for explaining a touch position detection operation of a touch sensor according to an embodiment.
Figure 38:
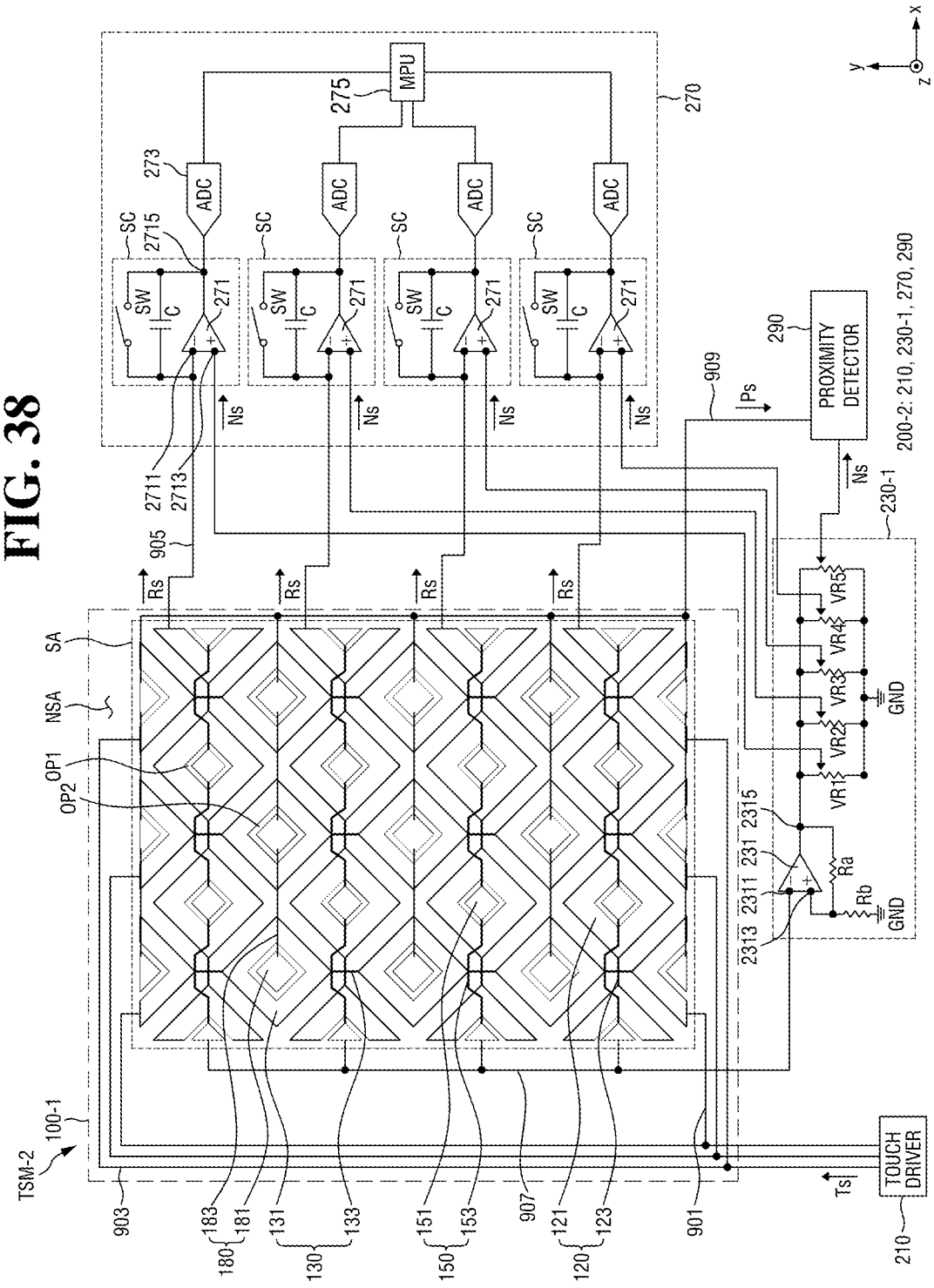
FIG. 38 specifically illustrates the connection relationship between a sensing part and a touch controller according to an embodiment.

FIG. 37 is a diagram for explaining a touch position detection operation of a touch sensor TSM-2 according to an embodiment. FIG. 38 specifically illustrates the connection relationship between a sensing part 100-1 and a touch controller 200-2 according to an embodiment.

Referring to FIGS. 37 and 38, the touch sensor TSM-2 includes the touch controller 200-2 and the sensing part 100-1.

The structure of the sensor section 100-1 is the same as that described above with reference to FIGS. 24 through 36, and thus its description is omitted.

The current embodiment is substantially the same as or similar to the embodiment of FIGS. 35 and 36 except that the touch controller 200-2 includes an amplifying circuit 230-1, and the amplifying circuit 230-1 is connected to a proximity detector 290. Therefore, redundant description will be omitted.

The amplifying circuit 230-1 may include a plurality of variable resistors corresponding to the number of sensing channels SC, for example, a first variable resistor VR1, a second variable resistor VR2, a third variable resistor VR3, a fourth variable resistor VR4, and a fifth variable resistor VR5 that are connected to the proximity detector 290. The fifth variable resistor VR5 may be connected between an output terminal 2315 of an amplifier 231 and a predetermined reference power source GND such as a ground power source and may be connected in parallel to the first variable resistor VR1, the second variable resistor VR2, the third variable resistor VR3, and the fourth variable resistor VR4.

According to an embodiment, a second node N2 of the proximity detector 290 may be connected to the fifth variable resistor VR5 of the amplifying circuit 230-1, in comparison to the embodiment of FIGS. 35 and 36.

According to the current embodiment, the proximity detector 290 may receive a noise sensing signal Ns from each of first conductive members 150 via the amplifying circuit 230-1. Therefore, a reference voltage of the proximity detector 290 may vary according to the voltage variation of each of the first conductive members 150. Accordingly, a noise component included in a proximity sensing signal Ps can be effectively removed, resulting in improved proximity detection accuracy.

Figure 39:
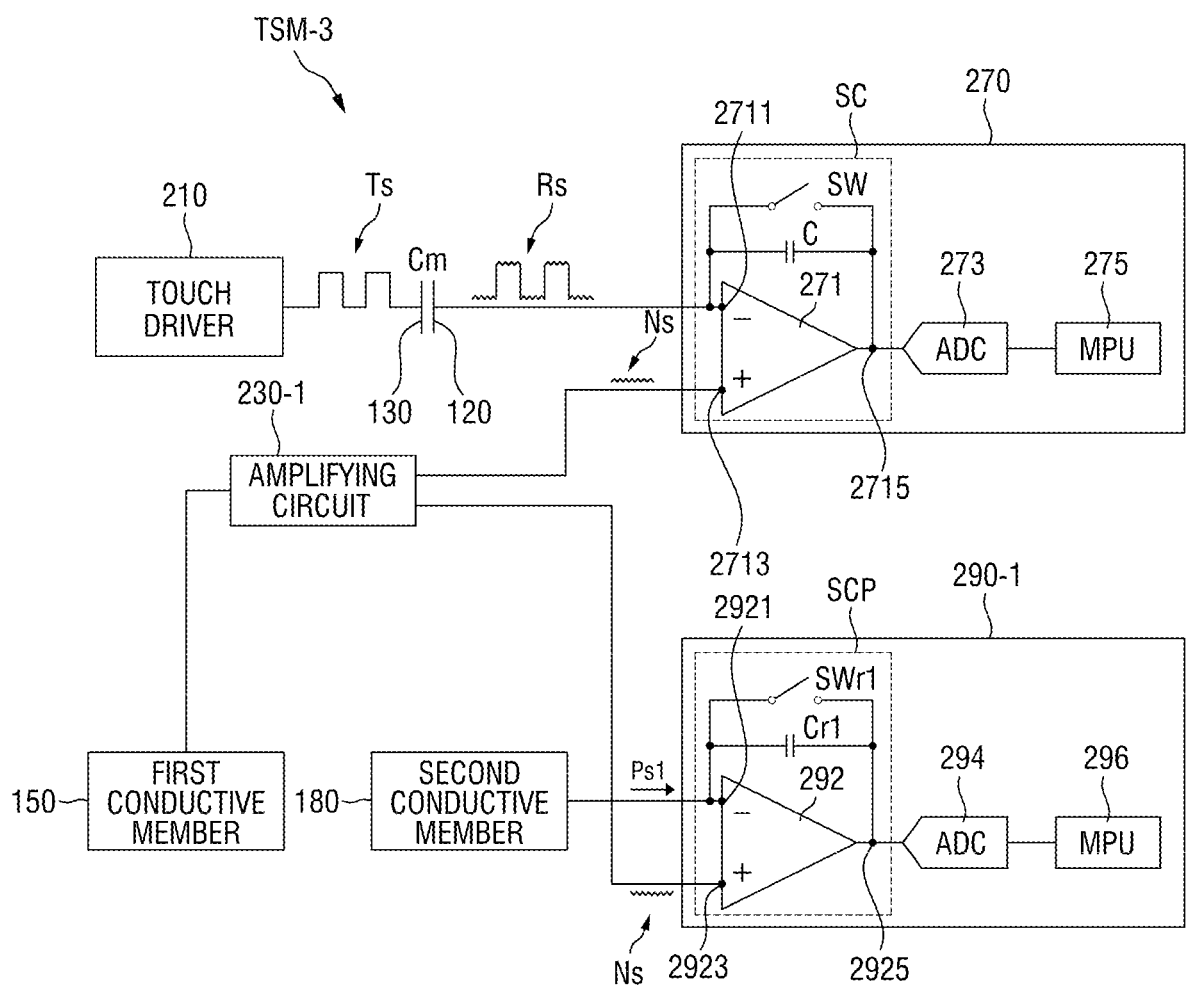
FIG. 39 is a diagram for explaining a touch position detection operation of a touch sensor according to an embodiment.
Figure 40:
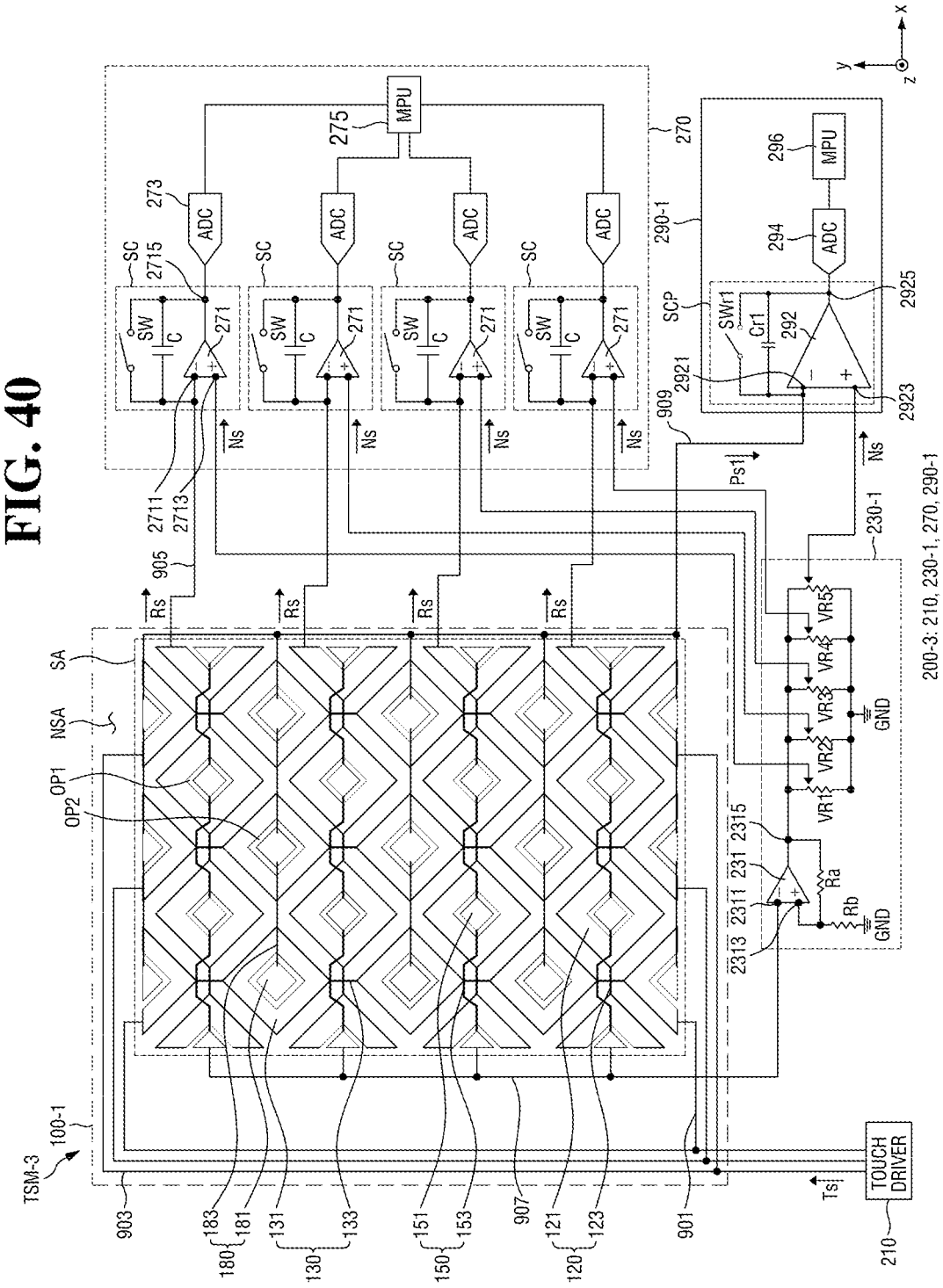
FIG. 40 specifically illustrates the connection relationship between a sensing part and a touch controller according to an embodiment.

FIG. 39 is a diagram for explaining a touch position detection operation of a touch sensor TSM-3 according to an embodiment. FIG. 40 specifically illustrates the connection relationship between a sensing part 100-1 and a touch controller 200-3 according to an embodiment.

Referring to FIGS. 39 and 40, the touch sensor TSM-3 includes the touch controller 200-3 and the sensing part 100-1.

The structure of the sensor section 100-1 is the same as that described above with reference to FIGS. 24 through 36, and thus its description is omitted.

The touch controller 200-3 includes a proximity detector 290-1 and an amplifying circuit 230-1 that are different from those of the embodiment of FIGS. 35 and 36.

The amplifying circuit 230-1 is substantially the same as that of the embodiment of FIGS. 37 and 38, and thus its description is omitted.

The proximity detector 290-1 may receive a proximity sensing signal Ps1 from each of second conductive members 180 through a fifth wiring 909. The proximity sensing signal Ps1 may include a signal indicating a change in mutual capacitance between a second electrode member 130 and a second conductive member 180. When a driving signal Ts is provided to the second electrode members 130, mutual capacitance is formed between each second electrode member 130 and each second conductive member 180. When a proximity event such as proximity of an object occurs, the mutual capacitance between a second electrode member 130 and a second conductive member 180 may change. Each of the second conductive members 180 may output the proximity sensing signal Ps1 corresponding to the driving signal Ts, and the proximity sensing signal Ps1 that is output from each of the second conductive members 180 may be input to the proximity detector 290-1.

The proximity detector 290-1 may include a proximity sensing channel SCP, at least one ADC 294 that is connected to the proximity sensing channel SCP, and a processor 296.

The proximity sensing channel SCP may receive the proximity sensing signal Ps1 from each of the second conductive members 180, amplify the received proximity sensing signal Ps1, and output the amplified proximity sensing signal. In some embodiments, the proximity sensing channel SCP may include an analog front-end including at least one amplifier 292 such as an OP amp. In some embodiments, the proximity sensing channel SCP may have substantially the same structure as sensing channels SC of a touch detector 270.

The amplifier 292 may include a first input terminal 2921, a second input terminal 2923, and an output terminal 2925. According to an embodiment, the first input terminal 2921 of the amplifier 292 (e.g., an inverting input terminal of an OP amplifier) may be electrically connected to the second conductive members 180 by the fifth wiring 909, and the proximity sensing signal Ps1 may be input to the first input terminal 2921.

The second input terminal 2923 of the amplifier 292 (e.g., a non-inverting input terminal of the OP amp) may be electrically connected to the amplifying circuit 230-1, and a noise sensing signal Ns that is output from each of first conductive members 150 may be provided to the second input terminal 2923 of the amplifier 292 via the amplifying circuit 230-1. Accordingly, reference voltages of amplifiers 271 may vary according to voltage variations of the first conductive members 150, respectively. That is, reference potentials of the amplifiers 271 may vary according to potentials (voltage levels) of the first conductive members 150, respectively.

In some embodiments, the proximity sensing channel SCP may further include a capacitor Cr1 and a reset switch SWr1 that are connected in parallel to each other between the first input terminal 2921 and the output terminal 2925 of the amplifier 292.

In the above example, the amplifier 292 is implemented as an inverting amplifier. However, in an embodiment, the amplifier 292 may also be implemented as a non-inverting amplifier.

The output terminal 2925 of the amplifier 292 may be electrically connected to the ADC 294, and the processor 296 may process a converted signal (digital signal) that is received from the ADC 294 and detect the proximity of an object based on the signal processing result. In some embodiments, the processor 296 may be implemented as an MPU.

According to the current embodiment, since the proximity sensing signal Ps1 includes a signal that indicates a change in the mutual capacitance of each of the second conductive members 180, the touch controller 200-3 can perform a touch sensing operation and a proximity sensing operation simultaneously.

Figure 41:
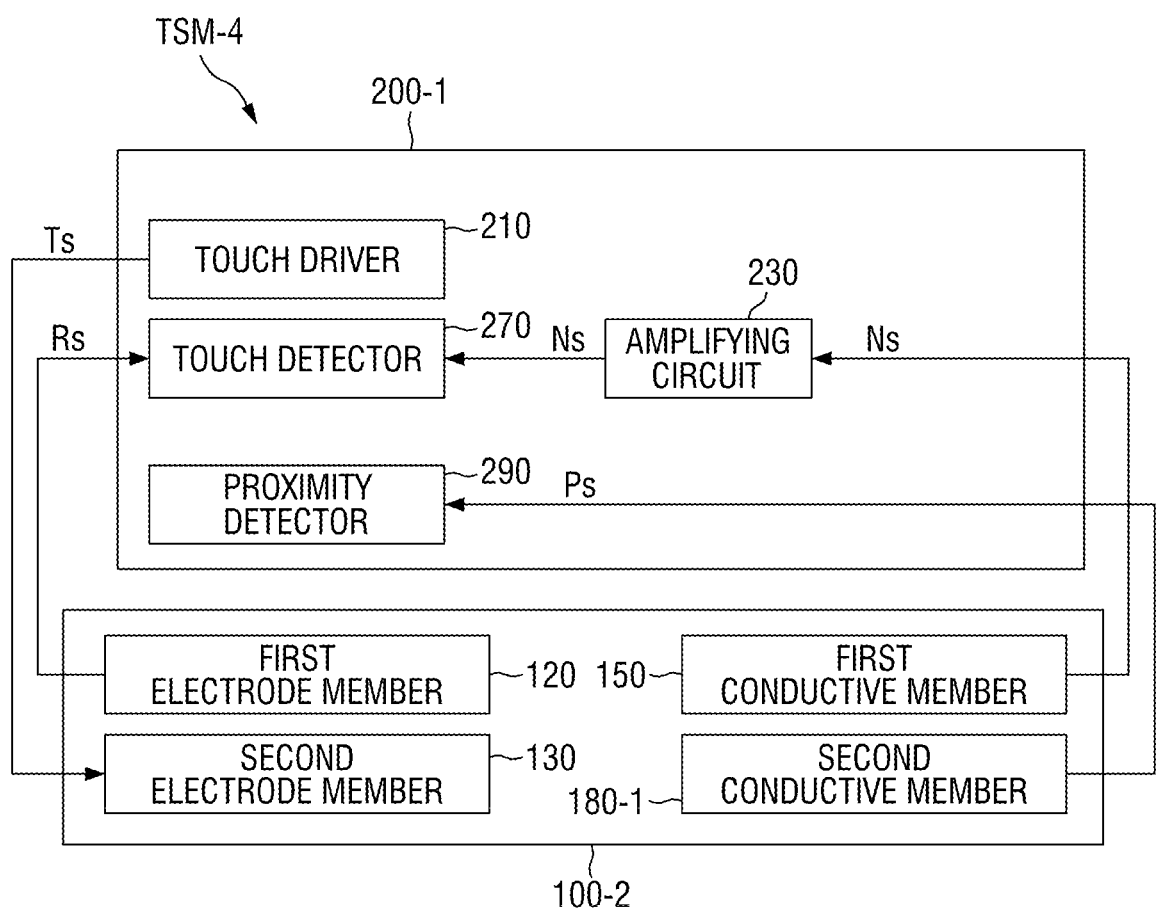
FIG. 41 is a block diagram of a touch sensor according to an embodiment.
Figure 42:
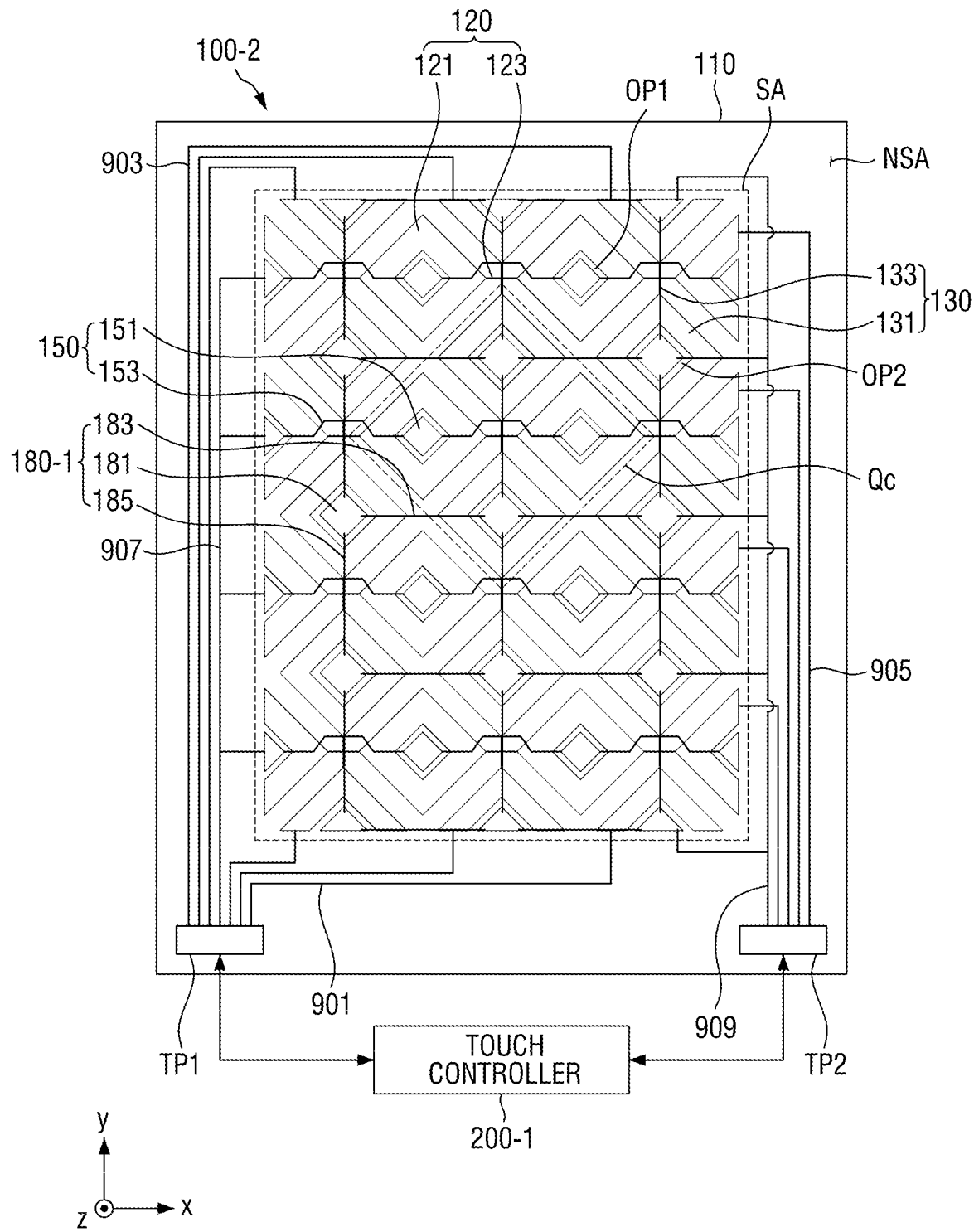
FIG. 42 illustrates the touch sensor of FIG. 41, a plan view of a sensing part of the touch sensor, and the connection relationship between the sensing part and a touch controller.
Figure 43:
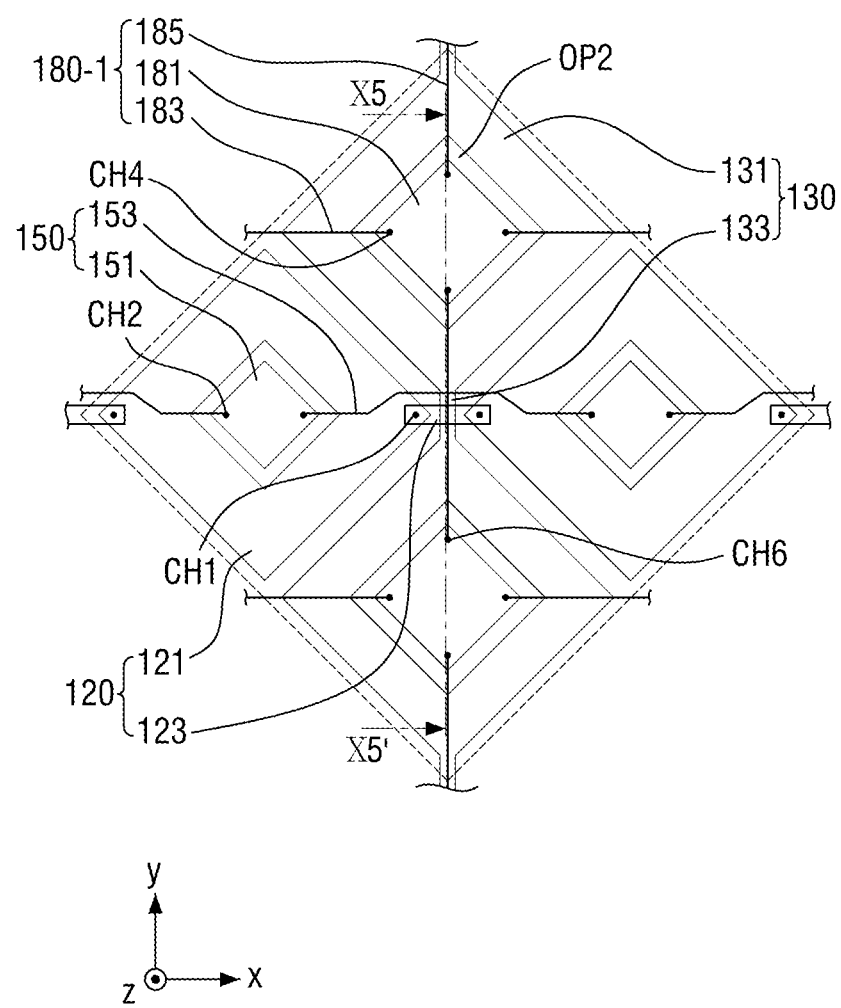
FIG. 43 is an enlarged plan view of a portion Qc of FIG. 42.
Figure 44:
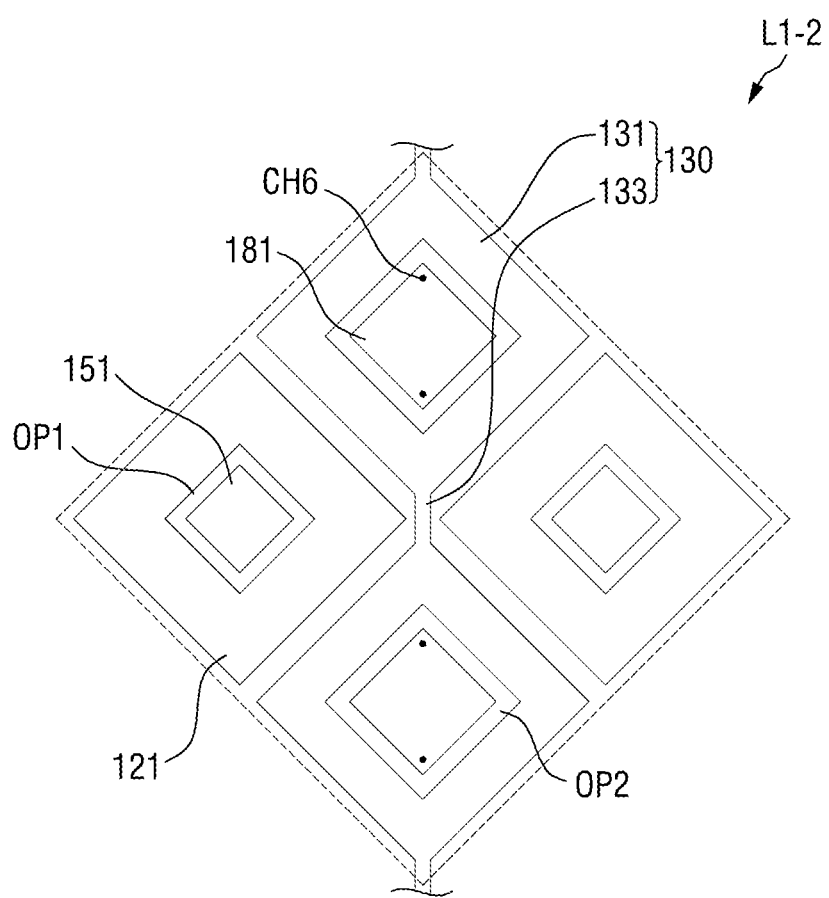
FIG. 44 illustrates an exemplary structure of a first layer of the sensing part of FIG. 43.
Figure 45:
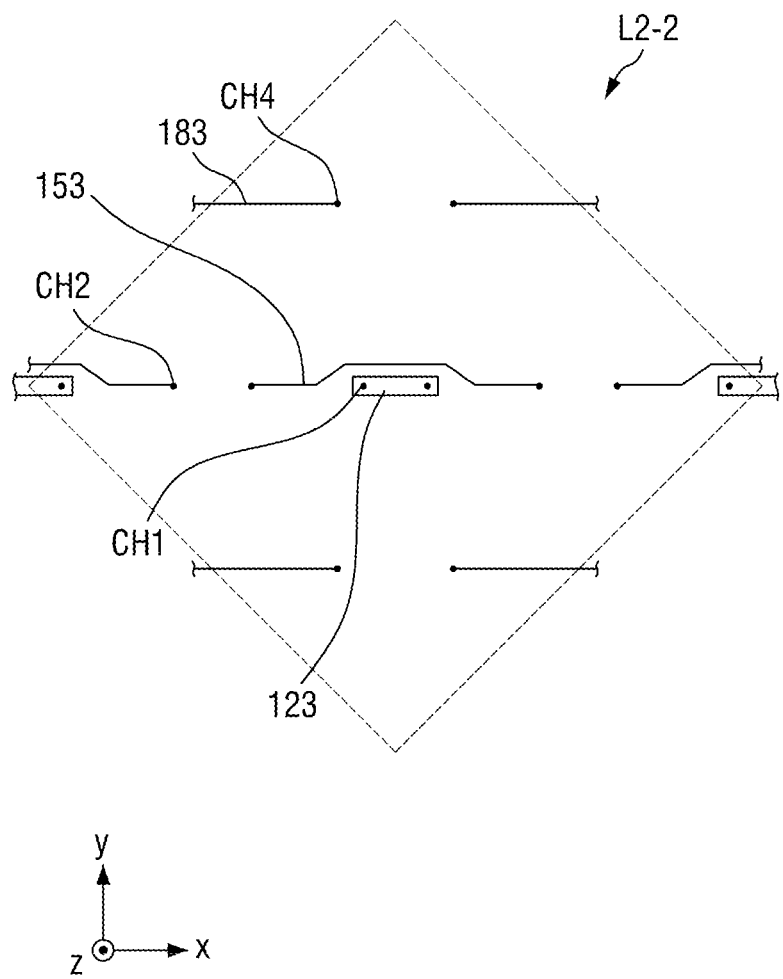
FIG. 45 illustrates an exemplary structure of a second layer of the sensing part of FIG. 43.
Figure 46:
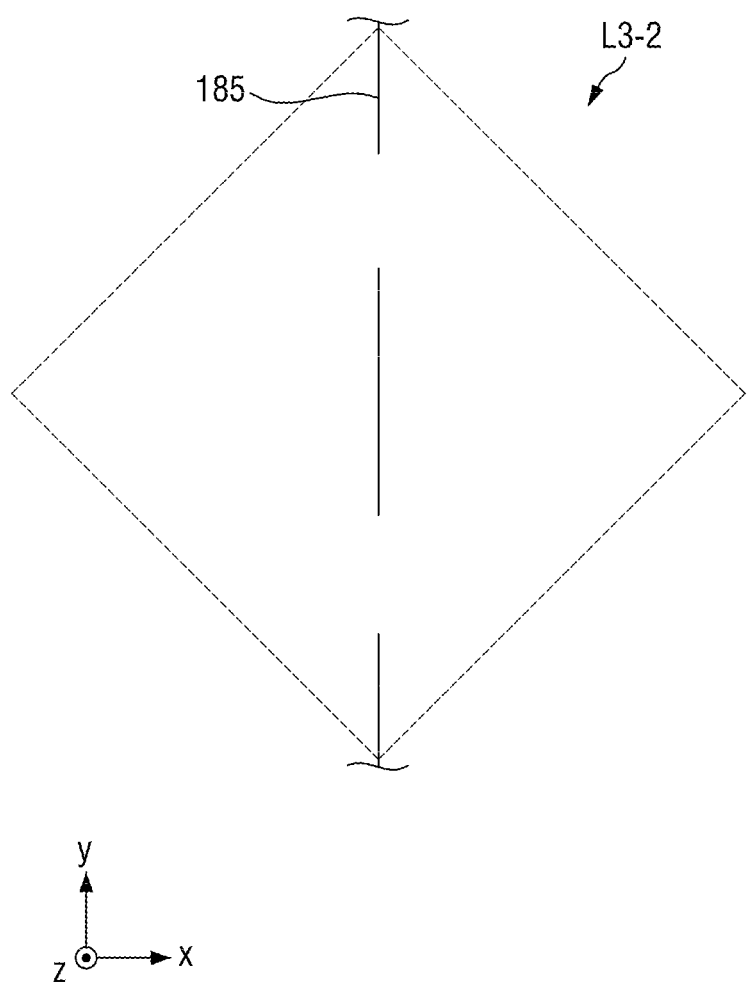
FIG. 46 illustrates an exemplary structure of a third layer of the sensing part of FIG. 43.
Figure 47:
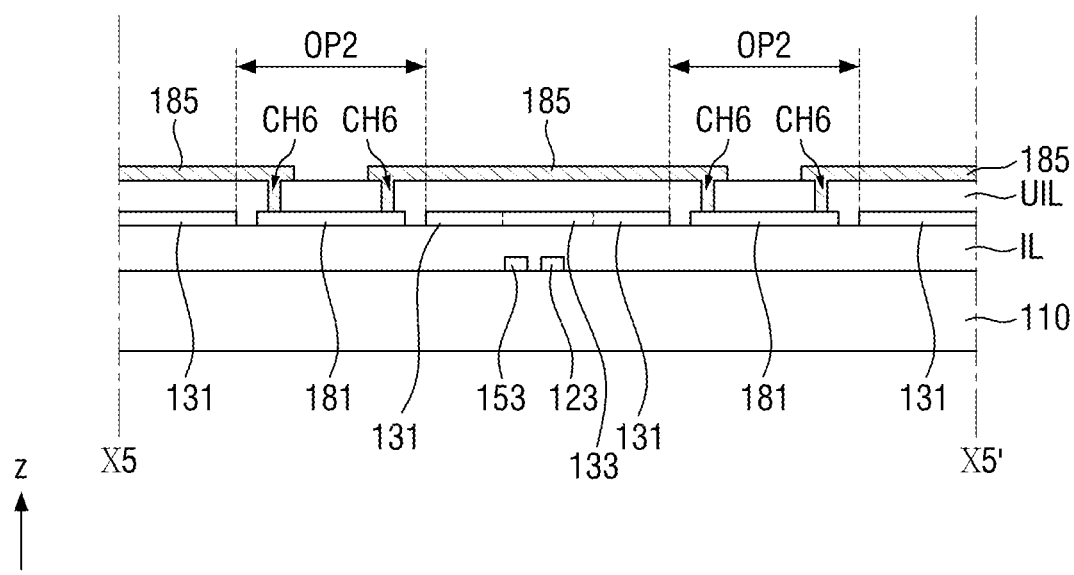
FIG. 47 is a cross-sectional view taken along X5-X5' of FIG. 43.

FIG. 41 is a block diagram of a touch sensor TSM-4 according to an embodiment. FIG. 42 illustrates the touch sensor TSM-4 of FIG. 41, a plan view of a sensing part 100-2 of the touch sensor TSM-4, and the connection relationship between the sensing part 100-2 and a touch controller 200-1. FIG. 43 is an enlarged plan view of a portion Qc of FIG. 42. FIG. 44 illustrates an exemplary structure of a first layer L1-2 of the sensing part 100-2 of FIG. 43. FIG. 45 illustrates an exemplary structure of a second layer L2-2 of the sensing part 100-2 of FIG. 43. FIG. 46 illustrates an exemplary structure of a third layer L3-2 of the sensing part 100-2 of FIG. 43. FIG. 47 is a cross-sectional view taken along X5-X5' of FIG. 43.

Referring to FIGS. 41 through 47, the touch sensor TSM-4 according to the current embodiment includes the touch controller 200-1 and the sensing part 100-2.

The touch controller 200-1 is the same as that of the embodiment of FIGS. 23, 35 and 36, and thus its description is omitted.

The sensing part 100-2 is substantially the same as the sensing part 100-1 described above with reference to FIGS. 24 through 36 except that it includes second conductive members 180-1 that have a different structure from the sensing part 100-1. Therefore, differences will be mainly described below.

Each of the second conductive members 180-1 may include second conductive patterns 181, second connection lines 183, and third connection lines 185.

The second conductive patterns 181 may be located within second openings OP2 of second electrodes 131 and may be spaced apart from the second electrodes 131. In some embodiments, as illustrated in FIG. 44, the second conductive patterns 181 may be located in the same first layer L1-2 as first electrodes 121, the second electrodes 131, second connection portions 133, and first conductive patterns 151 and may be made of the same material as one of the first electrodes 121, the second electrodes 131, the second connection portions 133, and the first conductive patterns 151.

Each of the second connection lines 183 may electrically connect the second conductive patterns 181 located in the same electrode row and neighboring each other along the first direction x. In some embodiments, as illustrated in FIG. 45, the second connection lines 183 may be located in the same second layer L2-2 as first connection portions 123 and first connection lines 153 and may be made of the same material as one of the first connection portions 123 and the first connection lines 153. The second conductive patterns 181 and the second connection lines 183 may be connected to each other through fourth contact holes CH4 that are formed in an insulating layer IL.

Each of the third connection lines 185 may electrically connect the second conductive patterns 181 neighboring each other along the second direction y. In some embodiments, as illustrated in FIG. 46, the third connection lines 185 may be located in the third layer L3-2 that is different from the first layer L1-2 and the second layer L2-2.

The third connection lines 185 may include a conductive material. In some embodiments, each of the third connection lines 185 may have a single-layer structure or a multilayer structure.

In some embodiments, an upper insulating layer UIL may be further located between the first layer L1-2 and the third layer L3-2, for example, between the first and second electrodes 121 and 131 and the third connection lines 185, and the third connection lines 185 may be located on the upper insulating layer UIL. In some embodiments, the third connection lines 185 may be connected to the second conductive patterns 181 through sixth contact holes CH6 formed in the upper insulating layer UIL.

In some embodiments, the upper insulating layer UIL may be disposed entirely above a base layer 110 as illustrated in FIG. 47. Alternatively, in an embodiment, the upper insulating layer UIL may be disposed partially above the base layer 110, for example, in the form of an island pattern.

In some embodiments, the upper insulating layer UIL may include at least one of the insulating materials described above in the description of the insulating layer IL.

In some embodiments, the structure of the touch sensor TSM-4, in particular, the position of the first conductive patterns 151, the position of the first connection lines 153, the position of the second conductive patterns 181, and the position of the second connection lines 183 may be variously changed.

Figure 48:
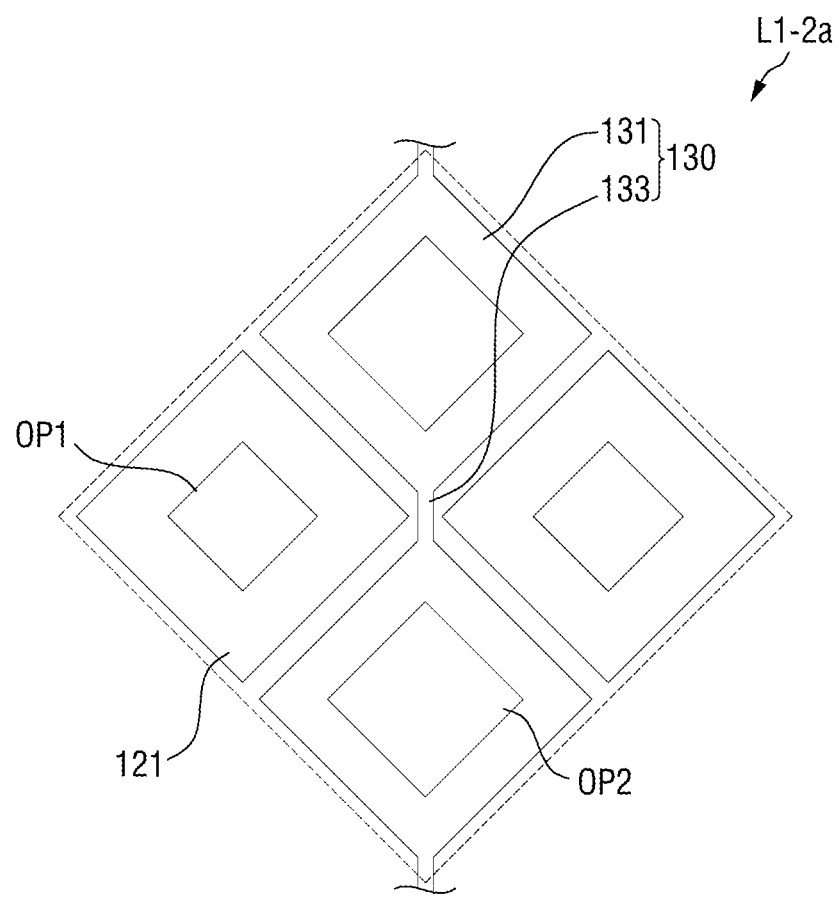
FIG. 48 illustrates an exemplary structure of a first layer according to a modified example of FIG. 44.
Figure 49:
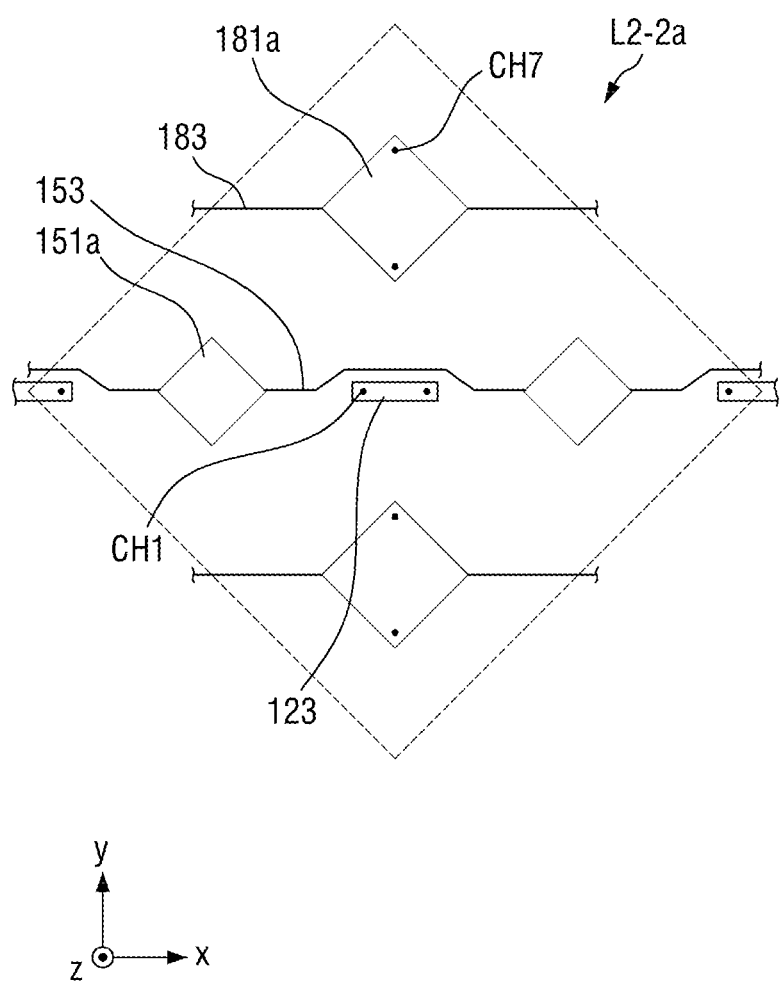
FIG. 49 illustrates an exemplary structure of a second layer according to a modified example of FIG. 45.
Figure 50:
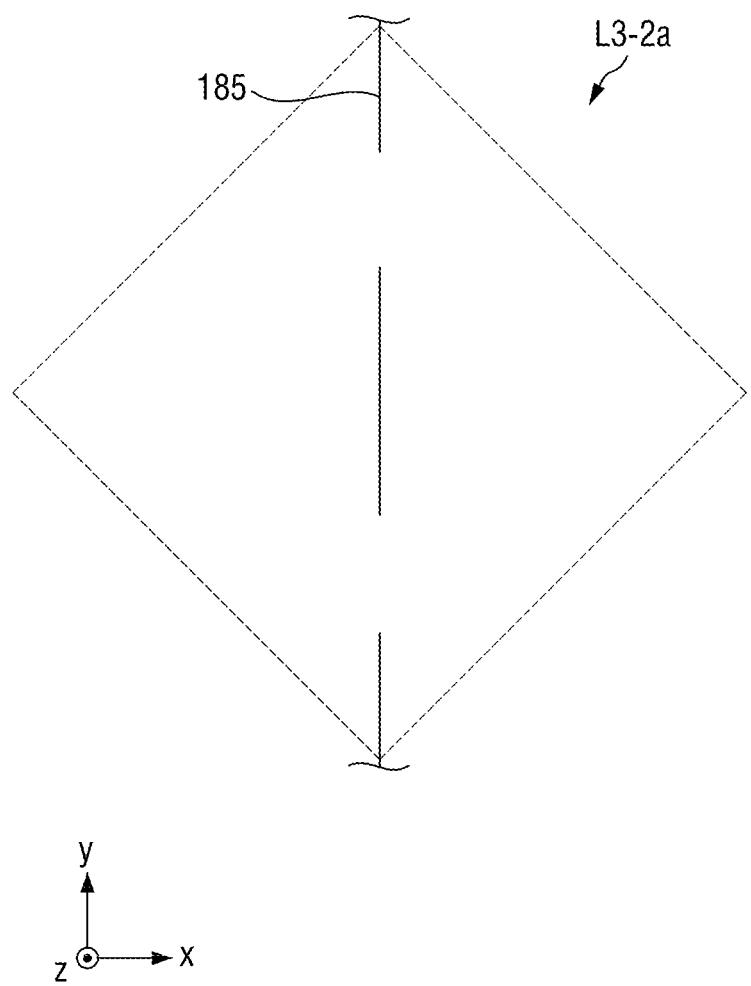
FIG. 50 illustrates an exemplary structure of a third layer according to a modified example of FIG. 46.
Figure 51:
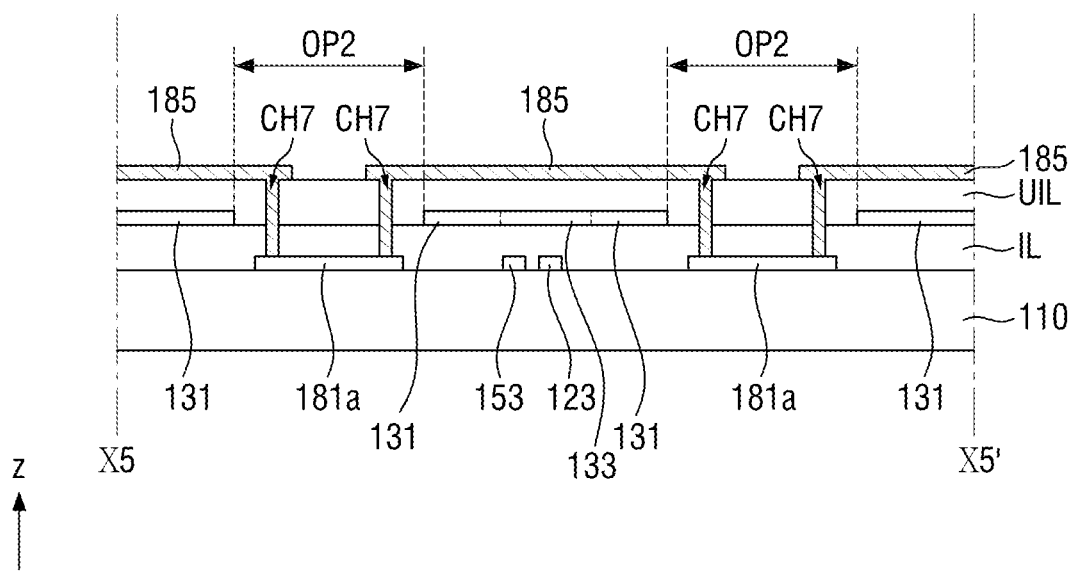
FIG. 51 is a cross-sectional view illustrating a modified example of FIG. 47.

FIG. 48 illustrates an exemplary structure of a first layer L1-2a according to a modified example of FIG. 44. FIG. 49 illustrates an exemplary structure of a second layer L2-2a according to a modified example of FIG. 45. FIG. 50 illustrates an exemplary structure of a third layer L3-2a according to a modified example of FIG. 46. FIG. 51 is a cross-sectional view illustrating a modified example of FIG. 47.

Referring to FIGS. 48 through 51, first electrodes 121, second electrodes 131, and a second connection portion 133 may be located in the first layer L1-2a, and a first connection portion 123, first lower conductive patterns 151a, a first connection line 153, second lower conductive patterns 181a, and second connection lines 183 may be located in the second layer L2-2a. In addition, third connection lines 185 may be located in the third layer L3-2a and may be connected to the second lower conductive patterns 181a through seventh contact holes CH7 that are formed in an insulating layer IL and an upper insulating layer UIL.

The first lower conductive patterns 151a, the first connection line 153, the second lower conductive patterns 181a, and the second connection lines 183 are the same as those described above with reference to FIGS. 29 through 31, and thus their description is omitted.

Figure 52:
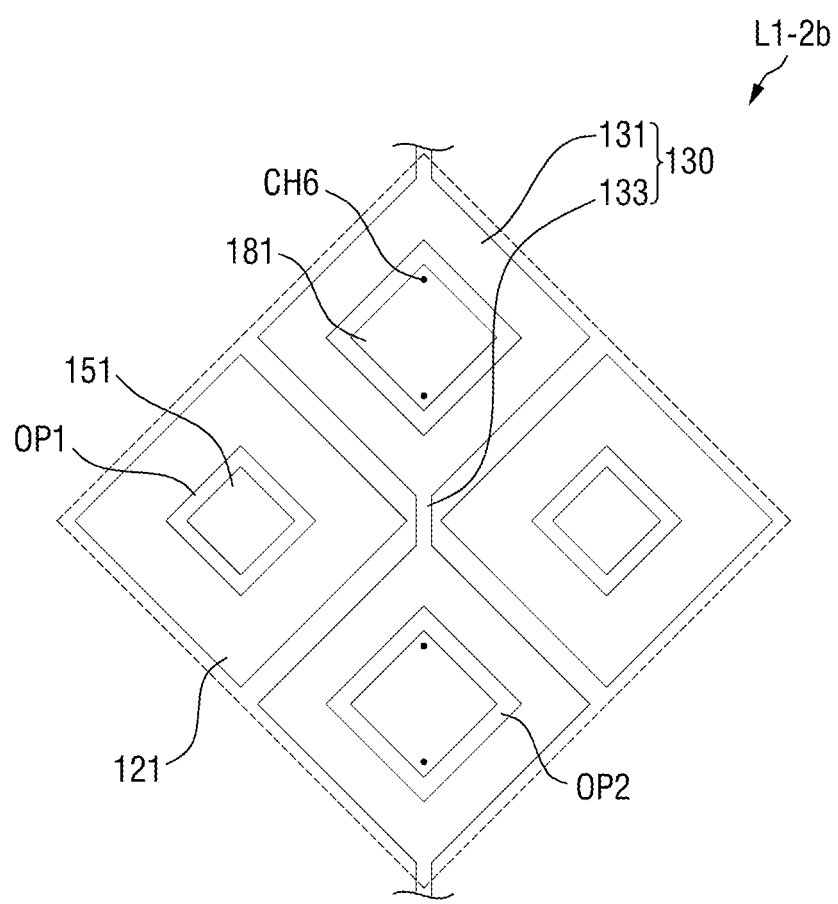
FIG. 52 illustrates an exemplary structure of a first layer according to a modified example of FIG. 44.
Figure 53:
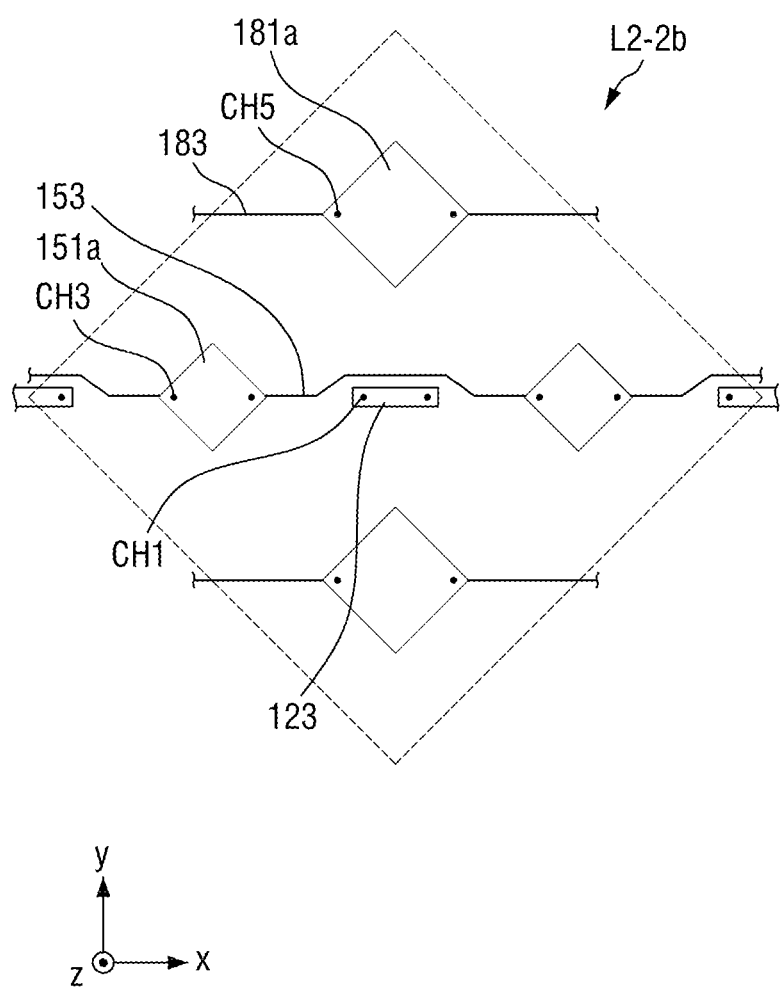
FIG. 53 illustrates an exemplary structure of a second layer according to a modified example of FIG. 45.
Figure 54:
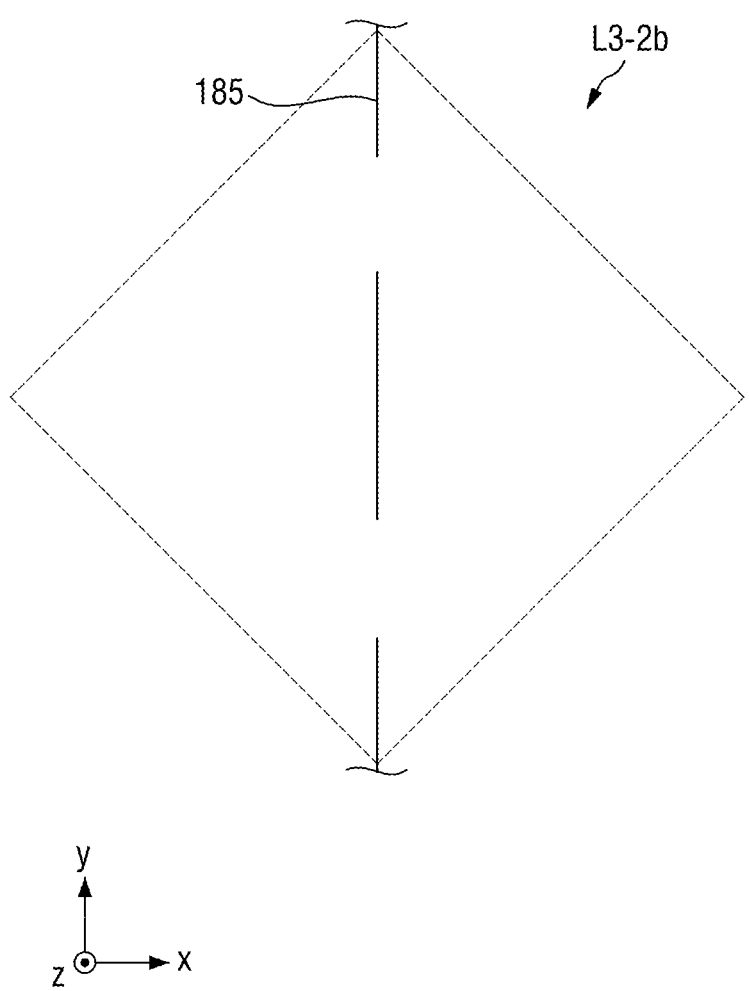
FIG. 54 illustrates an exemplary structure of a third layer according to a modified example of FIG. 46.
Figure 55:
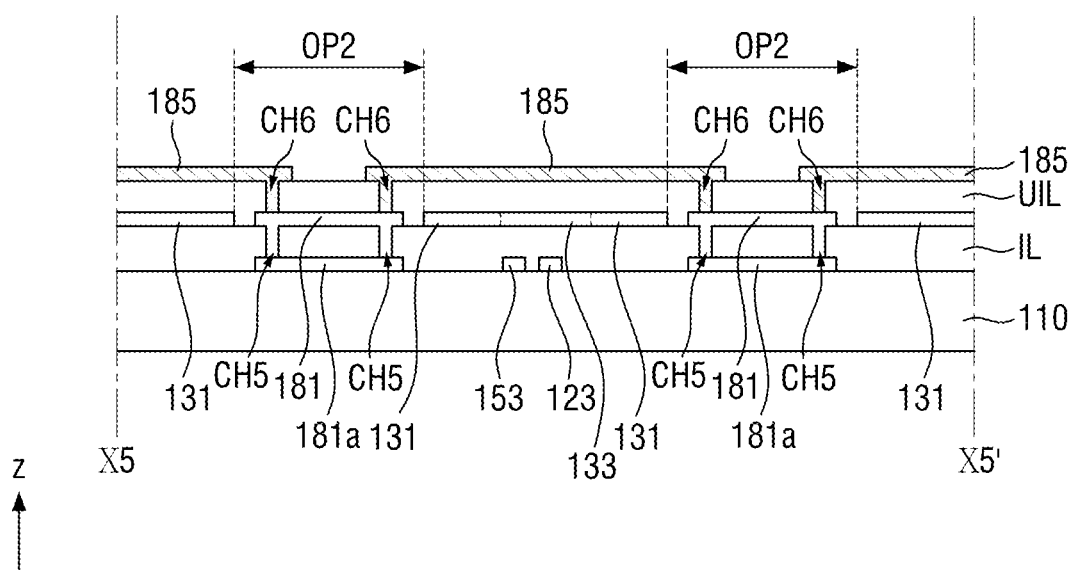
FIG. 55 is a cross-sectional view illustrating a modified example of FIG. 47.

FIG. 52 illustrates an exemplary structure of a first layer L1-2b according to a modified example of FIG. 44. FIG. 53 illustrates an exemplary structure of a second layer L2-2b according to a modified example of FIG. 45. FIG. 54 illustrates an exemplary structure of a third layer L3-2b according to a modified example of FIG. 46. FIG. 55 is a cross-sectional view illustrating a modified example of FIG. 47.

Referring to FIGS. 52 through 55, second conductive patterns 181 may be located in the same first layer L1-2b as first electrodes 121, second electrodes 131, and first conductive patterns 151. In addition, second lower conductive patterns 181a and second connection lines 183 may be located in the same second layer L2-2b as a first connection portion 123, first lower conductive patterns 151a, and a first connection line 153 and may be made of the same material as one of the first connection portion 123, the first lower conductive patterns 151a, and the first connection line 153.

The second lower conductive patterns 181a may be connected to the second connection lines 183 in the second layer L2-2b.

In some embodiments, the second lower conductive patterns 181a and the second conductive patterns 181 may be connected to each other through fifth contact holes CH5 that are formed in an insulating layer IL.

Third connection lines 185 may be located in the third layer L3-2b and may be connected to the second conductive patterns 181 through sixth contact holes CH6 that are formed in the upper insulating layer UIL.

Figure 56:
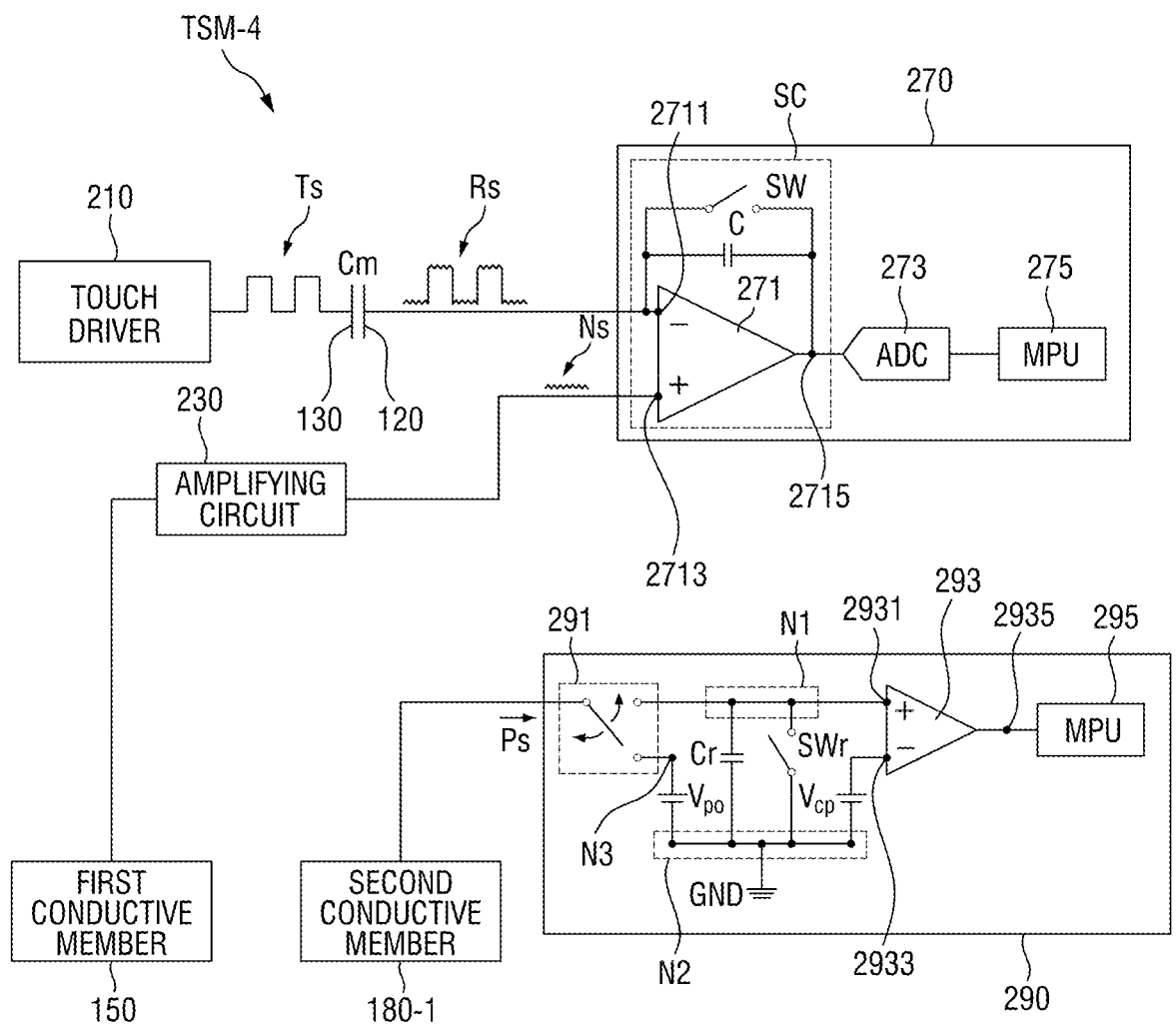
FIG. 56 is a diagram for explaining a touch position detection operation of the touch sensor according to an embodiment.
Figure 57:
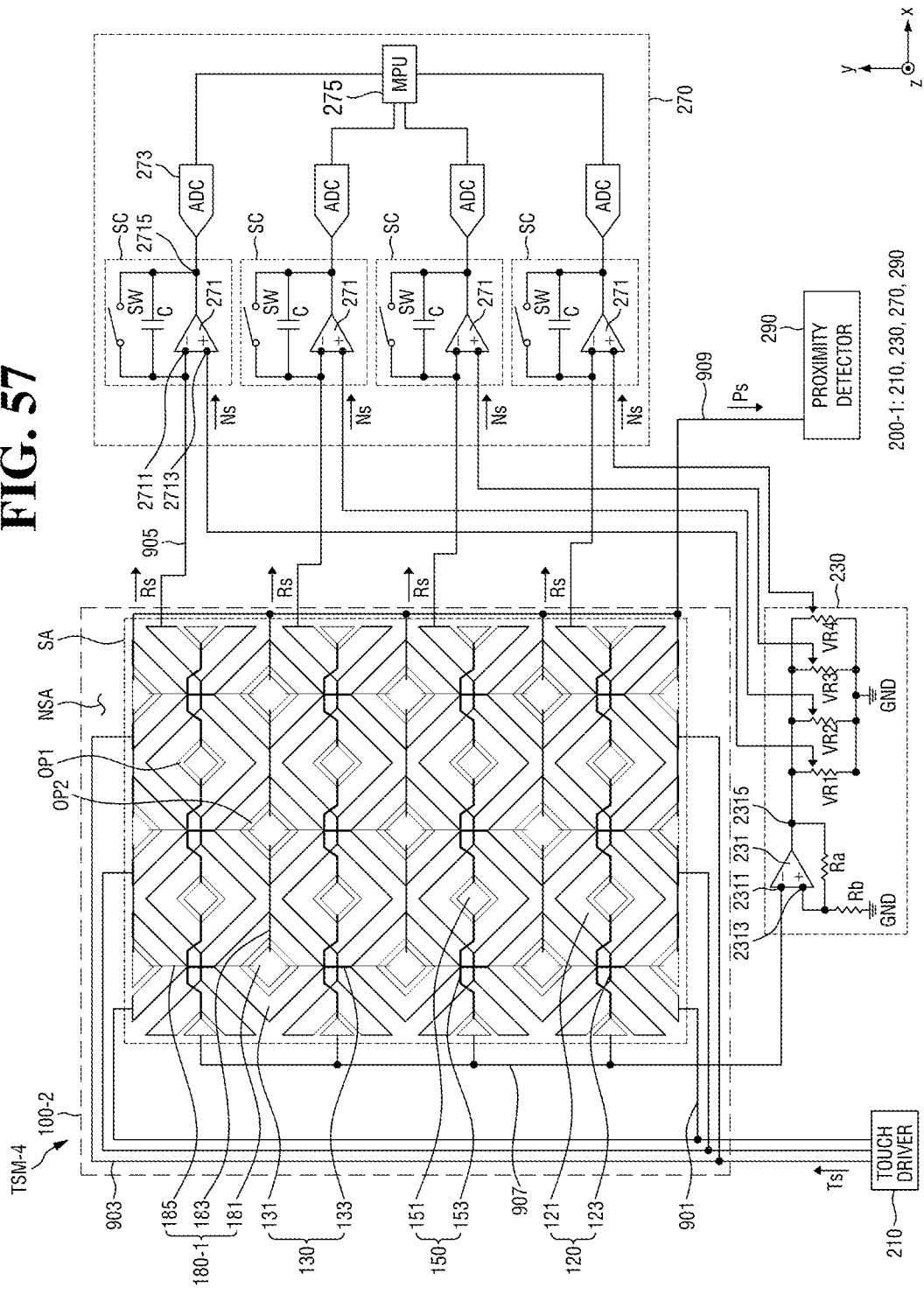
FIG. 57 specifically illustrates the connection relationship between the sensing part and the touch controller according to an embodiment.

FIG. 56 is a diagram for explaining a touch position detection operation of the touch sensor TSM-4 according to an embodiment. FIG. 57 specifically illustrates the connection relationship between the sensing part 100-2 and the touch controller 200-1 according to an embodiment.

Referring to FIGS. 56 and 57, a touch detector 270 may detect a touch input/touch position by receiving a sensing signal Rs from each of first electrode members 120 and a noise sensing signal Ns from each of first conductive members 150 or an amplifying circuit 230.

In addition, a proximity detector 290 may detect the proximity of an object by receiving a proximity sensing signal Ps from each of the second conductive members 180-1, and the proximity sensing signal Ps may include a signal that indicates a change in the self-capacitance of a second conductive member 180-1.

Other components of the touch controller 200-1 are the same as those of the embodiment of FIGS. 35 and 36, and thus their description is omitted.

Figure 58:
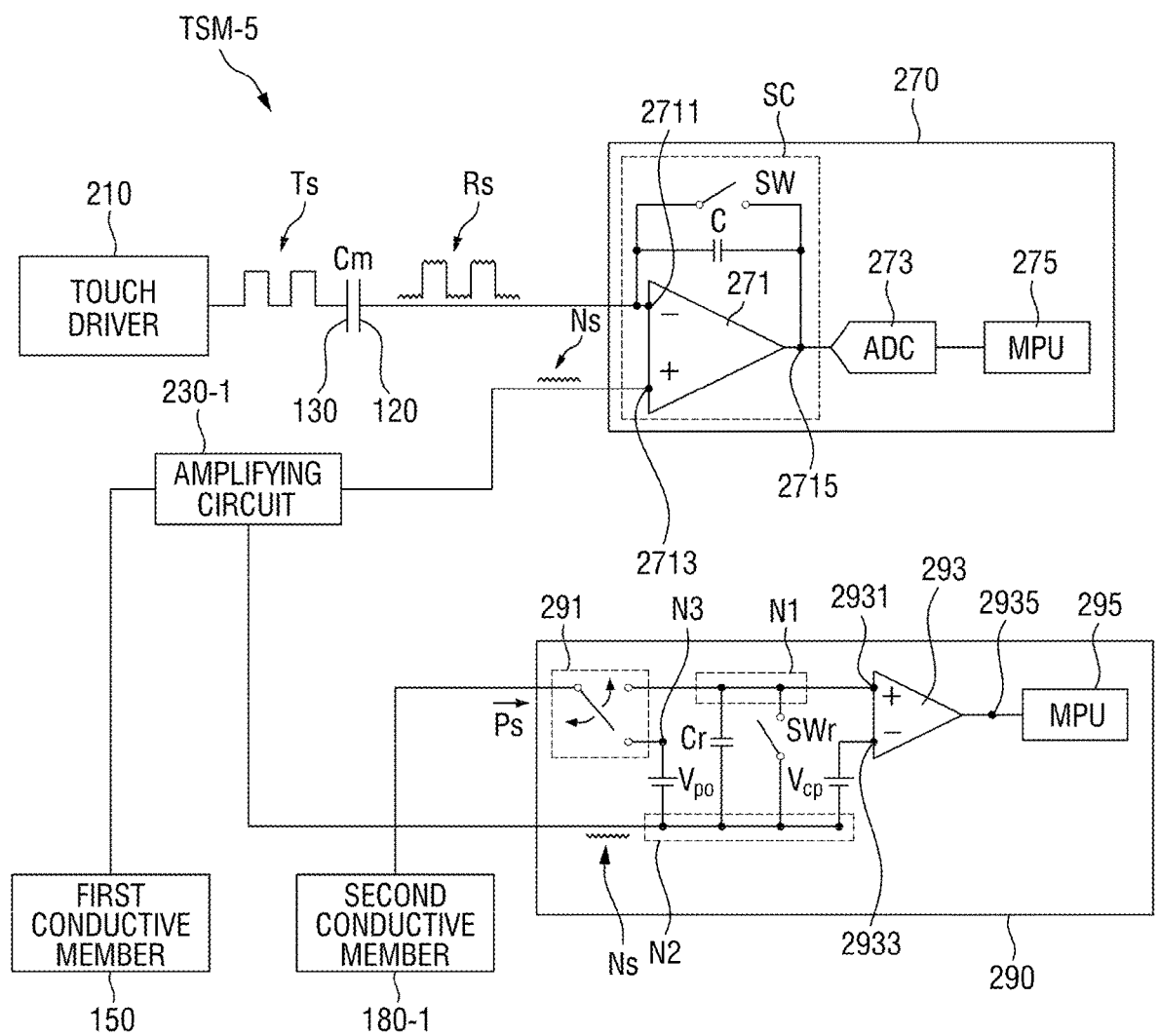
FIG. 58 is a diagram for explaining a touch position detection operation of a touch sensor according to an embodiment.
Figure 59:
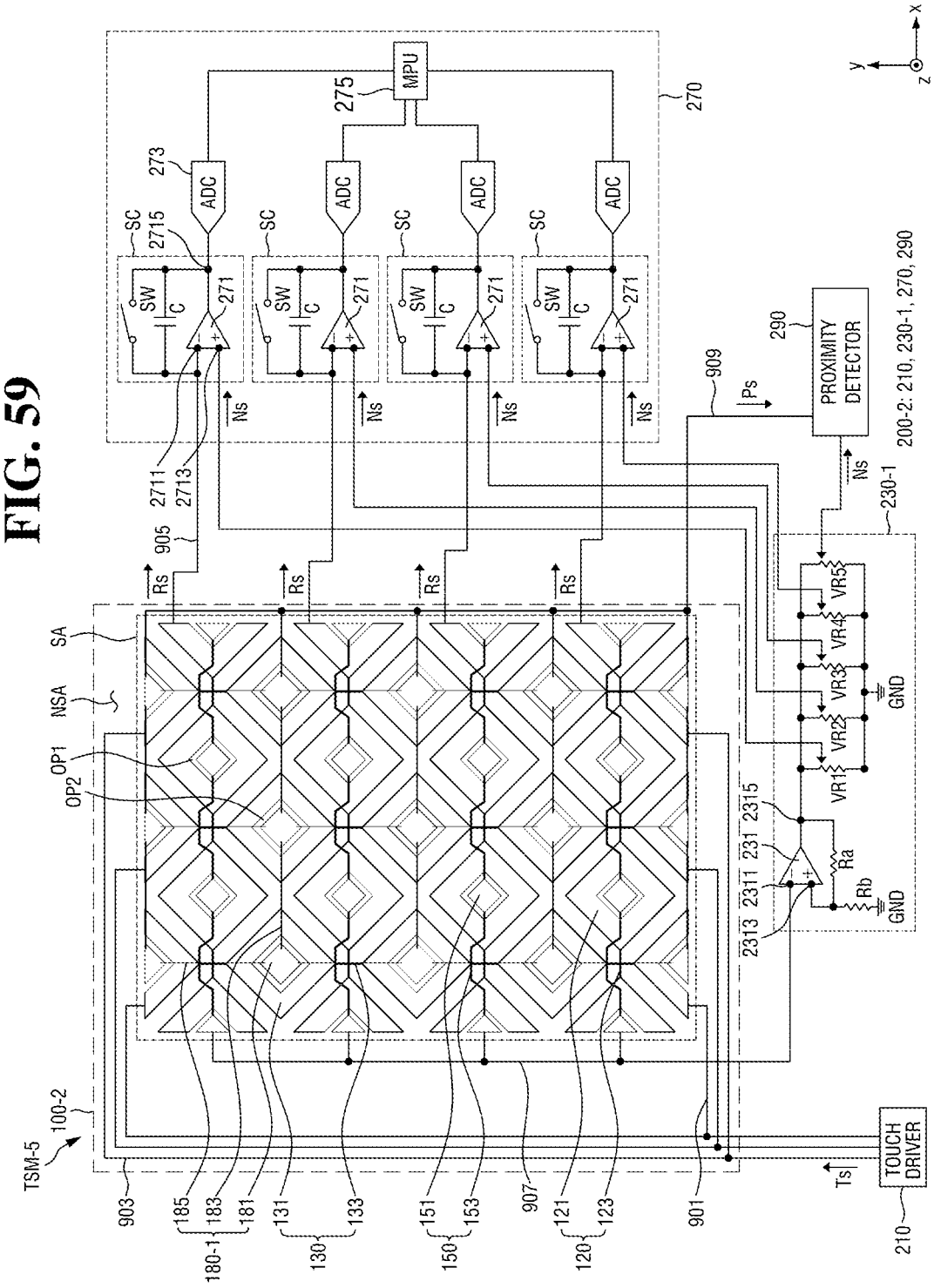
FIG. 59 specifically illustrates the connection relationship between a sensing part and a touch controller according to an embodiment.

FIG. 58 is a diagram for explaining a touch position detection operation of a touch sensor TSM-5 according to an embodiment. FIG. 59 specifically illustrates the connection relationship between a sensing part 100-2 and a touch controller 200-2 according to an embodiment.

Referring to FIGS. 58 and 59, a touch detector 270 may detect a touch input/touch position by receiving a sensing signal Rs from each of first electrode members 120 and a noise sensing signal Ns from each of first conductive members 150 or an amplifying circuit 230-1.

In addition, a proximity detector 290 may detect the proximity of an object by receiving a proximity sensing signal Ps from each of second conductive members 180-1 and the noise sensing signal Ns from each of the first conductive members 150 or the amplifying circuit 230-1. The proximity sensing signal Ps may include a signal that indicates a change in the self-capacitance of a second conductive member 180-1 as described above.

Other components of the touch controller 200-2 are the same as those of the embodiment of FIGS. 37 and 38, and thus their description is omitted.

Figure 60:
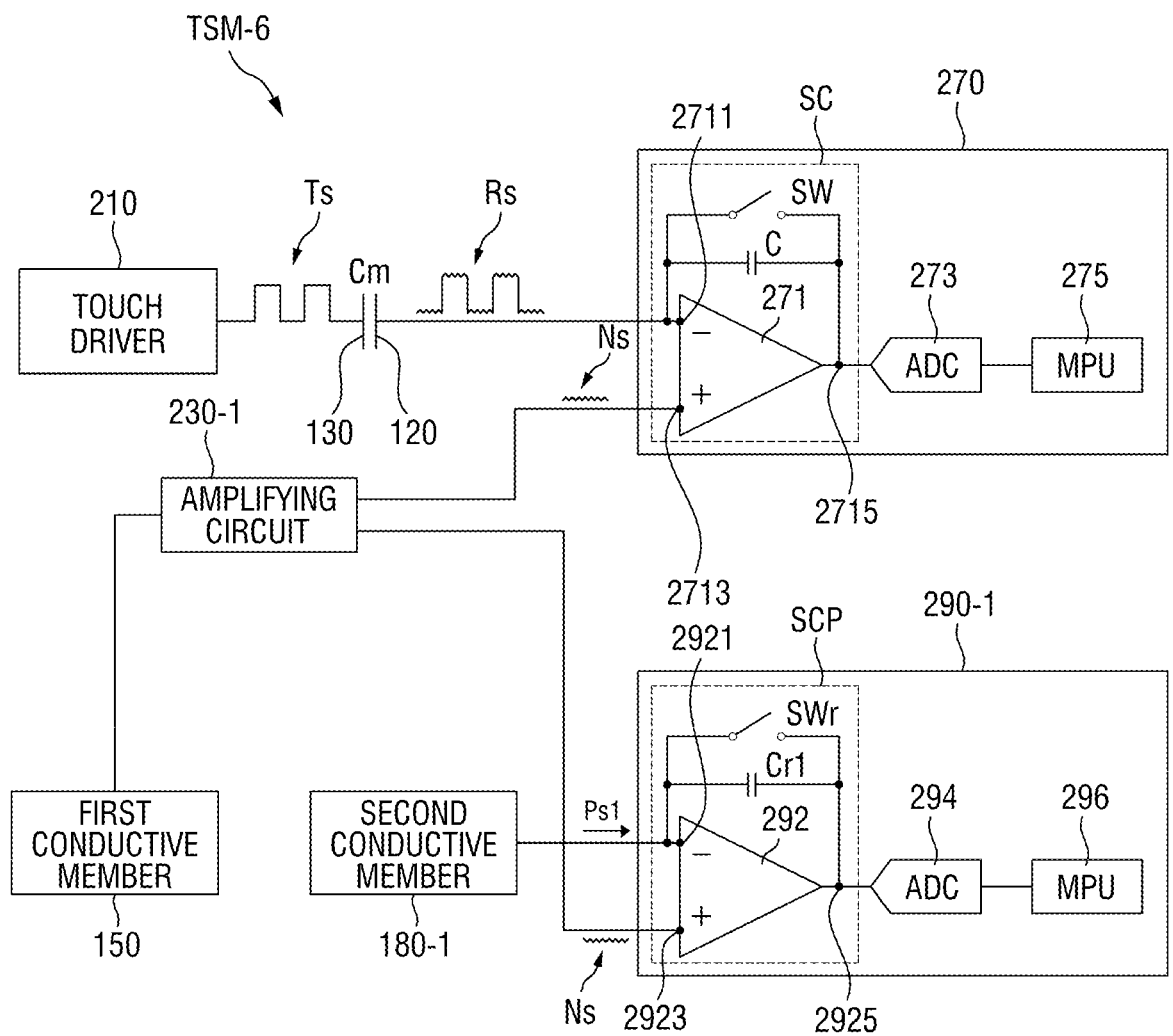
FIG. 60 is a diagram for explaining a touch position detection operation of a touch sensor according to an embodiment.
Figure 61:
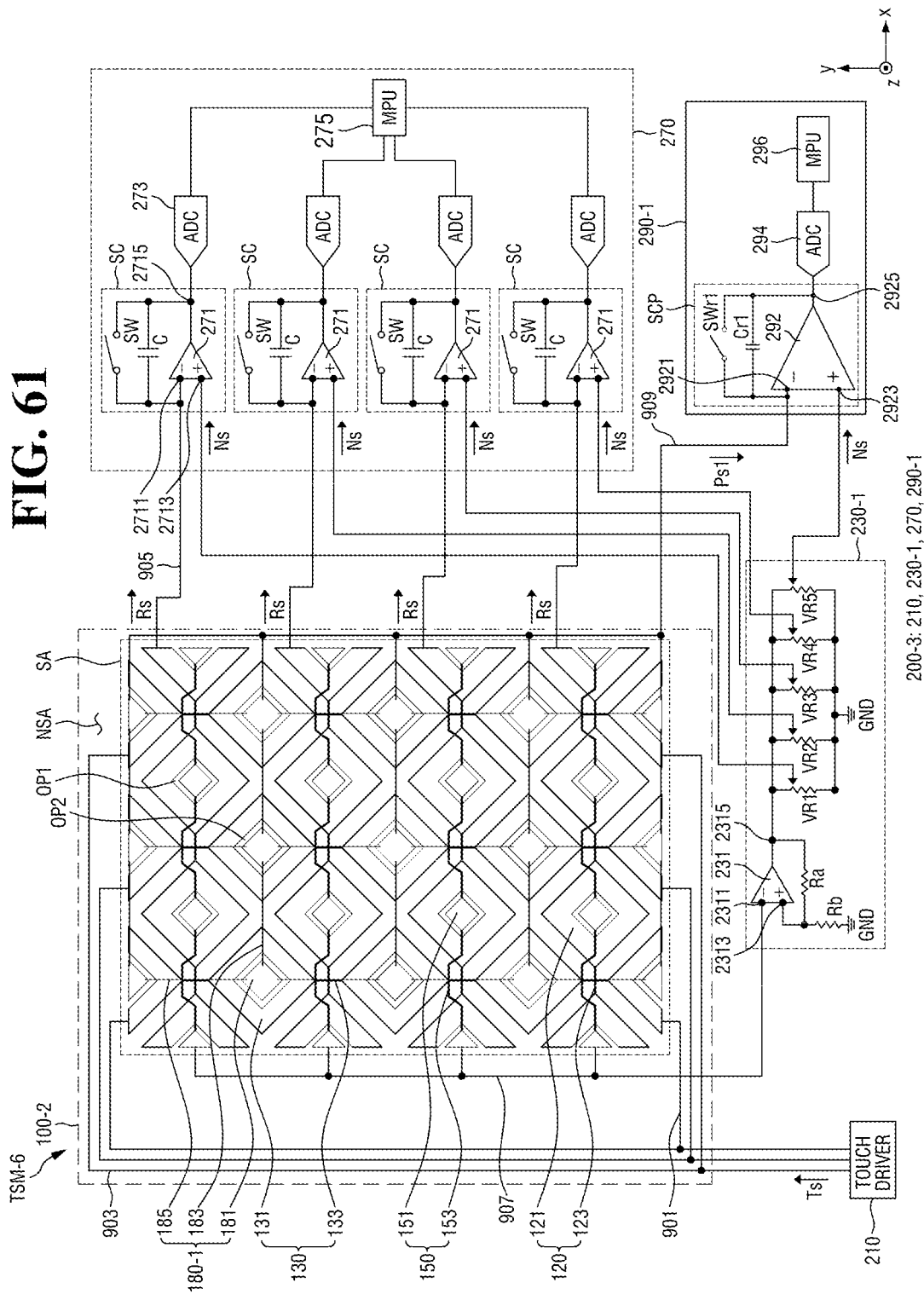
FIG. 61 specifically illustrates the connection relationship between a sensing part and a touch controller according to an embodiment.

FIG. 60 is a diagram for explaining a touch position detection operation of a touch sensor TSM-6 according to an embodiment. FIG. 61 specifically illustrates the connection relationship between a sensing part 100-2 and a touch controller 200-3 according to an embodiment.

Referring to FIGS. 60 and 61, a touch detector 270 may detect a touch input/touch position by receiving a sensing signal Rs from each of first electrode members 120 and a noise sensing signal Ns from each of first conductive members 150 or an amplifying circuit 230-1.

In addition, a proximity detector 290-1 may detect the proximity of an object by receiving a proximity sensing signal Ps1 from each of second conductive members 180-1 and the noise sensing signal Ns from each of the first conductive members 150 or the amplifying circuit 230-1. The proximity sensing signal Ps1 may include a signal that indicates a change in mutual capacitance between a second electrode member 130 and a second conductive member 180-1 as described above.

Other components of the touch controller 200-3 are the same as those of the embodiment of FIGS. 39 and 40, and thus their description is omitted.

In a touch sensor according to any of the above-described embodiments and a display device including the touch sensor, the touch sensor can detect the proximity of an object, therefore an additional proximity sensor can be omitted. In addition, since conductive members are formed in the process of manufacturing touch electrodes and connection portions, the thickness of the touch sensor may not be increased.

Further, since the touch sensor can cancel the noise introduced from, for example a display panel, the touch sensing sensitivity and the proximity sensing sensitivity of the touch sensor can be improved.

According to the foregoing embodiments, it is possible to provide a touch sensor that is capable of sensing not only a position of a touch input but also the proximity of an object and a display device including the touch sensor.

However, the effects of the exemplary embodiments described herein are not restricted to the one set forth herein. The above and other effects of the embodiments will become more apparent to one of daily skill in the art to which the embodiments pertain by referencing the claims.

What is claimed is:

1. An electronic device comprising:
   a base substrate;
   a light emitting element disposed on the base substrate;
   a thin film encapsulation layer disposed on the light emitting element;
   an insulating layer disposed on the thin film encapsulation layer, the insulating layer including a first surface facing the thin film encapsulation layer and a second surface opposite to the first surface;
   a first conductive layer disposed directly on the second surface of the insulating layer, the first conductive layer comprising a first touch electrode which comprises a first opening and a noise sensing electrode located in the first opening and spaced apart from the first electrode; and
   a controller configured to receive a touch sensing signal from the first touch electrode and a noise sensing signal from the noise sensing electrode,
   wherein the controller is configured to detect mutual capacitance between the first electrode and the noise sensing electrode, and
   wherein each of the first touch electrode and the noise sensing electrode has a mesh structure.

2. The electronic device of claim 1, wherein the controller is configured to cancel a noise contained in the touch sensing signal based on the noise sensing signal.

3. The electronic device of claim 1, further comprising:
   a first wiring electrically connecting the first touch electrode and the controller, and
   a second wiring electrically connecting the noise sensing electrode and the controller,
   wherein the first touch electrode and the noise sensing electrode are disposed between the first wiring and the second wiring in plan view.

4. The electronic device of claim 1, further comprising:
   a first connection line connected to the noise sensing electrode,
   wherein the first connection line is disposed between the thin film encapsulation layer and the first surface of the insulating layer.

5. The electronic device of claim 4,
   wherein the first connection line comprises a first sub connection line and a second sub connection line spaced apart from the first sub connection line, and
   wherein each of the first sub connection line and the second sub connection line is connected to the noise sensing electrode.

6. The electronic device of claim 4,
   wherein the first connection line overlaps the first touch electrode in a plan view.

7. The electronic device of claim 6,
   wherein the first conductive layer further comprises a second touch electrode spaced apart from the first touch electrode, and
   wherein the first connection line further overlaps the second touch electrode in the plan view.

8. The electronic device of claim 1,
   wherein the first conductive layer further comprises a second touch electrode spaced apart from the first touch electrode,
   wherein the electronic device further comprises:
   a first connection portion connected to the first touch electrode; and
   a second connection portion connected to the second touch electrode,
   wherein one of the first connection portion and the second connection portion is disposed between the first surface of the insulating layer and the thin film encapsulation layer, and
   wherein the other one of the first connection portion and the second connection portion is disposed directly on the second surface of the insulating layer.

9. The electronic device of claim 8, further comprising:
   a first connection line connected to the noise sensing electrode,
   wherein the first connection line is disposed between the thin film encapsulation layer and the first surface of the insulating layer, and
   wherein the first connection line and the other one of the first connection portion and the second connection portion are made of a same material.

10. The electronic device of claim 1,
    wherein the first conductive layer further comprises a second touch electrode spaced apart from the first touch electrode,
    wherein the second touch electrode comprises a second opening, and
    wherein an occupied area of the second opening is different from an occupied area of the first opening.

11. The electronic device of claim 10, further comprising:
    a first wiring electrically connecting the second touch electrode and the controller, and
    a second wiring electrically connecting the second touch electrode and the controller,
    wherein the second wiring is spaced apart from the first wiring.

12. The electronic device of claim 10, further comprising:
    a conductive pattern located in the second opening and spaced apart from the second touch electrode,
    wherein the conductive pattern has a mesh structure.

13. The electronic device of claim 12,
    wherein an occupied area of the conductive pattern is different from an occupied area of the noise sensing electrode.

14. The electronic device of claim 1,
wherein the first conductive layer further comprises a second touch electrode spaced apart from the first touch electrode,
wherein the controller is configured to detect a touch input based on a mutual capacitance between the first touch electrode and the second touch electrode, and
wherein the controller is configured to detect proximity of an object based on the mutual capacitance between the first touch electrode and the noise sensing electrode.

15. The electronic device of claim 1,
wherein the controller is an integrated circuit.

* * * * *